(12) United States Patent
Katsuyama et al.

(10) Patent No.: US 11,402,961 B2
(45) Date of Patent: Aug. 2, 2022

(54) CONDUCTIVE MEMBER, CONDUCTIVE FILM, DISPLAY DEVICE HAVING THE SAME, TOUCH PANEL, METHOD OF PRODUCING WIRING PATTERN OF CONDUCTIVE MEMBER, AND METHOD OF PRODUCING WIRING PATTERN OF CONDUCTIVE FILM

(71) Applicant: FUJIFILM Corporation, Tokyo (JP)

(72) Inventors: Kimito Katsuyama, Kanagawa (JP); Masaya Nakayama, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 17/031,942

(22) Filed: Sep. 25, 2020

(65) Prior Publication Data

US 2021/0011583 A1 Jan. 14, 2021

Related U.S. Application Data

(63) Continuation of application No. PCT/JP2019/012895, filed on Mar. 26, 2019.

(30) Foreign Application Priority Data

Mar. 27, 2018 (JP) .............................. JP2018-059697

(51) Int. Cl.
*G06F 3/047* (2006.01)
*G06F 3/044* (2006.01)
*H01L 27/32* (2006.01)

(52) U.S. Cl.
CPC .......... *G06F 3/0446* (2019.05); *G06F 3/0445* (2019.05); *G06F 2203/04103* (2013.01); *G06F 2203/04112* (2013.01); *H01L 27/3211* (2013.01)

(58) Field of Classification Search
CPC ................. G02F 1/1333; G02F 1/1343; G06F 2203/04103; G06F 2203/04112;
(Continued)

(56) References Cited

U.S. PATENT DOCUMENTS 9,791,712 B2 10/2017 Iwami
10,088,690 B2 10/2018 Iwami et al.
(Continued)

FOREIGN PATENT DOCUMENTS

JP 2013213858 10/2013
JP 2013214545 10/2013
(Continued)

OTHER PUBLICATIONS

"International Search Report (Form PCT/ISA/210) of PCT/JP2019/012895," dated Jun. 25, 2019, with English translation thereof, pp. 1-5.
(Continued)

*Primary Examiner* — Michael J Eurice
(74) *Attorney, Agent, or Firm* — JCIPRNET

(57) ABSTRACT

A conductive member has a wiring portion, and the wiring portion has a wiring pattern in which straight line wirings each being composed of a plurality of thin metal wires arranged in parallel in one direction are overlapped in two or more directions. The wiring pattern is a separate-direction non-equal pitch wiring pattern in which the average pitch of the straight line wiring in at least one direction is different from the average pitch of the straight line wiring in at least one different direction. The conductive member has a wiring pattern having less moiré than an equal pitch wiring pattern, particularly a wiring pattern capable of reducing both regular moiré and irregular moiré (noise). A conductive film, a display device, and a touch panel each include the conductive member.

20 Claims, 36 Drawing Sheets

(58) Field of Classification Search
CPC ........ G06F 3/0445; G06F 3/0446; G06F 1/16;
G06F 3/044; G06F 3/047; G09F 9/00;
G09F 9/33; H01B 13/00; H01B 5/14;
H01B 33/02; H01L 27/3211; H01L
27/3276; H01L 27/3218; H01L 27/323;
H01L 51/50; H05B 33/02
USPC .................................................. 345/170–178
See application file for complete search history.

(56) References Cited

U.S. PATENT DOCUMENTS

| | | | |
|---|---|---|---|
| 10,261,629 B2 | 4/2019 | Kurasawa | |
| 10,338,008 B2 | 7/2019 | Iwami | |
| 10,402,010 B2 | 9/2019 | Kurasawa | |
| 10,558,297 B2 | 2/2020 | Kurasawa | |
| 2011/0102361 A1 | 5/2011 | Philipp | |
| 2013/0242485 A1* | 9/2013 | Ohtani .................. | G06F 3/0412 174/250 |
| 2014/0152916 A1 | 6/2014 | Nakamura et al. | |
| 2015/0015979 A1* | 1/2015 | Iwami .................... | G02B 27/60 359/893 |
| 2015/0342034 A1 | 11/2015 | Iwami | |
| 2016/0026298 A1 | 1/2016 | Hashida et al. | |
| 2016/0170517 A1* | 6/2016 | Donnelly .............. | G06F 3/0412 345/174 |
| 2016/0266709 A1 | 9/2016 | Kurasawa | |
| 2016/0274703 A1* | 9/2016 | Satou .................... | G06F 3/0445 |
| 2017/0221196 A1 | 8/2017 | Yamaguchi et al. | |
| 2017/0285802 A1* | 10/2017 | Ishizaki ................ | G06F 3/0445 |
| 2017/0315656 A1* | 11/2017 | Guard .................... | G06F 3/0445 |
| 2018/0018047 A1* | 1/2018 | Iwami .................... | G06F 3/047 |
| 2018/0024689 A1* | 1/2018 | Yoshiki ................. | G06F 3/0443 345/173 |
| 2018/0307350 A1* | 10/2018 | Nukui .................... | G06F 3/044 |
| 2020/0117301 A1* | 4/2020 | Nakayama ............. | G06F 3/047 |
| 2020/0125202 A1* | 4/2020 | Li .......................... | H01L 51/56 |
| 2021/0011583 A1* | 1/2021 | Katsuyama ........... | G06F 3/0445 |
| 2021/0013269 A1* | 1/2021 | Katsuyama ............ | G09F 9/00 |
| 2021/0064106 A1* | 3/2021 | Katsuyama ........... | G02F 1/1343 |

FOREIGN PATENT DOCUMENTS

| | | |
|---|---|---|
| JP | 2014109997 | 6/2014 |
| JP | 2015035205 | 2/2015 |
| JP | 2016014929 | 1/2016 |
| JP | 2016170730 | 9/2016 |
| JP | 2016184406 | 10/2016 |
| WO | 2014123009 | 8/2014 |
| WO | 2016060147 | 4/2016 |

OTHER PUBLICATIONS

"International Preliminary Report on Patentability (Form PCT/IPEA/409) of PCT/JP2019/012895," completed on Jun. 10, 2020, with English translation thereof, pp. 1-31.

* cited by examiner

CONDUCTIVE MEMBER, CONDUCTIVE FILM, DISPLAY DEVICE HAVING THE SAME, TOUCH PANEL, METHOD OF PRODUCING WIRING PATTERN OF CONDUCTIVE MEMBER, AND METHOD OF PRODUCING WIRING PATTERN OF CONDUCTIVE FILM

CROSS-REFERENCE TO RELATED APPLICATIONS

This application is a Continuation of PCT International Application No. PCT/JP2019/012895 filed on Mar. 26, 2019, which claims priority under 35 U.S.C. § 119(a) to Japanese Patent Application No. 2018-059697 filed on Mar. 27, 2018. The above application is hereby expressly incorporated by reference, in its entirety, into the present application.

BACKGROUND OF THE INVENTION

1. Field of the Invention

The present invention relates to a conductive member, a conductive film, a display device having the same, a touch panel, a method of producing a wiring pattern of the conductive member, and a method of producing a wiring pattern of the conductive film. More specifically, the present invention relates to a conductive member having a mesh-shaped wiring pattern that provides an image quality with improved visibility of moiré even in a case where overlapped on a pixel array pattern of a display device, a conductive film, a display device having the same, a touch panel, a method of producing a wiring pattern of the conductive member, and a method of producing a wiring pattern of the conductive film.

2. Description of the Related Art

Examples of a conductive film provided on a display unit of a display device (hereinafter, also referred to as a display) include a conductive film for a touch panel having a conductive film being composed of thin metal wires having a mesh-shaped wiring pattern (hereinafter, also referred to as a mesh pattern).

In these conductive films, there is a problem of visibility of moiré due to interference between the mesh pattern and the pixel array pattern of the display. Here, the pixel array pattern of the display is, for example, each array pattern of red (R), green (G), and blue (B) color filters or a black matrix (hereinafter also referred to as BM) pattern which is an inverted pattern thereof. As for the problem of visibility of moiré, specifically, there is a known problem that regular moiré is conspicuous in a case where the equal pitch wiring pattern is overlapped on the pixel array pattern. For this reason, various conductive films, each of which has a mesh pattern in which moiré (particularly regular moiré) is not visible or hardly likely to be visible, have been proposed (refer to, for example, JP2013-213858A, JP2013-214545A, and JP2016-014929A).

The technology disclosed in JP2013-213858A relating to the application filed by the present applicant relates to a conductive film provided on a display unit of a display device. In the technology, the sum of moiré intensities within a predetermined frequency range is equal to or less than a predetermined value with respect to moiré frequency information and intensity obtained by applying visual response characteristics to moiré frequency information and intensity calculated from the frequency and intensity of a 2-dimensional fast Fourier transform (2DFFT) spectrum between a wiring pattern and a pixel array pattern of the conductive film. In the technology of JP2013-213858A, it is possible to restrain occurrence of moiré, and it is possible to improve visibility.

The technology disclosed in JP2013-214545A relating to the application filed by the present applicant is based on the technology disclosed in JP2013-213858A described above. In the technology, the wiring pattern is limited to rhomboids, and irregularity is provided to the rhomboid shape of the mesh pattern, in which the sum of moiré intensities is equal to or less than a predetermined value, in accordance with the width of the thin metal wires forming the mesh pattern. In the technology of JP2013-214545A, it is also possible to restrain occurrence of moiré, and it is possible to improve visibility.

The technology disclosed in JP2016-014929A relating to the application filed by the present applicant is a technology based on a 2-layer wiring pattern on the upper side (TOP) and the lower side (BOTTOM) and a rhomboid wiring pattern to which irregularity is provided. Here, at least one of TOP or BOTTOM is a wiring pattern in which irregularity is provided to the pitches of rhomboids. According to this technology, the 2-layer wiring pattern is configured such that the moiré evaluation value calculated from the moiré evaluation values of the respective colors is equal to or less than a threshold value. The moiré evaluation value of each color is obtained by applying visual response characteristics to the intensity and frequency of the spectrum peak of the 2DFFT spectrum of each color and the intensity and frequency of moiré calculated from the intensity and frequency of the 2DFFT spectrum of the overlapping wiring pattern. According to the technology disclosed in JP2016-014929A, it is possible to restrain occurrence of moiré depending on the intensity of the display regardless of the observation distance, and it is possible to greatly improve visibility.

SUMMARY OF THE INVENTION

By the way, in JP2013-213858A, a rhomboid (diamond) mesh pattern is shown as a specific example of the wiring pattern. The rhomboid-shaped mesh pattern is a wiring pattern in which wiring patterns in two directions are overlapped at the same angle and pitch, and in JP2013-213858A, the wiring pattern optimal for moiré reduction is determined by changing this angle and pitch. However, this method is not sufficiently effective in reducing moiré.

On the other hand, JP2013-214545A and JP2016-014929A attempt to provide irregularity to the wiring pattern.

However, in a case where irregularity is provided to the wiring pattern, although regular moiré is reduced, irregular moiré (noise) increases. As a result, there is a problem that visibility of moiré (the sum of regular moiré and irregular moiré) does not change.

In JP2016-014929A, an attempt is made to "select a wiring pattern in which the moiré evaluation index is equal to or less than a threshold value after providing irregularity". However, in a case where such an attempt is made, although the regular moiré can be reduced as compared with the regular wiring pattern, there is no guarantee that both the regular moiré and the irregular moiré (noise) can be reduced.

In order to solve the above-mentioned problems of the prior art, the present invention has an object to provide a conductive member, a conductive film, a display device and a touch panel having the same, a method of producing a wiring pattern of a conductive member, and a method of producing a wiring pattern of a conductive film. The conductive member and the conductive film each have a wiring pattern in which straight line wirings in two or more directions are overlapped, is capable of reducing moiré by changing the wiring pitches in at least two directions, and has less moiré than an equal pitch wiring pattern.

In order to achieve the above object, the conductive member according to the first aspect of the present invention is a conductive member including a wiring portion being composed of a plurality of thin metal wires. The wiring portion has a wiring pattern in which straight line wirings each being composed of a plurality of thin metal wires arranged in parallel in one direction are overlapped in two or more directions. The wiring pattern is a separate-direction non-equal pitch wiring pattern in which the average pitch of the straight line wiring in at least one direction is different from the average pitch of the straight line wiring in at least one different direction.

Here, it is preferable that the conductive member is to be provided on a display unit of a display device. In addition, it is preferable that the wiring pattern is overlapped on a pixel array pattern of the display unit.

In order to achieve the above object, the conductive film according to the second aspect of the present invention is a conductive film including a transparent substrate and a wiring portion formed on at least one surface of the transparent substrate and being composed of a plurality of thin metal wires. The wiring portion has a wiring pattern in which straight line wirings each being composed of a plurality of thin metal wires arranged in parallel in one direction are overlapped in two or more directions. The wiring pattern is a separate-direction non-equal pitch wiring pattern in which the average pitch of the straight line wiring in at least one direction is different from the average pitch of the straight line wiring in at least one different direction.

Here, it is preferable that a moiré evaluation value in the separate-direction non-equal pitch wiring pattern is less than a moiré evaluation value in a first omnidirectional-equal pitch wiring pattern in which a direction of each straight line wiring and a wiring density per unit area are the same as those of the separate-direction non-equal pitch wiring pattern. In addition, it is preferable that the moiré evaluation value is a sum of intensities of frequency components of moiré obtained by applying human's visual response characteristics to frequency components of the moiré calculated from frequency components of 2-dimensional Fourier frequency distributions of transmittances of the wiring patterns and frequency components of a 2-dimensional Fourier frequency distribution of a luminance or a transmittance of the pixel array pattern.

Further, it is preferable that a moiré evaluation value in the separate-direction non-equal pitch wiring pattern is less than a moiré evaluation value in a second omnidirectional-equal pitch wiring pattern in which a direction of each straight line wiring is different from that of the separate-direction non-equal pitch wiring pattern but a number of the straight line wirings and a wiring density per unit area are the same as those of the separate-direction non-equal pitch wiring pattern. In addition, it is preferable that the moiré evaluation value is a sum of intensities of frequency components of moiré obtained by applying human's visual response characteristics to frequency components of the moiré calculated from frequency components of 2-dimensional Fourier frequency distributions of transmittances of the wiring patterns and frequency components of a 2-dimensional Fourier frequency distribution of a luminance or a transmittance of the pixel array pattern.

Further, it is preferable that the visual response characteristics are given by a visual transfer function VTF represented by Expression (1).

$k \leq \log(0.238/0.138)/0.1$ $VTF=1$ $k > \log(0.238/0.138)/0.1$ $VTF=5.05e^{-0.138k}(1-e^{0.1k})$ $k=\pi du/180$ \hfill (1)

Here, log is a natural logarithm, k is a spatial frequency defined by solid angle (cycle/deg), u is a spatial frequency defined by length (cycle/mm), and d is an observation distance (mm) within a range of 100 mm to 1000 mm.

In order to achieve the above object, according to a third aspect of the present invention, there is provided a display device including: a display unit having a predetermined pixel array pattern; and the conductive member according to the first aspect of the present invention or the conductive film according to the second aspect of the present invention, which is provided on the display unit.

Here, it is preferable that the display unit is an organic EL display (OELD), and the pixel array patterns of at least two colors of red (R), green (G), and blue (B) are different.

In order to achieve the above object, according to a fourth aspect of the present invention, there is provided a touch panel using the conductive member according to the first aspect of the present invention or the conductive film according to the second aspect of the present invention.

In order to achieve the above-mentioned object, according to a fifth aspect of the present invention, there is provided a method of producing a wiring pattern of a conductive member which is provided on a display unit of a display device and has a wiring portion that is composed of a plurality of thin metal wires, where the wiring portion has a wiring pattern in which straight line wirings each being composed of a plurality of thin metal wires arranged in parallel in one direction are overlapped in two or more directions. The wiring pattern is overlapped on the pixel array pattern of the display unit, and is a separate-direction non-equal pitch wiring pattern in which an average pitch of the straight line wiring in at least one direction is different from an average pitch of the straight line wiring in at least one different direction. A transmittance of the wiring pattern and a luminance or a transmittance of the pixel array pattern are obtained. A 2-dimensional Fourier frequency distribution of the transmittance of the wiring pattern and a 2-dimensional Fourier frequency distribution of the luminance or the transmittance of the pixel array pattern are derived. Respective frequency components of moiré is calculated from frequency components of the 2-dimensional Fourier frequency distribution of the transmittances of the wiring patterns and frequency components of the 2-dimensional Fourier frequency distribution of the luminance or the transmittance of the pixel array pattern. In addition, it is preferable that human's visual response characteristics are applied to the calculated respective frequency components of the moiré so as to obtain a moiré evaluation value, which is a sum of intensities of the respective frequency components. The separate-direction non-equal pitch wiring pattern is produced in a state where the moiré evaluation value in the separate-direction non-equal pitch wiring pattern obtained in such a manner is less than a moiré evaluation value in a first omnidirectional-equal pitch wiring pattern in which a direction of each straight line wiring and a wiring density per unit area are the same as those of the separate-direction non-equal pitch wiring pattern, or a second omnidirectional-equal pitch wiring pattern in which a direction of each straight line wiring is different from that of the separate-direction non-equal pitch wiring pattern but a number of the straight line wirings and a wiring density per unit area are the same as those of the separate-direction non-equal pitch wiring pattern.

In order to achieve the above object, according to a sixth aspect of the present invention, there is provided a method of producing a wiring pattern of a conductive film which is provided on a display unit of a display device and has a transparent substrate and a wiring portion that is formed on at least one surface of the transparent substrate and being composed of a plurality of thin metal wires, where the wiring portion has a wiring pattern in which straight line wirings each being composed of a plurality of thin metal wires arranged in parallel in one direction are overlapped in two or more directions. The wiring pattern is overlapped on the pixel array pattern of the display unit, and is a separate-direction non-equal pitch wiring pattern in which an average pitch of the straight line wiring in at least one direction is different from an average pitch of the straight line wiring in at least one different direction. A transmittance of the wiring pattern and a luminance or a transmittance of the pixel array pattern are obtained. A 2-dimensional Fourier frequency distribution of the transmittance of the wiring pattern and a 2-dimensional Fourier frequency distribution of the luminance or the transmittance of the pixel array pattern are derived. Respective frequency components of moiré is calculated from frequency components of the 2-dimensional Fourier frequency distribution of the transmittances of the wiring patterns and frequency components of the 2-dimensional Fourier frequency distribution of the luminance or the transmittance of the pixel array pattern. In addition, it is preferable that human's visual response characteristics are applied to the calculated respective frequency components of the moiré so as to obtain a moiré evaluation value, which is a sum of intensities of the respective frequency components. The separate-direction non-equal pitch wiring pattern is produced in a state where the moiré evaluation value in the separate-direction non-equal pitch wiring pattern obtained in such a manner is less than a moiré evaluation value in a first omnidirectional-equal pitch wiring pattern in which a direction of each straight line wiring and a wiring density per unit area are the same as those of the separate-direction non-equal pitch wiring pattern, or a second omnidirectional-equal pitch wiring pattern in which a direction of each straight line wiring is different from that of the separate-direction non-equal pitch wiring pattern but a number of the straight line wirings and a wiring density per unit area are the same as those of the separate-direction non-equal pitch wiring pattern.

In any one of the first to sixth aspects, it is preferable that an intensity of a frequency component of the moiré that contributes most to the moiré in the separate-direction non-equal pitch wiring pattern is less than an intensity of a frequency component of the moiré that contributes most to the moiré in a first omnidirectional-equal pitch wiring pattern in which a direction of each straight line wiring and a wiring density per unit area are the same as those of the separate-direction non-equal pitch wiring pattern, or a second omnidirectional-equal pitch wiring pattern in which a direction of each straight line wiring is different from that of the separate-direction non-equal pitch wiring pattern but a number of the straight line wirings and a wiring density per unit area are the same as those of the separate-direction non-equal pitch wiring pattern.

It is preferable that a frequency of a frequency component of the moiré that contributes most to the moiré in the separate-direction non-equal pitch wiring pattern is greater than a frequency of a frequency component of the moiré that contributes most to the moiré in a first omnidirectional-equal pitch wiring pattern in which a direction of each straight line wiring and a wiring density per unit area are the same as those of the separate-direction non-equal pitch wiring pattern, or a second omnidirectional-equal pitch wiring pattern in which a direction of each straight line wiring is different from that of the separate-direction non-equal pitch wiring pattern but a number of the straight line wirings and a wiring density per unit area are the same as those of the separate-direction non-equal pitch wiring pattern.

It is preferable that a moiré evaluation value in the separate-direction non-equal pitch wiring pattern is less than a moiré evaluation value in a first omnidirectional-equal pitch wiring pattern in which a direction of each straight line wiring and a wiring density per unit area are the same as those of the separate-direction non-equal pitch wiring pattern, or a second omnidirectional-equal pitch wiring pattern in which a direction of each straight line wiring is different from that of the separate-direction non-equal pitch wiring pattern but a number of the straight line wirings and a wiring density per unit area are the same as those of the separate-direction non-equal pitch wiring pattern. In addition, it is preferable that the moiré evaluation value is a sum of intensities of frequency components of frequencies equal to or less than the frequency of a frequency component of moiré that contributes most to the moiré in the omnidirectional-equal pitch wiring pattern, among frequency components of moiré obtained by applying human's visual response characteristics to frequency components of the moiré calculated from frequency components of 2-dimensional Fourier frequency distributions of transmittances of the wiring patterns and frequency components of a 2-dimensional Fourier frequency distribution of a luminance or a transmittance of the pixel array pattern.

It is preferable that at a frequency of the frequency component of moiré that contributes most to the moiré in a first omnidirectional-equal pitch wiring pattern in which a direction of each straight line wiring and a wiring density per unit area are the same as those of the separate-direction non-equal pitch wiring pattern, or a second omnidirectional-equal pitch wiring pattern in which a direction of each straight line wiring is different from that of the separate-direction non-equal pitch wiring pattern but a number of the straight line wirings and a wiring density per unit area are the same as those of the separate-direction non-equal pitch wiring pattern, an intensity of the frequency component of the moiré in the separate-direction non-equal pitch wiring pattern is less than an intensity of the frequency component of the moiré in the omnidirectional-equal pitch wiring pattern.

Further, it is preferable that an observation distance in the visual response characteristics is a certain distance in a range from 300 mm to 800 mm.

Furthermore, it is preferable that assuming that the moiré evaluation value is I, the moiré evaluation value I is derived from an intensity of each frequency component of the moiré by Expression (2).

$$I = (\Sigma(R[i])^x)^{1/x} \qquad (2)$$

Here, R[i] is an intensity of an i-th frequency component of moiré, and the order x is a certain value in a range of 1 to 4.

In addition, it is preferable that the order x is 2.

Further, it is preferable that the moiré evaluation value is derived by a non-linear sum of the intensities of the frequency components of the moiré.

Furthermore, it is preferable that the moiré evaluation value also includes frequency components of the moiré calculated from a frequency of 0 of the pixel array pattern and the frequency components of the wiring pattern.

Further, it is preferable that the pixel array pattern is a black matrix pattern.

It is preferable that the wiring portion has a wiring pattern in which the straight line wirings are overlapped in two directions.

Further, it is preferable that the wiring pattern in which the straight line wirings are overlapped in two directions is bilaterally asymmetric.

Further, it is preferable that an angle formed by the straight line wirings in the two directions is in a range of 40° to 140°.

In addition, an average pitch of the straight line wiring in at least one direction among the straight line wirings overlapped in the two or more directions is in a range of 30 μm to 600 μm.

Furthermore, it is preferable that the average pitch is equal to or less than 300 μm.

Further, it is preferable that in the straight line wiring in at least one direction in the separate-direction non-equal pitch wiring pattern, repetitive pitches of a predetermined number of the thin metal wires are equal pitches, and respective pitches of the predetermined number of the thin metal wires are non-equal pitches.

Further, it is preferable that in a straight line wiring in a direction in which an average pitch is the narrowest among the straight line wirings in two or more directions, repetitive pitches of a predetermined number of the thin metal wires are equal pitches, and respective pitches of the predetermined number of the thin metal wires are non-equal pitches.

Furthermore, it is preferable that the predetermined number is equal to or less than 16.

As described above, according to the embodiment of the present invention, it is possible to provide a conductive member, a conductive film, a display device and a touch panel having the same, a method of producing a wiring pattern of a conductive member, and a method of producing a wiring pattern of a conductive film. The conductive member and the conductive film each have a wiring pattern in which straight line wirings in two or more directions are overlapped by changing the wiring pitches in at least two directions, and has less moiré than an equal pitch wiring pattern.

DESCRIPTION OF THE PREFERRED EMBODIMENTS

Figure 1:
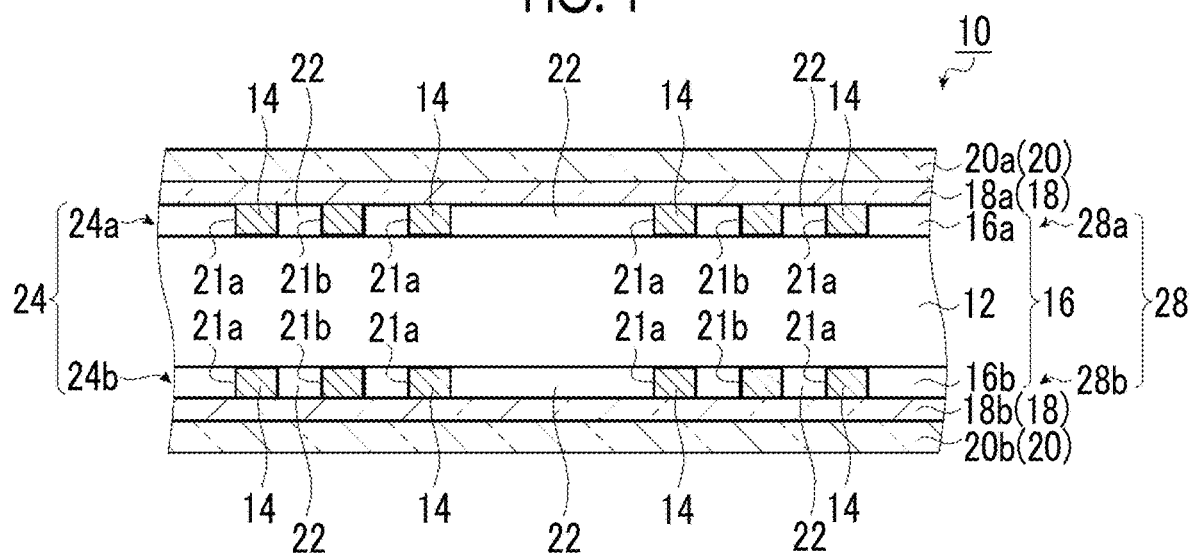
FIG. 1 is a partial cross-sectional view schematically showing an example of a conductive film according to a first embodiment of the present invention.

Hereinafter, a conductive member, a conductive film, a display device having the same, a touch panel, a method of producing a wiring pattern of a conductive member, and a method of producing a wiring pattern of a conductive film according to the embodiment of the present invention will be described in detail with reference to suitable embodiments shown in the accompanying drawings.

In the embodiment of the present invention, one having at least a wiring portion being composed of a plurality of thin metal wires is defined as a conductive member, and one having a transparent substrate among them is defined as a conductive film. That is, the conductive member of the embodiment of the present invention includes both a conductive film, which does not have a transparent substrate, and a conductive film, which has a transparent substrate, used in a case where the film is directly disposed on the display unit or in a case where the film is directly disposed on the pixel array of the display unit. Therefore, the present invention is characterized by a wiring pattern being composed of a plurality of thin metal wires, and relates to a typical wiring pattern itself being composed of thin metal wires, regardless of the transparent substrate, in both the conductive member that does not define the transparent substrate and the conductive film including the transparent substrate. Hereinafter, the present invention will be mainly described with respect to a conductive film having a transparent substrate, but the embodiment of the present invention is characterized in a wiring pattern being composed of a plurality of thin metal wires. Thus, the description thereof relates to a conductive member which is a superordinate concept. Here, the conductive member of the embodiment of the present invention can be called a sensor member.

In addition, the conductive member and the conductive film according to the embodiment of the present invention will be described below by using a conductive film for a touch panel as a representative example, but the embodiment of the present invention is not limited thereto. For example, as the conductive film of the embodiment of the present invention, any conductive film may be used as long as the film has a wiring portion which is formed on at least one surface of a transparent substrate and has a wiring pattern including a separate-direction non-equal pitch wiring pattern in which straight line wirings having mutually different average wiring pitches in different directions are overlapped. Here, the separate-direction non-equal pitch wiring pattern means a wiring pattern in which an average pitch of the straight line wiring in at least one direction is different from an average pitch of the straight line wiring in at least one different direction. Therefore, the wiring pattern of the wiring portion of the conductive film of the embodiment of the present invention may include a separate-direction non-equal pitch wiring pattern.

Further, the present invention may be any conductive film having such a wiring pattern as long as the conductive film is provided on a display unit of various light emission intensities of a display device. For example, as a matter of course, the present invention may be applied to a conductive film for shielding electromagnetic waves and the like. Here, a display device having a display unit, on which the conductive film of the embodiment of the present invention is provided, may be a liquid crystal display (LCD), a plasma display panel (PDP), an organic electro-luminescence display (OELD), an inorganic EL display, or the like.

Here, the wiring pattern formed on at least one surface of the transparent substrate means "a wiring pattern disposed on only one surface of the transparent substrate", "a wiring pattern on one surface or wiring patterns on both surfaces, among wiring patterns disposed on both respective surfaces of the transparent substrate", or "one wiring pattern or two or more wiring patterns, among the wiring patterns laminated on one surface of the transparent substrate". In addition, the wiring pattern formed on at least one surface of the transparent substrate also means "a wiring pattern in which wiring patterns disposed on both respective surfaces of the transparent substrate are overlapped (superposed)", "a wiring pattern in which two or more wiring patterns among wiring patterns laminated on one surface of the transparent substrate are overlapped (superposed)", or "a wiring pattern in which two wiring patterns are overlapped (superposed) by cementing two wiring patterns respectively disposed on two transparent substrates". Details will be described later.

A display unit (hereinafter, also referred to as a display) of a display device, on which the conductive film of the embodiment of the present invention is overlapped, is not particularly limited as long as pixels are arranged in accordance with a pixel array pattern (hereinafter, also referred to as a BM pattern) and the light emission intensity (luminance) thereof can be considered in the evaluation of visibility of moiré due to the overlap of conductive films. Alternatively, the display unit is not particularly limited as long as respective sub-pixels that emit light of a plurality of colors including at least three different colors, for example, three colors of red, green, and blue, are arranged in accordance with the pixel array patterns of the respective sub-pixels and the light emission intensity (luminance) thereof can be considered in the evaluation of visibility of moiré due to the overlap of conductive films. For example, as in the conventional case, the display unit may be a display unit of which the pixel array patterns (shapes, sizes, pixel array periods, and directions of the sub-pixels) of the sub-pixels of respective colors such as RGB are all the same and are represented by the G sub-pixel. In addition, in a similar manner to the above-mentioned OELD, the display unit may be a display unit which has pixel array patterns not the same for a plurality of colors, that is, different pixel array patterns of sub-pixels for at least two colors.

In a manner similar to that of a high resolution smartphone, a tablet terminal, or the like, the display of the display device subjected to the embodiment of the present invention may be a display which has a high light emission intensity. In a manner similar to that of a low resolution desktop PC, a television (TV), or the like, the display may be a display having a low light emission intensity. In a manner similar to that of a medium resolution laptop or the like, the display may be a display having approximately a medium light emission intensity.

Figure 2:
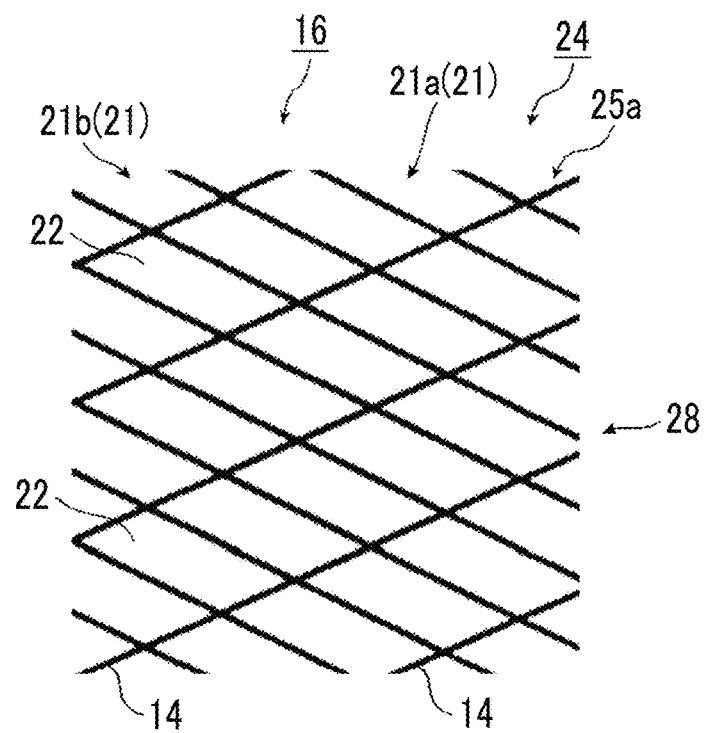
FIG. 2 is a plan view schematically showing an example of a wiring pattern of a wiring portion of the conductive film shown in FIG. 1.

FIG. 1 is a partial cross-sectional view schematically showing an example of a conductive film according to a first embodiment of the present invention. FIG. 2 is a plan view schematically showing a first example of a wiring pattern of a wiring portion of the conductive film shown in FIG. 1.

As shown in FIGS. 1 and 2, the conductive film 10 of the present embodiment is provided on the display unit of the display device, and is a conductive film which has a wiring pattern excellent in restraining occurrence of moiré with respect to the pixel array of the display unit, particularly, a wiring pattern optimized in terms of visibility of moiré with respect to the pixel array pattern in a case where the film is overlapped on the pixel array pattern.

The conductive film 10 shown in FIG. 1 includes a transparent substrate 12, a first wiring portion (electrode) 16a, a second wiring portion (electrode) 16b, a first protective layer 20a, and a second protective layer 20b.

The first wiring portion 16a is formed on one surface (upper surface in FIG. 1) of the transparent substrate 12, is composed of a plurality of thin metal wires (hereinafter, referred to as thin metal wires) 14, and serves as a first electrode portion. The second wiring portion 16b is formed on the other surface (the lower surface in FIG. 1) of the transparent substrate 12, is composed of a plurality of thin metal wires 14, and serves as a second electrode portion. The first protective layer 20a is adhered to the substantially entire surface of the first wiring portion 16a through the first adhesive layer 18a so as to cover the thin metal wires 14. The second protective layer 20b is adhered to the substantially entire surface of the second wiring portion 16b through the second adhesive layer 18b.

Hereinafter, the first wiring portion 16a and the second wiring portion 16b are collectively referred to as simply wiring portions 16, the first adhesive layer 18a and the second adhesive layer 18b are collectively referred to as simply adhesive layers 18, and the first protective layer 20a and the second protective layer 20b are collectively referred to as simply protective layers 20.

The conductive film 10 may have at least the transparent substrate 12 and the first wiring portion 16a. Although not shown, a functional layer such as an adhesion enhancing layer or an undercoat layer may be provided between the transparent substrate 12 and the first wiring portion 16a or between the transparent substrate 12 and the second wiring portion 16b.

The transparent substrate 12 is transparent and electrically insulating, that is, made of a material having a high insulating property and a high light-transmitting property, and is particularly not limited as long as the substrate is able to support the first wiring portion 16a and the second wiring portion 16b. Examples of the material forming the transparent substrate 12 include materials such as resin, glass, and silicon. Examples of the glass include tempered glass and alkali-free glass. Examples of the resin include polyethylene terephthalate (PET), polyethylene naphthalate (PEN), polymethyl methacrylate (PMMA), cycloolefin polymer (COP), cyclic olefin copolymer (COC), polycarbonate (PC), acrylic resin, polyethylene (PE), polypropylene (PP), polystyrene (PS), polyvinyl chloride (PVC), polyvinylidene chloride (PVDC), cellulose triacetate (TAC), and the like. The thickness of the transparent substrate 12 is, for example, 20 to 1000 µm, and particularly preferably 30 to 100 µm.

In the embodiment of the present invention, "transparent" means that the light transmittance is at least 30% or more, preferably 50% or more, more preferably 70% or more, even more preferably 90% or more, in the visible light wavelength range of 400 to 800 nm. The light transmittance is measured using "a method of calculating a total light transmittance and a total light reflectance of plastic" prescribed in JIS K7375: 2008.

The total light transmittance of the transparent substrate 12 is preferably 30% to 100%. The total light transmittance is measured using, for example, "a method of calculating a total light transmittance and a total light reflectance of plastic" prescribed in JIS K7375: 2008.

The conductive member according to the first embodiment of the present invention is the conductive film according to the first embodiment of the present invention shown in FIG. 1 having at least the wiring portion 16a. FIG. 2 is a plan view schematically showing an example of a wiring pattern of a wiring portion of the conductive member according to the first embodiment of the present invention, and is a diagram showing the conductive member according to the first embodiment of the present invention.

The thin metal wires 14 are not particularly limited as long as they are thin lines being composed of metal having high conductivity, and include thin lines made of a line material such as gold (Au), silver (Ag) or copper (Cu). While it is more preferable indeed in terms of visibility in a case where the thin metal wires 14 have a narrower line width, the line width has only to be equal to or less than 30 µm, for example. For application to a touch panel, the line width of the thin metal wires 14 is preferably equal to or greater than 0.1 µm and equal to or less than 15 µm, more preferably equal to or greater than 1 µm and equal to or less than 9 µm, and still more preferably equal to or greater than 1 µm and equal to or less than 7 µm. Furthermore, the line width is particularly preferably equal to or greater than 1 µm and equal to or less than 4 µm.

Figure 3:
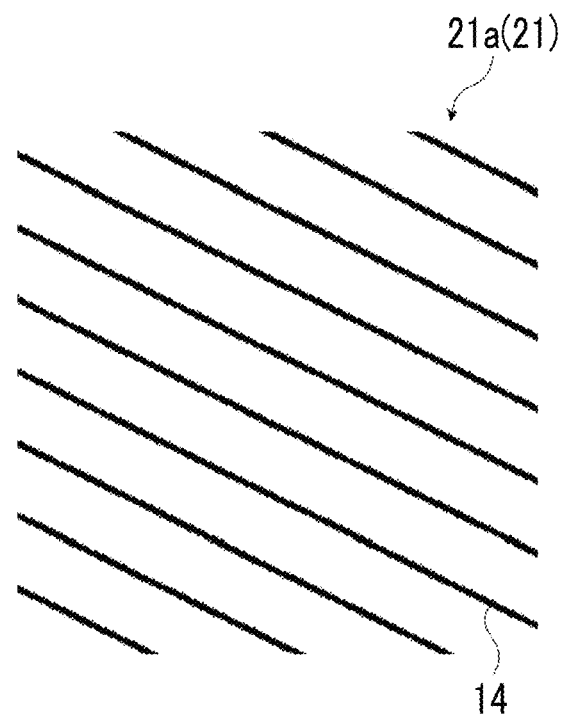
FIG. 3 is a plan view schematically showing an equal pitch wiring pattern in a straight line wiring of the wiring pattern in one direction shown in FIG. 2.
Figure 4:
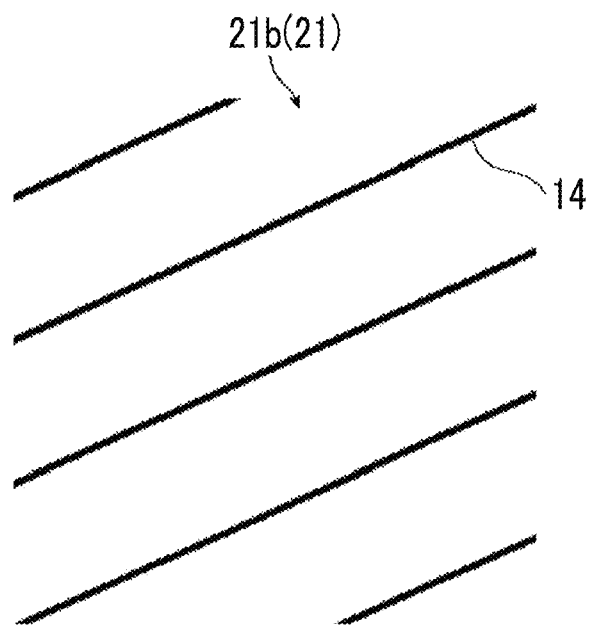
FIG. 4 is a plan view schematically showing a different equal pitch wiring pattern in a straight line wiring of the wiring pattern in another direction shown in FIG. 2.

As shown in FIG. 2, the wiring portion 16 (16a, 16b) is composed of a wiring layer 28 (28a, 28b) having a mesh-shaped wiring pattern 24 (24a, 24b) in which wirings are arranged in a mesh shape by overlapping a straight line wiring 21a being composed of a plurality of thin metal wires 14 arranged in parallel in one direction (right direction) shown in FIG. 3 and a straight line wiring 21b being composed of the plurality of thin metal wires 14 arranged in parallel in another direction (left direction) shown in FIG. 4. Here, the wiring pattern 24a of the wiring layer 28a and the wiring pattern 24b of the wiring layer 28b may be the same wiring pattern or different wiring patterns. However, hereinafter, the wiring patterns are the same wiring pattern and not distinguished, and thus will be described as the wiring pattern 24.

In the embodiment of the present invention, the straight line wirings 21a and 21b are straight line wirings having different pitches between the adjacent thin metal wires 14 in the wiring pattern 24 shown in FIG. 2. That is, the average pitch of the straight line wiring 21a is different from the average pitch of the straight line wiring 21b.

As shown in FIG. 2, the wiring pattern 24 is a separate-direction non-equal pitch wiring pattern 25a in which opening portions (cells) 22 each having a predetermined shape are arranged in a mesh shape. The opening portions 22 are formed by intersecting a plurality of thin metal wires 14 with each other by overlapping the straight line wiring 21a and the straight line wiring 21b having different average pitches between the adjacent thin metal wires 14.

Therefore, the separate-direction non-equal pitch wiring pattern 25a is a first example of the wiring pattern used in the embodiment of the present invention, and is a mesh-shaped wiring pattern in which the plurality of opening portions 22, which have parallelogram shapes having predetermined angles kept therebetween in plan view and having the same shape and size, are successively connected in two directions forming the predetermined angle and in which pitches thereof are different in the respective two directions.

Here, the average pitch of the thin metal wires 14 of the straight line wiring 21 to be overlapped is not particularly limited, but is preferably 30 µm to 600 µm. The reason for this is that in a case where the average pitch is narrow, the transmittance is low, and in contrast, in a case where the average pitch is wide, the thin metal wires are easily noticeable and visibility is deteriorated. It is preferable that the average pitch is within the above range such that the transmittance is in an allowable range and visibility of the thin metal wires is low.

In the straight line wirings 21a and 21b of the separate-direction non-equal pitch wiring pattern 25a of the first example shown in FIG. 2, the pitches between the adjacent thin metal wires 14 are equal pitches, and the wiring pitches of the straight line wirings 21a and 21b are different from each other, thereby forming a separate-direction non-equal pitch wiring pattern. However, the present invention is not limited to this, and in at least one of the straight line wirings 21a or 21b, in a case where the average pitches of the predetermined number of the thin metal wires 14 are equal pitches, the pitches between the adjacent thin metal wires 14 may not be completely equal pitches. For example, the repetitive pitches of the predetermined number of the thin metal wires 14 may be set to equal pitches, and the average pitches of the predetermined number of the thin metal wires 14 may be set to equal pitches.

It should be noted that the predetermined number at which the average pitch is an equal pitch is 2 or more. That is, since the minimum number of the thin metal wires 14 is two in a case where the pitches between the predetermined number of adjacent thin metal wires 14 are non-equal pitches, the predetermined number is 2 or more. Further, the predetermined number is preferably 64 or less, more preferably 32 or less, and still more preferably 16 or less. A particularly preferable predetermined number is 2 or more and 8 or less. The reason for this is that, as will be described later, the minimum frequency of the straight line wirings 21 becomes lower and the straight line wirings 21 themselves becomes more visible as the predetermined number of the thin metal wires 14 having non-equal pitches is increased. In addition, the frequency components of the straight line wirings 21 spread more finely as the predetermined number of the thin metal wires 14 having non-equal pitches is increased. As a result, a large number of fine moiré components are generated. In the embodiment of the present invention, even in a case where the pitches between the predetermined number of adjacent thin metal wires 14 of the straight line wirings 21 are non-equal pitches, it is not necessary that all the pitches of the predetermined number of thin metal wires 14 are different, and pitches of at least two thin metal wires 14 of the predetermined number of the thin metal wires 14 may be different.

Further, in the first example shown in FIG. 2, the straight line wirings 21 each being composed of the plurality of thin metal wires 14 arranged in parallel in one direction has two directions of the straight line wirings 21a and 21b. However, the present invention is not limited to this, and the straight line wirings 21 in three or more directions may be overlapped. In addition, the number of directions of the straight line wirings 21 having different overlapping directions is preferably 8 or less, more preferably 4 or less, and still more preferably two directions. The reason for this is that, as will be described later, there is an upper limit to the number of the thin metal wires 14 per unit area in order to secure the transmittance. Therefore, the smaller the number of directions of the straight line wirings 21, the more the number of the thin metal wires 14 per one direction, and as a result, the wiring pitches of the thin metal wires 14 can be narrowed such that moiré is hardly likely to occur. On the other hand, in order to prevent loss of the function of the conductive film as the touch sensor, it is necessary for the number of directions of the straight line wirings 21 to be at least two directions, and thus two directions are most desirable.

Figure 9:
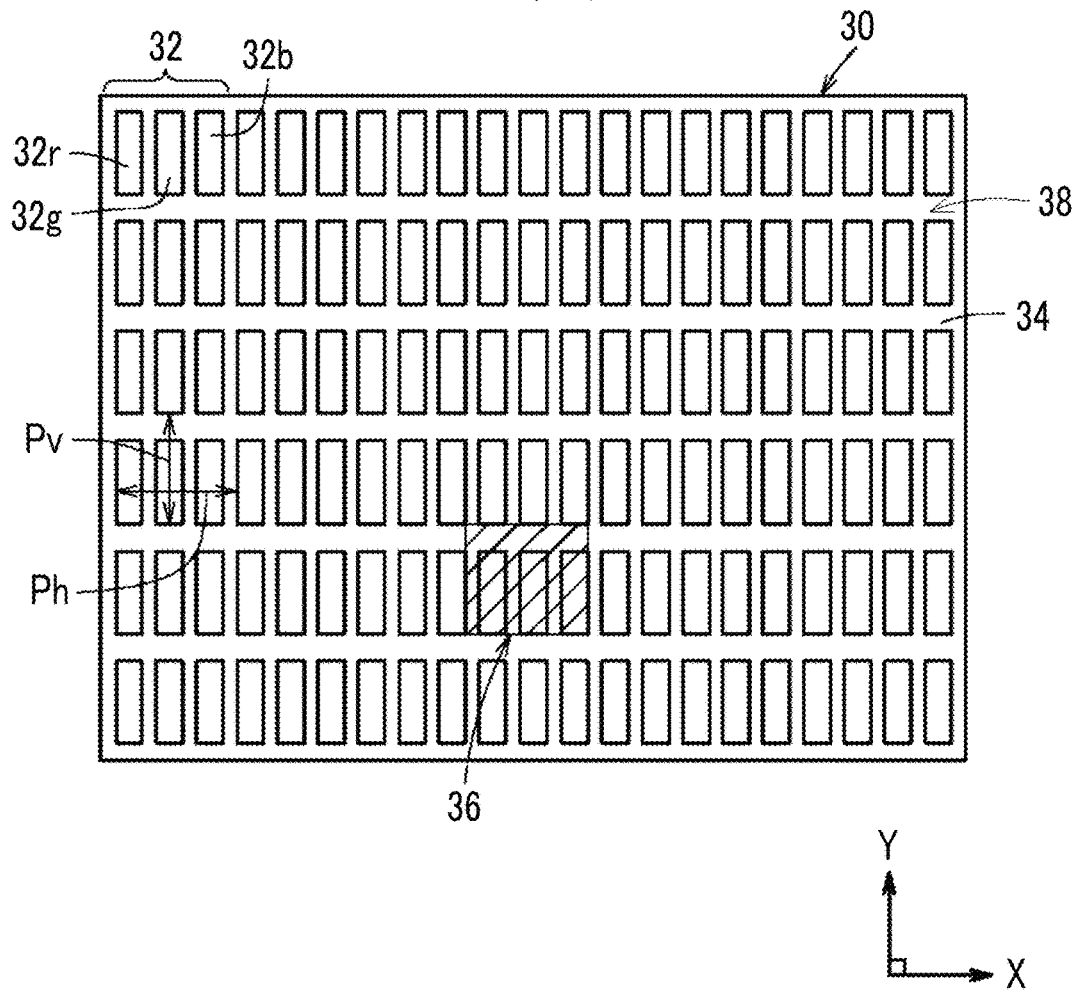
FIG. 9 is a schematic explanatory diagram showing an example of a pixel array pattern of a part of the display unit to which the conductive film according to the embodiment of the present invention is applied.
Figure 11:
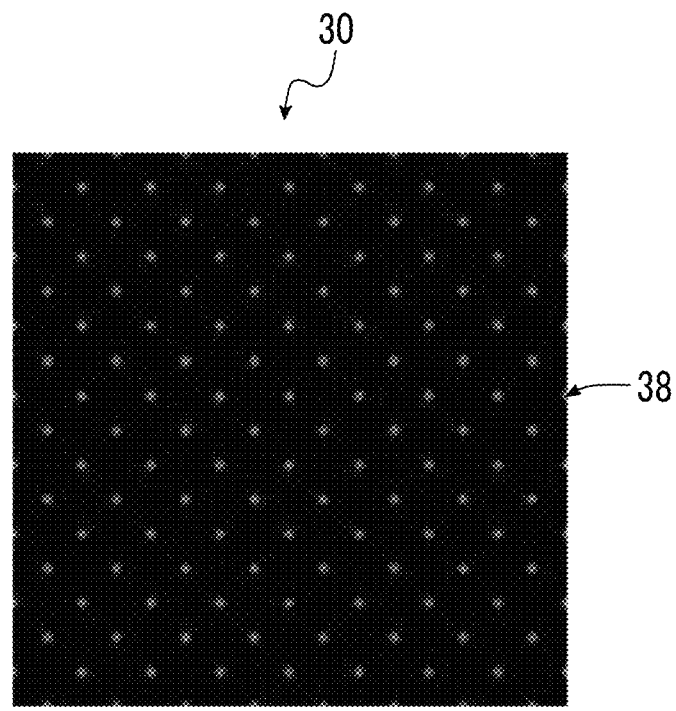
FIG. 11 is a plan view schematically showing an example of a luminance pattern of a pixel array of the display unit shown in FIG. 9.

Further, in the first example shown in FIG. 2, the separate-direction non-equal pitch wiring pattern 25a, the angle formed with the horizontal line (horizontal axis direction) of the straight line wiring 21a in one direction (rightward) in the straight line wirings 21 in two directions of the straight line wirings 21a and 21b is 26°, and the angle formed with the horizontal line (horizontal axis direction) of the straight line wiring 21b in the other direction (leftward) is 24°, and the inclination angles thereof are different. Here, in the embodiment of the present invention, the inclination angle of the wiring represents an angle of the wiring with respect to the pixel array pattern. That is, in a case where a predetermined direction of the pixel array pattern is a horizontal line (horizontal axis direction), an angle formed between the wiring and the horizontal line (horizontal axis direction) is called an inclination angle. Although any direction of the pixel array pattern may be a horizontal line (horizontal axis direction), in the embodiment of the present invention, in order to explain the characteristics of the wiring pattern in the embodiment of the present invention, the direction vertical to the axis of symmetry in pixel array patterns which are line-symmetric as shown in FIGS. 9 and 11 described later is set as a horizontal line (horizontal axis direction). In other words, in the embodiment of the present invention, the phrase "the inclination angle of the straight line wiring of the wiring pattern in one direction is different from the inclination angle of the straight line wiring in the other direction" means that the wiring pattern is bilaterally asymmetric with respect to the bilaterally symmetric pixel array pattern. That is, the phrase means that the separate-direction non-equal pitch wiring pattern 25a shown in FIG. 2 is bilaterally asymmetric with respect to the bilaterally symmetric pixel array pattern. The pixel array pattern of the display device on which the conductive film of the embodiment of the present invention is overlapped is not limited to the line-symmetric pixel array pattern, and it is apparent that any direction of the pixel array pattern may be a horizontal line (horizontal axis direction). It should be noted that the angles formed by the two sides of the parallelogram of the opening portion 22 are 50° and 130°.

Figure 51:
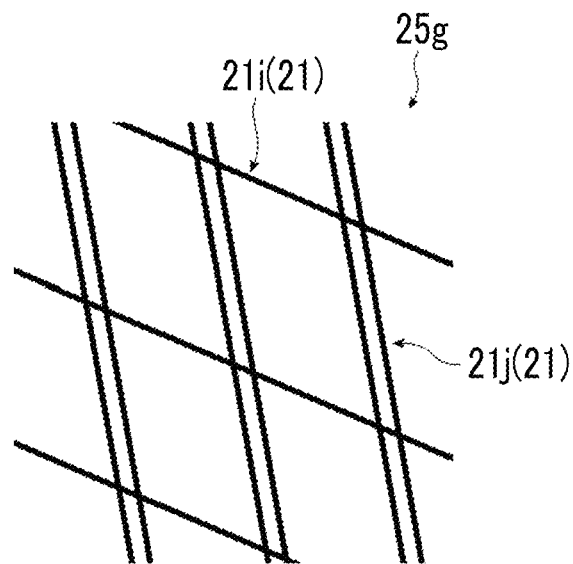
FIG. 51 is a plan view schematically showing another example of a wiring pattern of a wiring portion of the conductive film shown in FIG. 1.

Further, in the wiring pattern 25a shown in FIG. 2, the inclination angles of the straight line wirings 21a and 21b in the two directions are slightly different from those of the bilaterally symmetric pixel array pattern shown in FIG. 11. However, similarly to the wiring pattern 25g shown in FIG. 51, the inclination angles of the straight line wirings in the two directions 21i and 21j may be greatly different. That is, as shown in FIG. 51, the wiring pattern of the embodiment of the present invention may be a bilaterally asymmetric wiring pattern 25g in which straight line wirings 21i and 21j in two directions having different inclination angles are overlapped. Here, the bilaterally symmetric pixel array pattern can be defined by "bilateral symmetry of at least the positions of the respective pixels". Further, the pattern can also be defined by "the bilateral symmetry additionally including bilateral symmetry of the shape and size of each pixel".

In the embodiment of the present invention, as shown in FIGS. 2 and 51, the reason why the wiring pattern may be more preferably bilaterally asymmetric is as follows. "In a case where the average pitches of the straight line wirings in two directions are different, the directions (angles) in which the moirés of the straight line wirings are the optimum are not necessarily the same". In addition, "the closer the angle formed by the straight line wirings in the two directions to the right angle (90 degrees), the higher the accuracy of 2-dimensional contact position detection using a touch sensor".

Figure 47:
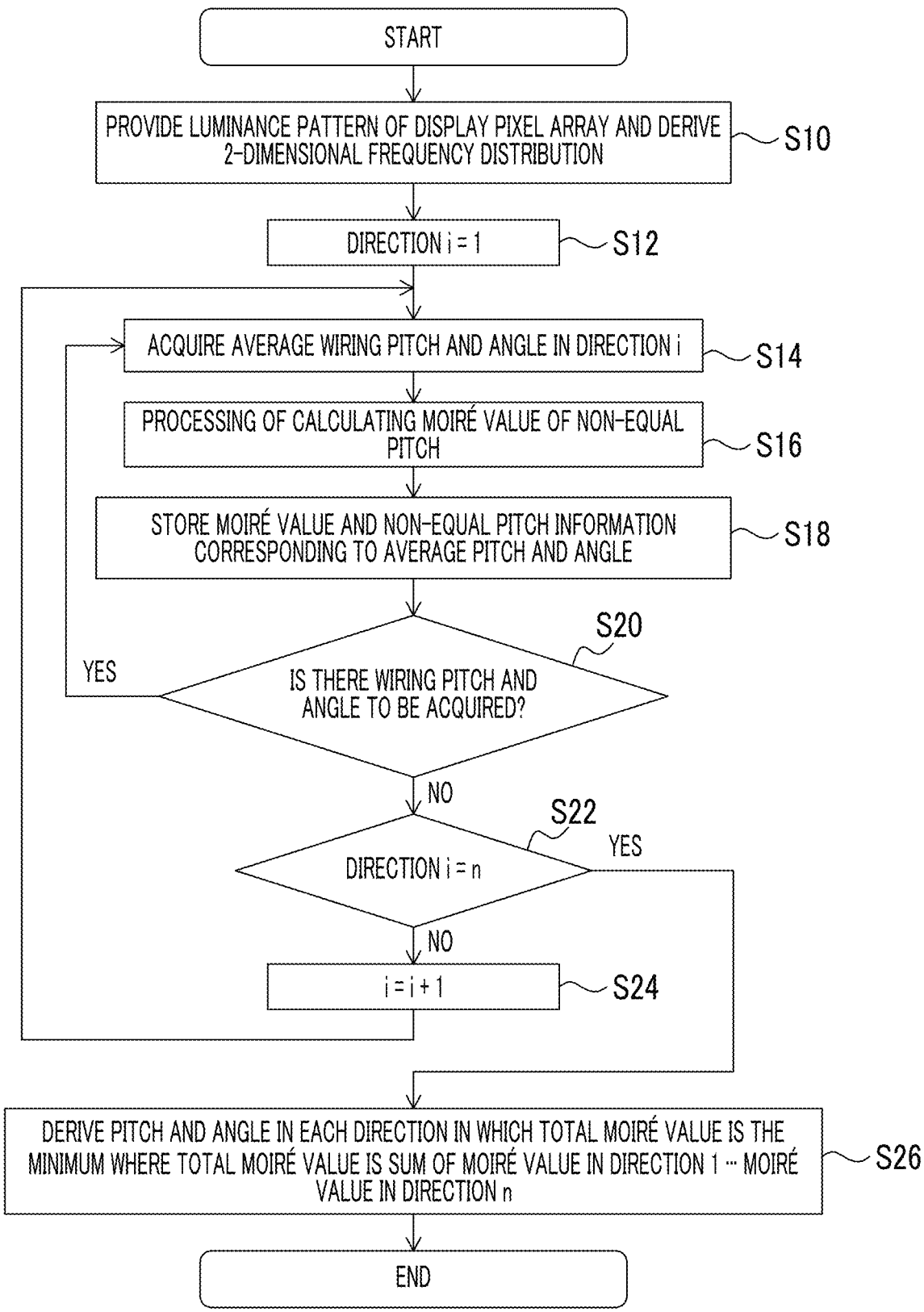
FIG. 47 is a flowchart showing an example of a method of producing a wiring pattern of a conductive film according to the embodiment of the present invention.

FIG. 51 shows an example of a wiring pattern having a favorable total moiré value, which is derived after the number of wirings per unit area is limited in terms of the transmittance of the wiring in accordance with the flow of the method of producing the wiring pattern of the conductive film of the embodiment of the present invention shown in FIG. 47, relative to the bilaterally symmetric pixel array pattern shown in FIG. 11. In such an example, since the average pitches of the straight line wirings in the two directions are different, the directions (angles) in which the moiré values are favorable are different in the respective straight line wirings. Further, in such an example, the straight line wirings in the two directions are both directed to the right. It is needless to say that the present invention includes such an example in which the straight line wirings in the two directions are both directed to the right or left.

By the way, in a wiring pattern in which straight line wirings are overlapped in two directions, the closer the angle formed between the two directions to the right angle (90 degrees), the higher the accuracy of 2-dimensional contact position detection using a touch sensor. Further, in a case where there are two or more wiring layers, for example, in a case of observing from an oblique direction, there may be deviation in the position of the wiring pattern of each layer. Then, the pitch of the straight line wiring may change due to this deviation, but in this case, the degree of change in pitch of the straight line wiring differs depending on the direction of the deviation of the wiring pattern of each layer and the direction of the straight line wiring. In a case where the angle formed by the deviation direction and the direction of the straight line wiring is the right angle (90 degrees), the pitch does not change, and in a case where the deviation direction and the direction of the straight line wiring are the same, the change in pitch becomes the maximum. From this fact, even in a case where the position of the wiring pattern of each layer more deviates as the angle formed by the straight line wirings in the two directions becomes closer to the right angle (90 degrees), the wiring in which the straight line wirings in the two directions are overlapped does not depend on the deviation direction. The change in total pitch of the wiring pattern is small. Therefore, occurrence of moiré due to the change in pitch of the wiring pattern and/or reduction in visibility of the wiring pattern are small. Further, in the technology of optimizing the pitch of the wiring pattern from the viewpoint of moiré visibility as in the embodiment of the present invention, it is particularly effective that the angle formed by the straight line wirings in the two directions is close to the right angle (90 degrees).

From the above, the inclination angle of the straight line wirings in two directions, for example, the inclination angle of the straight line wirings 21 (21a and 21b) as shown in FIG. 2 and the inclination angle of the straight line wirings 21i and 21j as shown in FIG. 51 are not particularly limited and each may be any degrees. Further, the angle formed by the two-direction straight line wiring, for example, the angle formed by the straight line wirings 21a and 21b as shown in FIG. 2 (that is, the angle formed by the two sides of the parallelogram of the opening portion 22), and the angle formed by the straight line wirings 21i and 21j shown in FIG. 51 (that is, the angle formed by the two sides of the parallelogram of the opening portion to be formed) are not particularly limited and each may be any degrees. However, the angle formed by the straight line wirings in the two directions is preferably in the range of 40° to 140° (90°±50°), more preferably in the range of 60° to 120° (90°±30°), and still more preferably in the range of 75° to 105° (90°+15°). One of the reasons is that, as described above, the closer the angle formed by the straight line wirings 21a and 21b and the angle formed by the straight line wirings 21i and 21j is to the right angle (90°), the higher the accuracy in detection of the 2-dimensional contact position using a touch sensor.

In the separate-direction non-equal pitch wiring pattern 25a, the inclination angles of the straight line wirings 21 as the straight line wirings 21a and 21b in the two directions with respect to the horizontal line in the straight line wirings 21 are different, but the embodiment of the present invention is not limited to this. In the embodiment of the present invention, the angles of the straight line wirings in two or more directions with respect to the horizontal line (horizontal axis direction) may be different from each other, or the straight line wirings in two or more directions having the same angle may be included. All the straight line wirings may have the same angle. For example, as in the separate-direction non-equal pitch wiring pattern 25b of the second embodiment shown in FIG. 5, the straight line wiring 21a in one direction and the straight line wiring 21c in the other direction may have the same inclination angle (the straight line wiring 21a in one direction and the straight line wiring 21c in the other direction may be bilaterally symmetric with respect to the bilaterally symmetric pixel array pattern).

Figure 5:
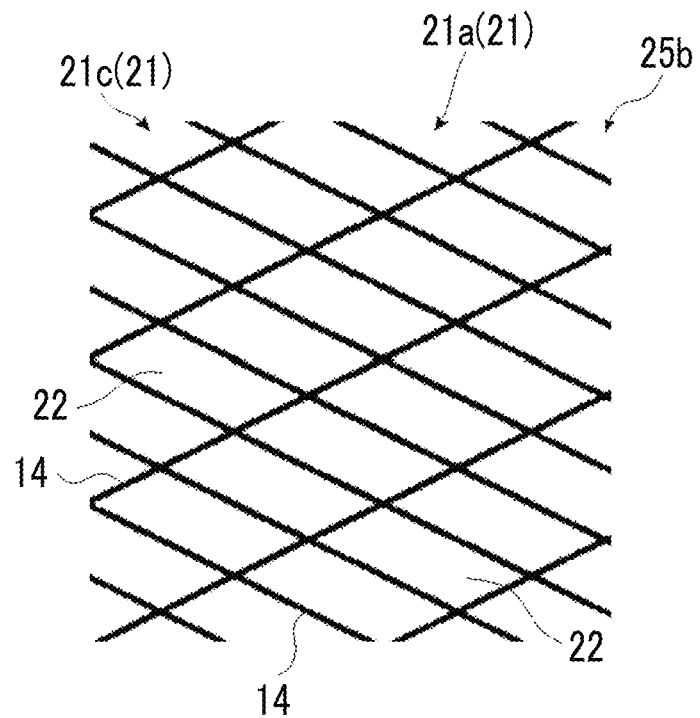
FIG. 5 is a plan view schematically showing another example of a wiring pattern of a wiring portion of the conductive film shown in FIG. 1.
Figure 6:
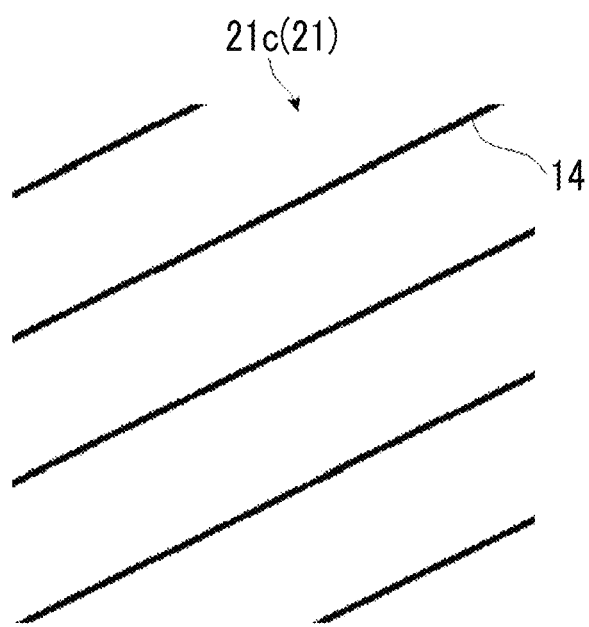
FIG. 6 is a plan view schematically showing an equal pitch wiring pattern in a straight line wiring of the wiring pattern in another direction shown in FIG. 5.

The separate-direction non-equal pitch wiring pattern 25b shown in FIG. 5 is a mesh-shaped wiring pattern in which the straight line wiring 21a and the straight line wiring 21c are overlapped and arranged in a mesh shape. In the straight line wiring 21a, the pitches of the plurality of thin metal wires 14 inclined by 26° with respect to the horizontal line and arranged in parallel in one direction shown in FIG. 3 are equal pitches. In the straight line wiring 21c, the pitches of the plurality of thin metal wires 14 inclined with respect to the horizontal line by 26° and arranged in parallel with each other in one different direction shown in FIG. 6 are equal pitches, and are different from the pitches of the thin metal wires 14 of the straight line wiring 21a.

Therefore, similarly to the wiring pattern 25a, it can be said that the wiring pattern 25b is also a separate-direction non-equal pitch wiring pattern in which the pitches of the thin metal wires 14 of the straight line wiring 21a and 21c are different, and is therefore a wiring pattern in which the plurality of opening portions 22 which have parallelogram shapes having predetermined angles (52° and 128°) kept therebetween in plan view and having the same shape and size, are successively connected in two directions forming the predetermined angle (26°).

Although details will be described later, the conductive film 10 of the embodiment of the present invention includes a separate-direction non-equal pitch wiring pattern in which straight line wirings 21 each being composed of a plurality of thin metal wires 14 arranged in parallel in one direction are overlapped in two or more directions, and a non-equal pitch wiring pattern, in which the average pitch of the straight line wiring 21 in at least one direction is different from the average pitch of the straight line wiring 21 in at least one different direction. The conductive film 10 has a wiring pattern which is optimized in terms of moiré visibility with respect to the pixel array pattern having a predetermined luminance of the display unit. In the embodiment of the present invention, the wiring pattern optimized in terms of moiré visibility with respect to the pixel array pattern having the predetermined luminance means a wiring pattern in which moiré is not perceived by human vision with respect to a pixel array pattern having a predetermined luminance.

Therefore, the wiring pattern 24 (24a, 24b) has a separate-direction non-equal pitch wiring pattern, and is a wiring pattern which is optimized in terms of moiré visibility with respect to the pixel array pattern of the predetermined luminance of the display unit and in which the moiré evaluation value calculated from the combined image data of the combined wiring pattern 24 is less than a moiré evaluation value of the omnidirectional-equal pitch wiring pattern in which the directions of the respective straight line wirings 21 are the same and the wiring density per unit area is the same in all directions and at equal pitches. In the combined wiring pattern 24, (the transmittance image data pieces of) the wiring patterns 24a and 24b are overlapped and the luminance data of the pixel array pattern of each color in a case where light of each of a plurality of colors of the display is turned on.

That is, the wiring pattern 24 is overlapped on the display screen of the display having a predetermined light emission intensity. Thereby, it is possible to sufficiently restrain occurrence of moiré and to improve visibility. In addition, the wiring pattern 24 is a wiring pattern including a separate-direction non-equal pitch wiring pattern optimized in terms of moiré visibility with respect to the pixel array pattern having a predetermined luminance of the display unit.

According to the embodiment of the present invention, as described above, it is possible to generate a wiring pattern which is excellent in visibility of moiré by using a wiring pattern in which straight line wirings are overlapped in two or more directions, a separate-direction non-equal pitch wiring pattern in which the average pitch of the straight line wiring in at least one direction is different from the average pitch of the straight line wiring in at least one different direction, and a separate-direction non-equal pitch wiring pattern which is optimized in terms of moiré visibility with respect to the pixel array pattern having the predetermined luminance of the display unit.

In addition, in the wiring pattern 24 including such an optimized separate-direction non-equal pitch wiring pattern, disconnection (break) may be included in the side (straight line wiring 21) of the thin metal wires 14 forming the opening portion 22. The thin metal wires 14 may be cut in the middle due to disconnection (break) in order to form electrical insulation like a dummy electrode portion or an in-electrode dummy pattern portion described later. As the shape of the mesh-shaped wiring pattern having such a break (disconnection portion), it is possible to apply the shape of the mesh-shaped wiring pattern of the conductive film described in JP6001089B or WO 2013/094729A relating to the application filed by the present applicant.

In the conductive film 10 of the embodiment shown in FIG. 1, in FIG. 1, a plurality of thin metal wires 14 of the first wiring portion 16a on the upper side (viewing side) of the transparent substrate 12 and a plurality of thin metal wires 14 of the second wiring portion 16b on the lower side (display side) respectively have a wiring pattern including the separate-direction non-equal pitch wiring pattern 25a shown in FIG. 2 or a wiring pattern including the separate-direction non-equal pitch wiring pattern 25b shown in FIG. 5 as wiring patterns 24a and 24b, thereby forming a combined wiring pattern 24 by overlapping wiring patterns 24a and 24b including the separate-direction non-equal pitch wiring pattern 25a or 25b on the upper side and the lower side. In the conductive film 10 of the embodiment shown in FIG. 1, together with the wiring patterns 24a and 24b, the combined wiring pattern 24 is a wiring pattern including a separate-direction non-equal pitch wiring pattern. The wiring patterns 24a and 24b are wiring patterns including separate-direction non-equal pitch wiring patterns optimized in terms of moiré visibility with respect to the pixel array pattern of the predetermined luminance of the display unit, and the combined wiring pattern 24 is also a wiring pattern including a separate-direction non-equal pitch wiring pattern optimized in terms of moiré visibility.

That is, in the example shown in FIG. 1, both the first wiring portion 16a and the second wiring portion 16b each are composed of a plurality of thin metal wires having a wiring pattern including a separate-direction non-equal pitch wiring pattern optimized in terms of moiré visibility as shown in FIG. 2 or FIG. 5 (as a result, a combined wiring pattern formed by overlapping the wiring patterns of the thin metal wires of the first wiring portion 16a and the second wiring portion 16b includes a separate-direction non-equal pitch wiring pattern optimized in terms of moiré visibility). However, the present invention is not limited to this, and at least a part of one of the wiring portions 16 may have a plurality of thin metal wires having the wiring pattern including the separate-direction non-equal pitch wiring pattern 25a or 25b shown in FIG. 2 or 5. Alternatively, a plurality of the thin metal wires of the first wiring portion 16a and the second wiring portion 16b may be configured such that both the wiring pattern 24a of the first wiring portion 16a and the wiring pattern 24b of the second wiring portion 16b do not include the separate-direction non-equal pitch wiring pattern optimized in terms of moiré visibility as shown in FIG. 2 or FIG. 5 and the combined wiring pattern 24 includes a separate-direction non-equal pitch wiring pattern optimized in terms of moiré visibility as shown in FIG. 2 or FIG. 5. Further, one of the wiring pattern 24a of the first wiring portion 16a and the wiring pattern 24b of the second wiring portion 16b may be a wiring pattern including the separate-direction non-equal pitch wiring pattern 25a shown in FIG. 2 (or the separate-direction non-equal pitch wiring pattern 25b shown in FIG. 5), and the other may be a wiring pattern including the separate-direction non-equal pitch wiring pattern 25b shown in FIG. 5 (or the separate-direction non-equal pitch wiring pattern 25a shown in FIG. 2). In such a manner, a separate-direction non-equal pitch wiring pattern may be configured, in which the straight line wiring 21a, the straight line wiring 21b, and the straight line wiring 21c are overlapped as a combined wiring pattern 24 by overlapping the wiring pattern 24a of the first wiring portion 16a and the wiring pattern 24b of the second wiring portion 16b.

In such a manner, all or a part of the thin metal wires of the wiring portion 16 (wiring portion 16a or 16b) on the upper side or the lower side of the conductive film are formed in the wiring pattern including the separate-direction non-equal pitch wiring pattern 25a or 25b, and/or a plurality of thin metal wires of both wiring portions 16 are formed such that the combined wiring pattern 24 formed by overlapping the wiring patterns of both wiring portions 16 includes separate-direction non-equal pitch wiring patterns such as the wiring pattern 25a or 25b. Thereby, it is possible to improve moiré visibility due to interference with the display such that the combined wiring pattern 24 formed by overlapping the wiring patterns of the both wiring portions 16 includes a separate-direction non-equal pitch wiring pattern optimized in terms of moiré visibility.

Further, the first and second wiring portions 16a and 16b may be composed of pluralities of thin metal wires having different wiring patterns 24. For example, the first wiring portion 16a on the upper side of the transparent substrate 12 may be composed of a plurality of thin metal wires 14 having the wiring pattern including the separate-direction non-equal pitch wiring pattern 25a or 25b (hereinafter represented by separate-direction non-equal pitch wiring pattern 25a shown in FIG. 2) shown in FIG. 2 or 5 (hereinafter represented by FIG. 2). The second wiring portion 16b on the lower side of the transparent substrate 12 may be composed of a plurality of thin metal wires 14 having an equal pitch wiring pattern 25c shown in FIG. 12 to be described later. Alternatively, conversely, the first wiring portion 16a may be composed of a plurality of thin metal wires 14 having the equal pitch wiring pattern 25c shown in FIG. 12, and the second wiring portion 16b may be composed of a plurality of thin metal wires 14 having a wiring pattern including a separate-direction non-equal pitch wiring pattern 25a. Such a combined wiring pattern 24 formed by overlapping the wiring pattern including the separate-direction non-equal pitch wiring pattern 25a and the equal pitch wiring pattern 25c also includes the separate-direction non-equal pitch wiring pattern optimized in terms of visibility of moiré. Therefore, it is possible to improve moiré visibility due to the interference with the display by using this combined wiring pattern 24.

Figure 7:
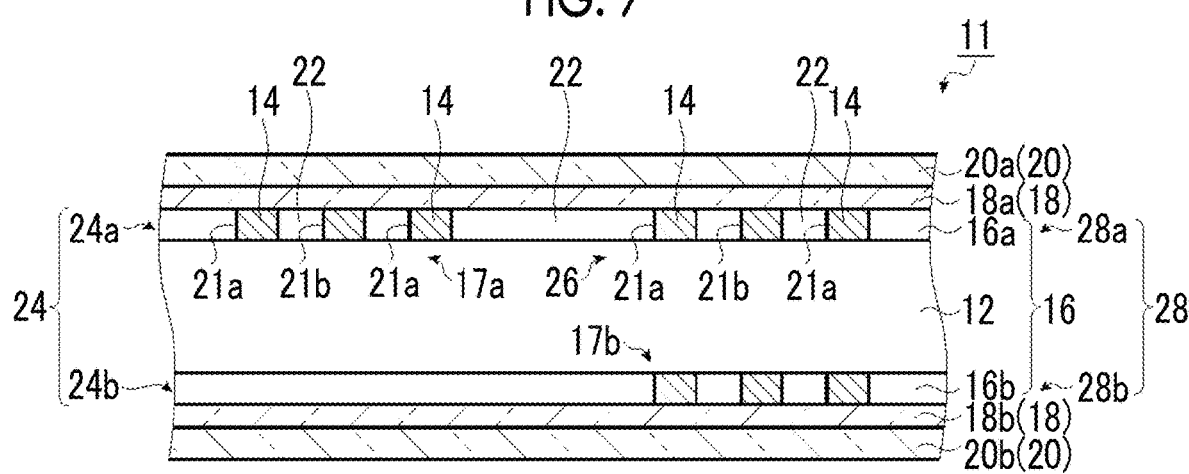
FIG. 7 is a schematic partial cross-sectional view of an example of a conductive film according to a second embodiment of the present invention.

Further, as described above, the plurality of thin metal wires 14 of at least one of the first and second wiring portions 16a and 16b may be disconnected (broken) to be divided into the electrode portion 17a forming the wiring layer 28 and the dummy electrode portion (non-electrode portion) 26 as shown in FIG. 7. In addition, the thin metal wires 14 of the other wiring portion may be configured as the electrode portion 17b. In addition, as described above, any one of the electrode portion 17a, the electrode portion 17b, and the dummy electrode portion 26 is composed of a plurality of thin metal wires 14 having the wiring pattern 25a including the separate-direction non-equal pitch wiring pattern shown in FIG. 2, and the others of the electrode portion 17a, the electrode portion 17b, and the dummy electrode portion 26 each are composed of the plurality of thin metal wires 14 having the equal pitch wiring pattern 25c shown in FIG. 12 to be described later. The conductive film 11 of the second embodiment having the above configuration may be used. Thus, moiré visibility due to the interference with the display is improved only by the wiring pattern including the separate-direction non-equal pitch wiring pattern 25a, and the moiré visibility due to the interference with the display may be improved by the combined wiring pattern 24 having non-equal pitches in the respective directions by overlapping the wiring pattern including the separate-direction non-equal pitch wiring pattern 25a and the equal pitch wiring pattern 25c.

The structure of the conductive film 11 according to the second embodiment of the present invention shown in FIG. 7 will be described later.

As described above, the first protective layer 20a is adhered to the substantially entire surface of the wiring layer 28a being composed of the first wiring portion 16a through the first adhesive layer 18a so as to cover the thin metal wires 14 of the first wiring portion 16a. Further, the second protective layer 20b is adhered to the substantially entire surface of the wiring layer 28b being composed of the second wiring portion 16b through the second adhesive layer 18b so as to cover the thin metal wires 14 of the second wiring portion 16b.

In the above-described example, the first protective layer 20a is adhered to the wiring layer 28a by the first adhesive layer 18a, and the second protective layer 20b is adhered to the substantially entire surface of the wiring layer 28b by the second adhesive layer 18b. However, the present invention is not limited to this, and the protective layer does not necessarily need to be adhered to each other as long as the protective layer is able to cover and protect the thin metal wires of the wiring portion of the wiring layer, and the adhesive layer may be omitted. Further, the first protective layer 20a and/or the second protective layer 20b may be omitted.

Here, examples of materials of the adhesive layers 18 (the first adhesive layer 18a and the second adhesive layer 18b) include a wet lamination adhesive, a dry lamination adhesive, a hot melt adhesive, and the like. The material of the first adhesive layer 18a and the material of the second adhesive layer 18b may be the same or different.

Further, the protective layers 20 (the first protective layer 20a and the second protective layer 20b) each are composed of a high light transmitting material including resin, glass, and silicon, similarly to the transparent substrate 12. The material of the first protective layer 20a and the material of the second protective layer 20b may be the same or may be different.

It is preferable that both a refractive index n1 of the first protective layer 20a and a refractive index n2 of the second protective layer 20b are values equal or approximate to a refractive index n0 of the transparent substrate 12. In this case, both the relative refractive index nr1 of the transparent substrate 12 with respect to the first protective layer 20a and the relative refractive index nr2 of the transparent substrate 12 with respect to the second protective layer 20b are values approximate to 1.

In this specification, the refractive index means a refractive index for the light at a wavelength of 589.3 nm (sodium D ray). For example, in regard to resins, the refractive index is defined by ISO 14782: 1999 (corresponding to JIS K 7105) that is an international standard. Further, the relative refractive index nr1 of the transparent substrate 12 with respect to the first protective layer 20a is defined as $nr1=(n1/n0)$, and the relative refractive index nr2 of the transparent substrate 12 with respect to the second protective layer 20b is defined as $nr2=(n2/n0)$.

Here, the relative refractive index nr1 and the relative refractive index nr2 are preferably in a range equal to or greater than 0.86 and equal to or less than 1.15, and more preferably in a range equal to or greater than 0.91 and equal to or less than 1.08.

By limiting the ranges of the relative refractive index nr1 and the relative refractive index nr2 as the above-mentioned range and controlling a member-to-member light transmittance between the transparent substrate 12 and the protective layers 20 (20a, 20b), visibility of moiré can be further improved, and thus the conductive film can be improved.

In the conductive film 10 of the embodiment shown in FIG. 1, the wiring portions 16 (16a and 16b) on both the upper side and the lower side of the transparent substrate 12 each are formed as an electrode portion having the plurality of thin metal wires 14. However, the present invention is not limited to this, and at least one of the first or second wiring portion 16a or 16b may be composed of an electrode portion and a non-electrode portion (dummy electrode portion).

FIG. 7 is a schematic partial cross-sectional view of an example of a conductive film according to a second embodiment of the present invention. The plan view of the wiring patterns of the conductive film according to the second embodiment of the present invention shown in FIG. 7 is the same as the plan view of the wiring pattern shown in FIG. 2, 5, or 40 to be described later, and accordingly, will be omitted herein.

As shown in FIG. 7, the conductive film 11 according to the second embodiment of the present invention has: the first wiring portion 16a that is composed of a first electrode portion 17a and the dummy electrode portion 26 which are formed on one surface (on the upper side in FIG. 7) of the transparent substrate 12; the second wiring portion 16b that is composed of the second electrode portion 17b which is formed on the other surface (on the lower side in FIG. 7) of the transparent substrate 12; the first protective layer 20a that is adhered to the substantially entire surface of the first wiring portion 16a, which is composed of the first electrode portion 17a and the dummy electrode portion 26, through the first adhesive layer 18a; and the second protective layer 20b that is adhered to the substantially entire surface of the second wiring portion 16b, which is composed of the second electrode portion 17b, through the second adhesive layer 18b.

In the conductive film 11, the first electrode portion 17a and the dummy electrode portion 26 each are composed of the plurality of thin metal wires 14 and both thereof are formed as the wiring layer 28a on one surface (on the upper side in FIG. 7) of the transparent substrate 12, and the second electrode portion 17b is composed of the plurality of thin metal wires 14 and is formed as the wiring layer 28b on the other surface (on the lower side in FIG. 7) of the transparent substrate 12. Here, the dummy electrode portion 26 is formed on one surface (on the upper side in FIG. 7) of the transparent substrate 12 similarly to the first electrode portion 17a, and is composed of the plurality of thin metal wires 14 similarly arranged at positions corresponding to the plurality of thin metal wires 14 of the second electrode portion 17b formed on the other surface (on the lower side in FIG. 7), as shown in the drawing.

The dummy electrode portion 26 is disposed to be spaced from the first electrode portion 17a by a predetermined interval, and is in the state of being electrically insulated from the first electrode portion 17a.

In the conductive film 11 according to the present embodiment, the dummy electrode portion 26 being composed of the plurality of thin metal wires 14 corresponding to the plurality of thin metal wires 14 of the second electrode portion 17b formed on the other surface (on the lower side in FIG. 7) of the transparent substrate 12 is formed on one surface (on the upper side in FIG. 7) of the transparent substrate 12. Therefore, scattering due to the thin metal wires on the one surface (on the upper side in FIG. 7) of the transparent substrate 12 can be controlled, and it is thus possible to improve visibility of electrode.

Here, the first electrode portion 17a and the dummy electrode portion 26 of the wiring layer 28a have the wiring pattern 24a having a mesh shape which is formed by the thin metal wires 14 and opening portions 22. The second electrode portion 17b of the wiring layer 28b has a wiring pattern 24b having a mesh shape which is formed by the thin metal wires 14 and opening portions 22, similarly to the first electrode portion 17a. As described above, the transparent substrate 12 is composed of an insulating material, and the second electrode portion 17b is in the state of being electrically insulated from the first electrode portion 17a and the dummy electrode portion 26.

In addition, the first and second electrode portions 17a and 17b and the dummy electrode portion 26 each can be composed of the same material as the wiring portions 16 of the conductive film 10 shown in FIG. 1 in the same manner.

The first protective layer 20a is adhered to the substantially entire surface of the wiring layer 28a being composed of the first electrode portion 17a and the dummy electrode portion 26 through the first adhesive layer 18a so as to cover the thin metal wires 14 of the first electrode portion 17a and the dummy electrode portion 26 of the first wiring portion 16a.

Further, the second protective layer 20b is adhered to the substantially entire surface of the wiring layer 28b being composed of the second electrode portion 17b through the second adhesive layer 18b so as to cover the thin metal wires 14 of the second electrode portion 17b of the second wiring portion 16b.

It should be noted that the first and second adhesive layers 18a and 18b and the first and second protective layers 20a and 20b of the conductive film 11 shown in FIG. 7 are those of the conductive film 10 shown in FIG. 1, and description thereof will be omitted. As described above, the first protective layer 20a, the second protective layer 20b, the first adhesive layer 18a, and the second adhesive layer 18b may be omitted.

In the conductive film 11 of the present embodiment, the second wiring portion 16b having the second electrode portion 17b does not have the dummy electrode portion. However, the present invention is not limited to this, and in the second wiring portion 16b, the dummy electrode portion, which is electrically insulated from the second electrode portion 17b to be spaced by a predetermined interval from the first electrode portion 17a and is composed of the thin metal wires 14, may be disposed at a position corresponding to the first electrode portion 17a of the first wiring portion 16a.

In the conductive film 11 of the present embodiment, the dummy electrode portion is provided on the first wiring portion 16a, and such a dummy electrode portion is provided on the second wiring portion 16b. Thereby, the dummy electrode portions may be disposed to correspond to respective mesh wirings of the first electrode portion 17a of the first wiring portion 16a and the second electrode portion 17b of the second wiring portion 16b. Therefore, scattering due to the thin metal wires on the one surface (on the upper side or the lower side in FIG. 7) of the transparent substrate 12 can be controlled, and it is thus possible to improve visibility of electrode. It should be noted that the dummy electrode portion described herein corresponds to the non-conductive pattern described in WO2013/094729A.

In the conductive films 10 and 11 of the first and second embodiments shown in FIGS. 1 and 7, the wiring portions 16 (16a and 16b) are respectively formed on both the upper side and the lower side of the transparent substrate 12. However, the present invention is not limited to this, and in a manner similar to that of a conductive film 11A of a third embodiment of the present invention shown in FIG. 8A, the following structure may be adopted: the wiring portion 16 being composed of the plurality of thin metal wires 14 may be formed on one surface (the upper surface in FIG. 8A) of the transparent substrate 12, and two conductive film elements, in which the protective layers 20 are adhered to substantially the entire surfaces of the wiring portions 16 through the adhesive layers 18 so as to cover the thin metal wires 14, overlap with each other.

Figure 8A:
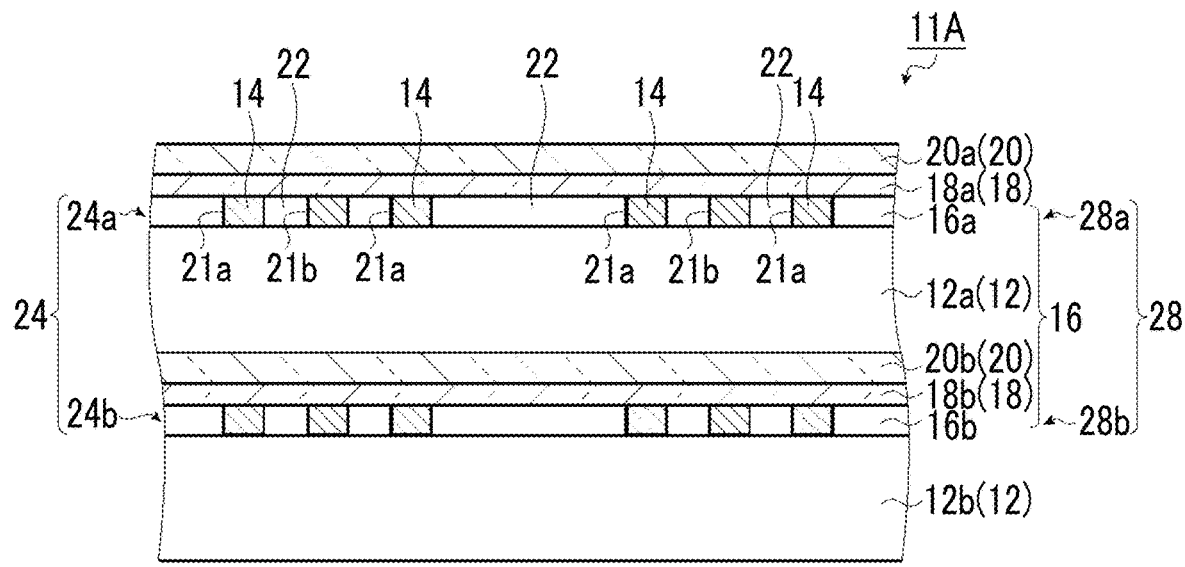
FIG. 8A is a schematic partial cross-sectional view of an example of a conductive film according to a third embodiment of the present invention.

The conductive film 11A of the third embodiment of the present invention shown in FIG. 8A has: a lower transparent substrate 12b in FIG. 8A; the second wiring portion 16b that is composed of the plurality of thin metal wires 14 formed on the upper surface of the transparent substrate 12b; the second protective layer 20b that is adhered onto the second wiring portion 16b through the second adhesive layer 18b; an upper transparent substrate 12a that is adhered onto and disposed on the second protective layer 20b through for example an adhesive or the like; the first wiring portion 16a that is composed of the plurality of thin metal wires 14 formed on the upper surface of the transparent substrate 12a; and the first protective layer 20a that is adhered onto the first wiring portion 16a through the first adhesive layer 18a.

Here, All or a part of at least one of the thin metal wires 14 of the first wiring portion 16a and/or the second wiring portion 16b is a wiring pattern including the separate-direction non-equal pitch wiring pattern shown in FIG. 2. In addition or alternatively, the combined wiring pattern obtained by overlapping the wiring pattern of the first wiring portion 16a and the wiring pattern of the second wiring portion 16b is a wiring pattern including the separate-direction non-equal pitch wiring pattern shown in FIG. 2.

In the conductive films 10 and 11 of the first and second embodiments shown in FIGS. 1 and 7, the wiring portions 16 (16a and 16b) are respectively formed on both the upper side and the lower side of the transparent substrate 12. However, the present invention is not limited to this, and in a manner similar to that of a conductive film 11B of a fourth embodiment of the present invention shown in FIG. 8B, the following structure may be adopted: the wiring portion 16 being composed of the plurality of thin metal wires 14 may be formed on one surface (the upper surface in FIG. 8B) of the transparent substrate 12, and only one conductive film element, in which the protective layers 20 are adhered to substantially the entire surfaces of the wiring portions 16 through the adhesive layers 18 so as to cover the thin metal wires 14, is provided.

Figure 8B:
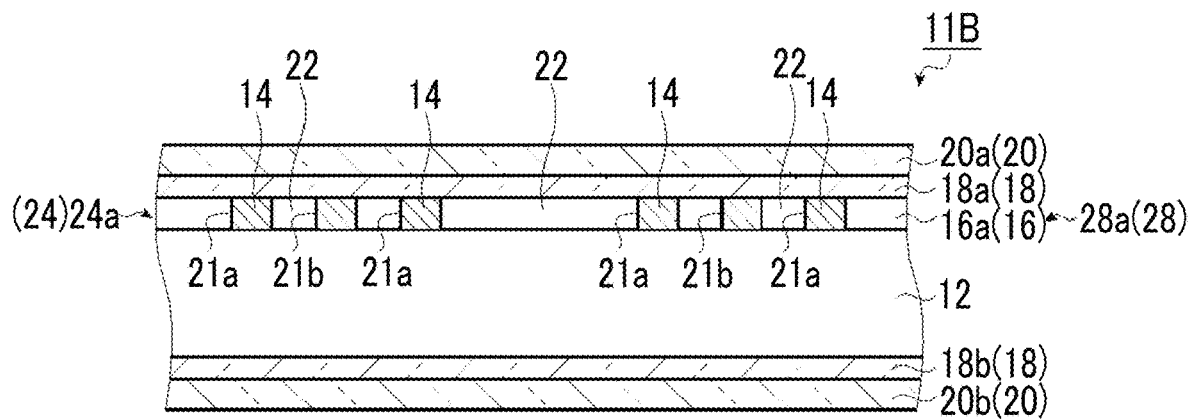
FIG. 8B is a schematic partial cross-sectional view of an example of a conductive film according to a fourth embodiment of the present invention.

The conductive film 11B of the fourth embodiment of the present invention shown in FIG. 8B includes a transparent substrate 12, a first wiring portion 16a being composed of a plurality of thin metal wires 14 formed on the upper surface of the transparent substrate 12, a first protective layer 20a adhered onto the first wiring portion 16a through a first adhesive layer 18a, and a second protective layer 20b adhered to the substantially entire lower surface of the transparent substrate 12 through a second adhesive layer 18b. At this time, the adhesive layer 18 and the protective layer 20 on the lower surface of the transparent substrate 12 may be omitted.

Here, all or a part of the thin metal wires 14 of the wiring portion 16a have a wiring pattern including the separate-direction non-equal pitch wiring pattern shown in FIG. 2.

The conductive films 10, 11, 11A, and 11B of the first, second, third, and fourth embodiments of the present invention described above each are, for example, a conductive film in which a wiring pattern optimized in terms of moiré visibility with respect to the pixel array (BM) pattern of the display is included in a wiring pattern of thin metal wires of all or a part of a wiring portion on the upper side or the lower side of the conductive film applied to a touch panel (44: refer to FIG. 10) of a display unit 30 (display) schematically shown in FIG. 9 and/or a combined wiring pattern formed by overlapping wiring patterns of both wiring portions.

The optimization of moiré visibility of the wiring pattern with respect to the pixel array pattern of the display, which is essential in the embodiment of the present invention, will be described later.

The conductive film according to the embodiment of the present invention basically has the above-mentioned configuration.

FIG. 9 is a schematic explanatory diagram schematically showing an example of a pixel array pattern of a part of the display unit using the conductive film of the embodiment of the present invention.

As the part thereof is shown in FIG. 9, the display unit 30 has a plurality of pixels 32 arranged in a matrix shape to constitute a predetermined pixel array pattern. Each pixel 32 has a configuration in which three sub-pixels (a red sub-pixel 32r, a green sub-pixel 32g, and a blue sub-pixel 32b) are arranged in a horizontal direction. Each sub-pixel has a quadrilateral shape which is long in the vertical direction. The arrangement pitch (horizontal pixel pitch Ph) of the pixels 32 in the horizontal direction and the arrangement pitch (vertical pixel pitch Pv) of the pixels 32 in the vertical direction are approximately equal to each other. That is, a shape (refer to a region 36 indicated by hatching), which is composed of a single pixel 32 and a black matrix (BM) 34 (pattern material) surrounding the single pixel 32, is a square shape. Further, in the example shown in FIG. 9, an aspect ratio of the single pixel 32 is not 1, and satisfies the following expression: a length thereof in the horizontal (transverse) direction>a length thereof in the vertical (longitudinal) direction.

As clearly seen from FIG. 9, a pixel array pattern formed by sub-pixels 32r, 32g, and 32b of a plurality of pixels 32 is defined by a BM pattern 38 of the BMs 34 each of which surrounds the sub-pixels 32r, 32g, and 32b. Moiré, which occurs in a case where the display unit 30 and the conductive film 10, 11, 11A, or 11B are overlapped, is caused by interference between the pixel array pattern of each of the sub-pixels 32r, 32g, and 32b, which is defined by the BM pattern 38 of the BMs 34 of the display unit 30, and the wiring pattern 24 of the conductive film 10, 11, 11A, or 11B.

For example, in a case where the conductive film 10, 11, 11A, or 11B is disposed on the display panel of the display unit 30 having the pixel array pattern of each of the sub-pixels 32r, 32g, and 32b described above, the wiring pattern 24 of the conductive film 10, 11, 11A, or 11B (combined wiring pattern 24 of the wiring patterns 24a and 24b) includes at least one of the wiring pattern 24a or 24b, and/or the combined wiring pattern 24 includes a separate-direction non-equal pitch wiring pattern, and is optimized in terms of moiré visibility with respect to the pixel array pattern of each of the sub-pixels 32r, 32g, and 32b. Therefore, there is no interference of the spatial frequency between the pixel array pattern of each of the sub-pixels 32r, 32g, and 32b, and the wiring pattern of the thin metal wires 14 of the conductive films 10, 11, 11A, or 11B, and the occurrence of moiré is restrained. As a result, visibility of the moiré is excellent. Hereinafter, the conductive film 10 will be described as a representative example, but the description is the same as those of the conductive film 11, 11A, and 11B.

It should be noted that the display unit 30 shown in FIG. 9 may be formed as a display panel such as a liquid crystal panel, a plasma panel, an organic EL panel, or an inorganic EL panel, and a light emission intensity thereof may be different in accordance with a resolution.

The pixel array pattern and the light emission intensity of the display, which can be applied to the embodiment of the present invention, is not particularly limited, and may be the same as the pixel array pattern and the light emission intensity of a known display. For example, a display such as OLED having different periods and/or intensities of the respective colors of RGB may be used. A display, which is composed of RGB sub-pixels having the same shapes as shown in FIG. 9 and in which an intensity variation of the sub-pixels is large, or a display, in which an intensity variation of the sub-pixels is small and only a G sub-pixel (channel) having a highest intensity is considered, may be used. In particular, a display such as a smartphone or a tablet having a high intensity may be used. As a pixel pattern of OELD, for example, there is a pen-tile array disclosed in JP2018-198198A. The display of the display device into the conductive film of the embodiment of the present invention is incorporated may be a pen-tile array OELD.

Figure 10:
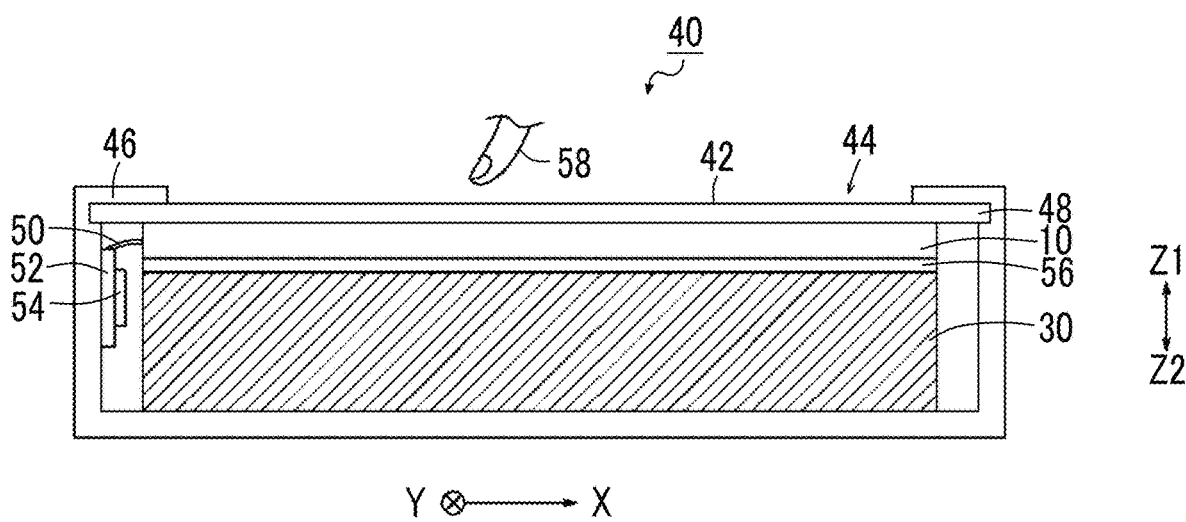
FIG. 10 is a schematic cross-sectional view of one example of a display device provided with the conductive film shown in FIG. 1.

Next, a display device, in which the conductive film according to the embodiment of the present invention is incorporated, will be described in FIG. 10. In FIG. 10, a projected electrostatic capacitive type touch panel, in which the conductive film 10 according to the first embodiment of the present invention is incorporated, will be described as a representative example of a display device 40, but it is needless to say that the present invention is not limited to this example.

As shown in FIG. 10, the display device 40 includes the display unit 30 (refer to FIG. 9) that can display a color image and/or a monochrome image, a touch panel 44 that detects a contact position on an input side 42 (located on the side as directed by the arrow Z1), and a housing 46 in which the display unit 30 and the touch panel 44 are housed. A user is able to access the touch panel 44 through a large opening portion provided in one surface (on the side as directed by the arrow Z1) of the housing 46.

The touch panel 44 includes not only the conductive film 10 (refer to FIGS. 1 and 2) described above but also a cover member 48 stacked on one surface (on the side as directed by the arrow Z1) of the conductive film 10, a flexible substrate 52 electrically connected to the conductive film 10 through a cable 50, and a detection control unit 54 disposed on the flexible substrate 52.

The conductive film 10 is adhered to one surface (on the side as directed by the arrow Z1) of the display unit 30 through an adhesive layer 56. The conductive film 10 is disposed on the display screen such that the other main surface side (second wiring portion 16b side) is opposite to the display unit 30.

The cover member 48 functions as the input side 42 by covering one surface of the conductive film 10. In addition, by preventing a contact body 58 (for example, a finger or a stylus pen) from coming into direct contact with the conductive film 10, it is possible to restrain the occurrence of a scratch, adhesion of dust, and/or the like, and thus it is possible to stabilize conductivity of the conductive film 10.

The material of the cover member 48 may be, for example, glass, a tempered glass, or a resin film. One surface (on the side as directed by the arrow Z2) of the cover member 48 may be coated with silicon oxide or the like, and may be adhered to one surface (on the side as directed by the arrow Z1) of the conductive film 10. Further, in order to prevent damage due to rubbing or the like, the conductive film 10 and the cover member 48 may be configured to be adhered to each other.

The flexible substrate 52 is an electronic substrate having flexibility. In the example shown in this diagram, the flexible substrate 52 is fixed to an inner side wall of the housing 46, while the position of the substrate may be varied. The detection control unit 54 constitutes an electronic circuit that catches a change in capacitance between the contact body 58 and the conductive film 10 and detects the contact position (or the approach position) in a case where the contact body 58 as a conductor is brought into contact with (or comes closer to) the input side 42.

The display device, to which the conductive film according to the embodiment of the present invention is applied, basically has the above-mentioned configuration.

Next, the present invention will give description about the following. In the wiring pattern in which the straight line wirings in two or more directions are overlapped, a separate-direction non-equal pitch wiring pattern, in which the average pitch of the straight line wiring in at least one direction is different from the average pitch of the straight line wiring in at least one different direction, is formed to be a wiring pattern having less moiré than an omnidirectional-equal pitch wiring pattern, on the basis of the frequency information of the pixel array pattern.

First, the principle of moiré occurrence in a case where the pixel array pattern and the wiring pattern are overlapped will be described.

Next, on the basis of the principle, description will be given of the reason why the moiré can be reduced as compared with the equal pitch in all directions by "changing the average pitch of the straight line wiring in at least one direction with the average pitch in the straight line wiring in at least one different direction" in the embodiment of the present invention.

(Principle of Moiré in Case where Pixel Array Pattern and Wiring Pattern are Overlapped)

The following is considered 1-dimensionally for convenience of description.

First, the light emission luminance pattern of the pixel array is set to bm(x). Here, bm(x) represents a luminance at a position x. The Fourier series expansion of bm(x) can be expressed as Expression (3). Here, the symbol "*" represents multiplication. Further, bm(x) is a periodic function having a period of $2*Lb$, and $\omega 1, \omega 2, \omega 3, \ldots$ represent $\pi/Lb$, $2*\pi/Lb$, $3*\pi/Lb$, ... respectively.

$$bm(x)=A0+(a1*\cos(\omega 1*x)+b1*\sin(\omega 1*x)+a2*\cos(\omega 2*x)+b2*\sin(\omega 2*x)\ldots) \quad (3)$$

From Euler's formula, $\cos(\omega n*x)$ and $\sin(\omega n*x)$ can be represented by complex numbers as follows, respectively. Here, i represents an imaginary unit.

$$\cos(\omega n*x)=(\exp(i*\omega n*x)+\exp(-i*\omega n*x))/2$$

$$\sin(\omega n*x)=(\exp(i*\omega n*x)-\exp(-i*\omega n*x))/(2*i)$$

Therefore, from Expression (3), Expression (4) is obtained.

$$bm(x)=A0+(((a1-i*b1)/2)*\exp(i*\omega 1*x)+((a1+i*b1)/2)*\exp(-i*\omega 1*x)) \quad (4)$$

Thus, Expression (4) can be expressed by a complex number as Expression (5).

$$bm(x)=A0+\Sigma(An*\exp(i*\omega n*x)+Bn*\exp(-i*\omega ex)) \quad (5)$$

Here, An and Bn are complex numbers and have a conjugate relation as follows.

$$An=(an-i*bn)/2$$

$$Bn=(an+i*bn)/2$$

Similarly, in a case where the transmittance pattern of the wiring is mesh(x) and mesh(x) is expressed by a Fourier series of complex numbers, mesh(x) can be represented by Expression (6).

$$\text{mesh}(x)=C0+\Sigma(Cm*\exp(i*\beta m*x)+Dm*\exp(-i*\beta m*x)) \quad (6)$$

Here, assuming that mesh(x) is a periodic function having a period of $2*Lm$, $\beta(m)$ represents $m*\pi/Lm$. Further, Cm and Dm are complex numbers and have a conjugate relation as follows.

$$Cm=(cm-i*dm)/2$$

$$Dm=(cm+i*dm)/2$$

The pattern in which the pixel array pattern and the wiring pattern are overlapped is a product of the above-described light emission luminance pattern (5) of the pixel array and the transmittance pattern (6) of the wiring. Therefore, the product can be expressed as follows.

$$bm(x)*\text{mesh}(x)=A0*C0+C0*(\Sigma(An*\exp(i*\omega n*x)+Bn*\exp(-i*\omega n*x)))+A0*(\Sigma(Cm*\exp(i*\beta m*x)+Dm*\exp(-i*\beta m*x)))+\Sigma\Sigma(An*\exp(i*\omega n*x)+Bn*\exp(-i*\omega n*x))*(Cm*\exp(i*\beta m*x)+Dm*\exp(-i*\beta m*x)) \quad (7)$$

In Expression (7), A0*C0 in the first row indicates the average luminance of the overlapped pattern, the second row indicates each frequency component of the luminance pattern of the pixel array multiplied by the average transmittance C0 of the wiring pattern, and the third row Indicates each frequency component of the wiring pattern multiplied by the average luminance A0 of the pixel array pattern.

The moiré of the overlapped pattern is given by the expression on the fourth row. In a case where the expression on the fourth row is expanded for one combination of n and m, the expression be represented by Expression (8).

$$(An^*\exp(i^*\omega m^*x)+Bn^*\exp(-i^*\omega m^*x))^*(Cm^*\exp(i^*\beta m^*x)+Dm^*\exp(-i^*\beta m^*x))=An^*Cm^*\exp(i^*(\omega n^*x+\beta m^*x))+Bn^*Dm^*\exp(-i^*(\omega n^*x+\beta m^*x))+An^*Dm^*\exp(i^*(\omega n^*x-\beta m^*x))+Bn^*Cm^*\exp(-i^*(\omega n^*x-\beta m^*x)) \quad (8)$$

Here, considering that An and Bn have a conjugate relation and Cm and Dm also have a conjugate relation, it can be seen that An*Cm and Bn*Dm, and An*Dm and Bn*Cm in the above expression have conjugate relations.

In addition, it can be seen that An*Cm*exp(i*(ωn*x+βm*x)) and Bn*Dm*exp(-i*(ωn*x+βm*x)), and An*Dm*exp(i*(ωn*x-βm*x)) and Bn*Cm*exp(-i*(ωn*x-βm*x)) in the above expression also have conjugate relations.

Here, An*Cm and Bn*Dm can be expressed as follows.

$$An^*Cm=\text{ABS}(An^*Cm)^*\exp(i^*\theta 1)$$

$$Bn^*Dm=\text{ABS}(An^*Cm)^*\exp(-i^*\theta 1)$$

Then, An*Cm*exp(i*(ωn*x+βm*x))+Bn*Dm*exp(-i*(ωn*x+βm*x)) in Expression (8) is 2*ABS(An*Cm)*cos(ωn*x+βm*x+θ1), which can be represented only by real numbers. Here, ABS(An*Cm) represents the absolute value of the complex number An*Cm.

Similarly, An*Dm*exp(i*(ωn*x-βm*x))+Bn*Cm*exp(-i*(ωn*x-βm*x)) in Expression (8) is 2*ABS(An*Dm)*cos(ωn*x-βm*x+θ2), which can be represented only by real numbers.

After all, in a case where the expression on the fourth row of Expression (7) is expanded for one combination of n and m, Expression (9) is obtained.

$$2^*\text{ABS}(An^*Cm)^*\cos(\omega n^*x+\beta m^*x+\theta 1)+2^*\text{ABS}(An^*Dm)^*\cos(\omega n^*x-\beta m^*x+\theta 2) \quad (9)$$

In a case where the pixel array pattern and the wiring pattern are overlapped (that is, multiplied) from Expression (9), it can be seen that moiré with the intensity of 2*ABS(An*Cm)=2*ABS(An)*ABS(Cm) occurs at a frequency ωn+βm of the sum of the respective frequencies ωn and βm, and moiré with the intensity 2*ABS(An*Dm)=2*ABS(An)*ABS(Dm) occurs at a difference frequency ωn-βm. Here, ABS(Cm) and ABS(Dm) both have the same value of the intensity of the frequency βm of the wiring pattern.

It should be noted that ABS(An), ABS(Bn), ABS(Cm), and ABS(Dm) respectively are intensities in the complex Fourier series, as can be seen from the above description, and thus becomes ½ of intensities in the Real Fourier series (the reason for this is that in a complex Fourier series, the intensity is separated into two complex numbers having a conjugate relation).

In addition, in the 1-dimensional frequency distribution of the pattern obtained by overlapping (multiplying) the pixel array pattern and the wiring pattern from Expression (8), it can be seen that the moiré components occur at frequencies to which frequencies ωn and βm are added. Coefficients of the moiré components are multiplication values (complex numbers) of the coefficients An and Bn of the components of the frequencies ωn in the 1-dimensional frequency distribution of the pixel array pattern and the coefficients Cm and Dm of the components of the frequencies βm in the 1-dimensional frequency distribution of the wiring pattern. Here, it is assumed that the frequency of the coefficient Bn is -ωn and the frequency of the coefficient Dm is -βm.

Among these moirés, the problematic moiré is a moiré having a frequency ωn-βm and -(ωn-βm)). The reason for this is that since the human's visual response characteristics are sensitive to low-frequency patterns, even in a case where the respective patterns ωn and βm of the pixel array pattern and the wiring pattern are not visible, the moiré with the frequency φn-βm is at a low frequency and is likely to be visible.

In order to make understanding of the description easier, the luminance pattern of the pixel array and the transmittance pattern of the wiring are hitherto considered 1-dimensionally. In reality, both patterns are 2-dimensional, but in the case of two dimensions, not only the frequency in the x direction but also the frequency in the y direction may be taken into consideration, and an expression expressing moiré can be derived in the same manner. In conclusion, in the case of two dimensions, the moiré of the intensity of the product of the respective intensities of the difference frequency and the sum frequency of the frequency components in the x direction and the y direction of the luminance pattern of the pixel array and the transmittance pattern of the wiring occurs.

Next, a specific example will be described. FIG. 11 schematically shows an example of the luminance pattern of the pixel array of any of the sub-pixels 32*r*, 32*g*, and 32*b* of the display unit 30 shown in FIG. 9. Further, FIG. 12 schematically shows an omnidirectional-equal pitch wiring pattern (that is, a transmittance pattern of the wiring) 25*c*.

Figure 12:
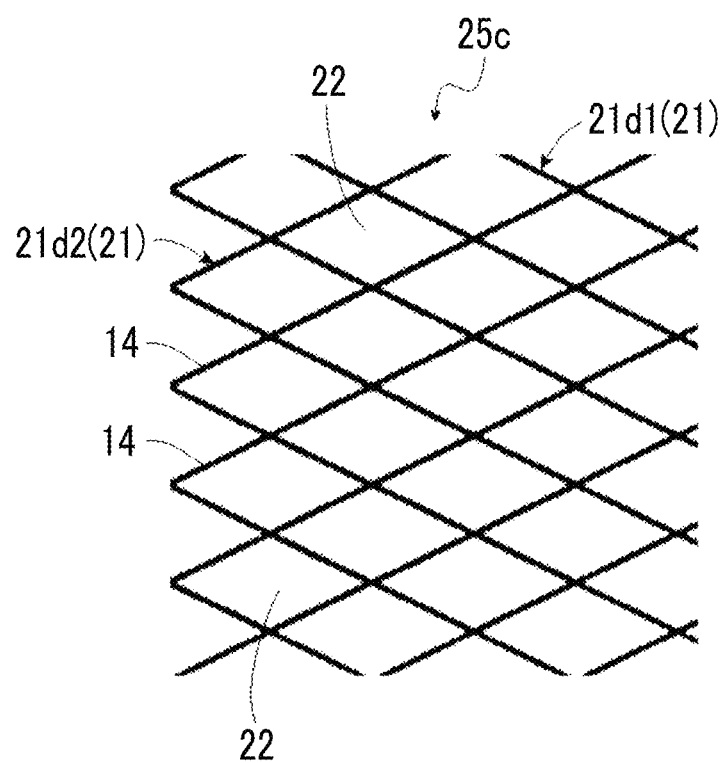
FIG. 12 is a plan view schematically showing a conventional wiring pattern (transmittance pattern of the wiring).
Figure 13:
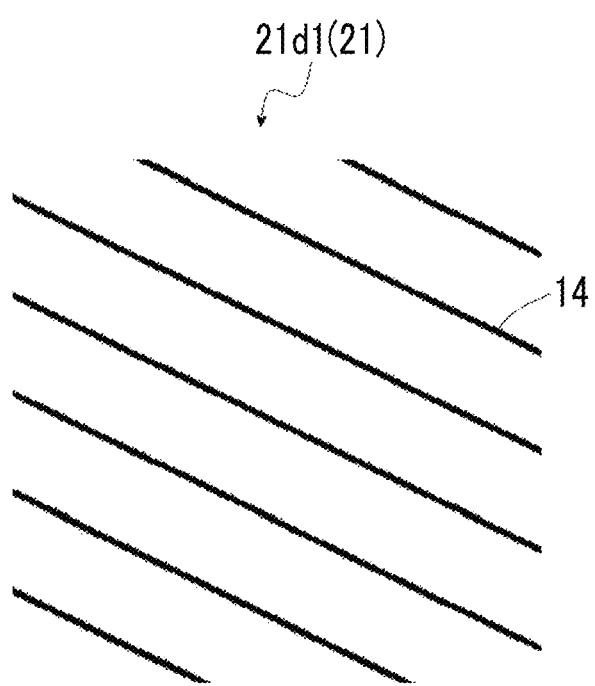
FIG. 13 is a plan view schematically showing an equal pitch wiring pattern in a straight line wiring of the wiring pattern in one direction shown in FIG. 12.

Here, for example, a shape of the opening portion 22 of the wiring pattern 25*c* shown in FIG. 12 is a rhomboid, and in FIG. 12, an angle formed with the x direction is 26°, and a pitch is 101 µm. In a case where the shape of the opening portion 22 of the wiring pattern 25 is a rhomboid, the shape can be represented by overlapping the wiring patterns of straight line wirings having equal pitches in two directions. FIG. 13 shows a straight line wiring 21*d*1 in the first direction (extending in the left (up) direction and arranged in the right (up) direction) of the two directions. The straight line wiring 21*d*2 shown in FIG. 12 is a straight line wiring in the second direction (extending in the right (up) direction and arranged in the left (up) direction) of the two directions. Here, the "direction" of the straight line wiring is a direction in which the straight line wirings are arranged, and means a direction vertical to the straight line.

Figure 14:
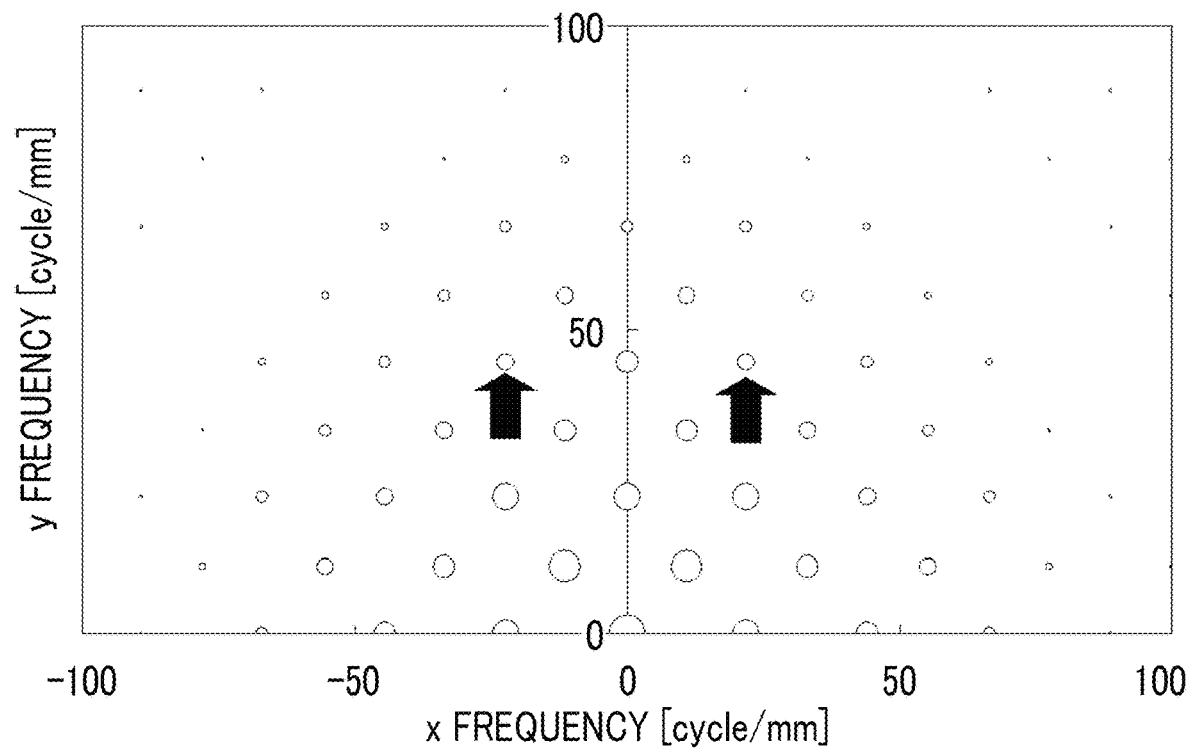
FIG. 14 is a diagram of a 2-dimensional frequency distribution of the pixel array pattern shown in FIG. 11.
Figure 15:
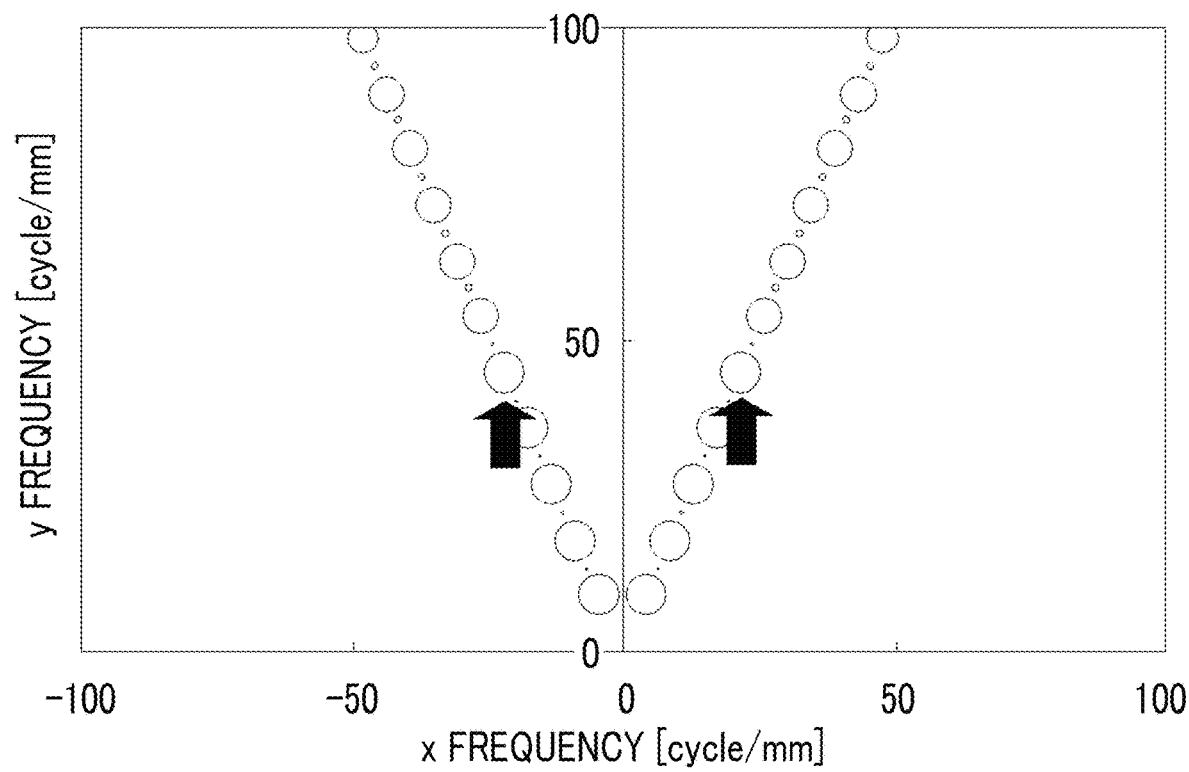
FIG. 15 is a diagram showing a 2-dimensional frequency distribution of the wiring pattern shown in FIG. 12.

Further, FIG. 14 is a 2-dimensional frequency distribution of the pixel array pattern of FIG. 11 (that is, the luminance pattern of the pixel array), where the intensity of each frequency component is indicated by the area of the circle. FIG. 15 is a 2-dimensional frequency distribution of the wiring pattern 25*c* of FIG. 12, where the intensity of each frequency component is indicated by the area of the circle. It should be noted that the 2-dimensional frequency distributions of FIGS. 14 and 15 each show only the first quadrant and the second quadrant. The frequency components in the first quadrant of FIG. 15 represent the frequency components in the straight line wiring 21*d*1 in the right direction in FIG. 12, and the frequency components in the second quadrant of FIG. 15 represent the frequency components in the straight line wiring 21*d*2 in the left direction in FIG. 12.

Figure 59:
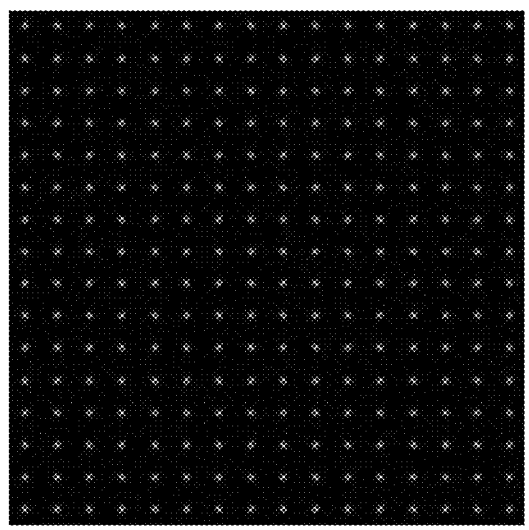
FIG. 59 is a plan view schematically showing another example of the luminance pattern of the pixel array of the display unit to which the conductive film according to the embodiment of the present invention is applied.
Figure 60:
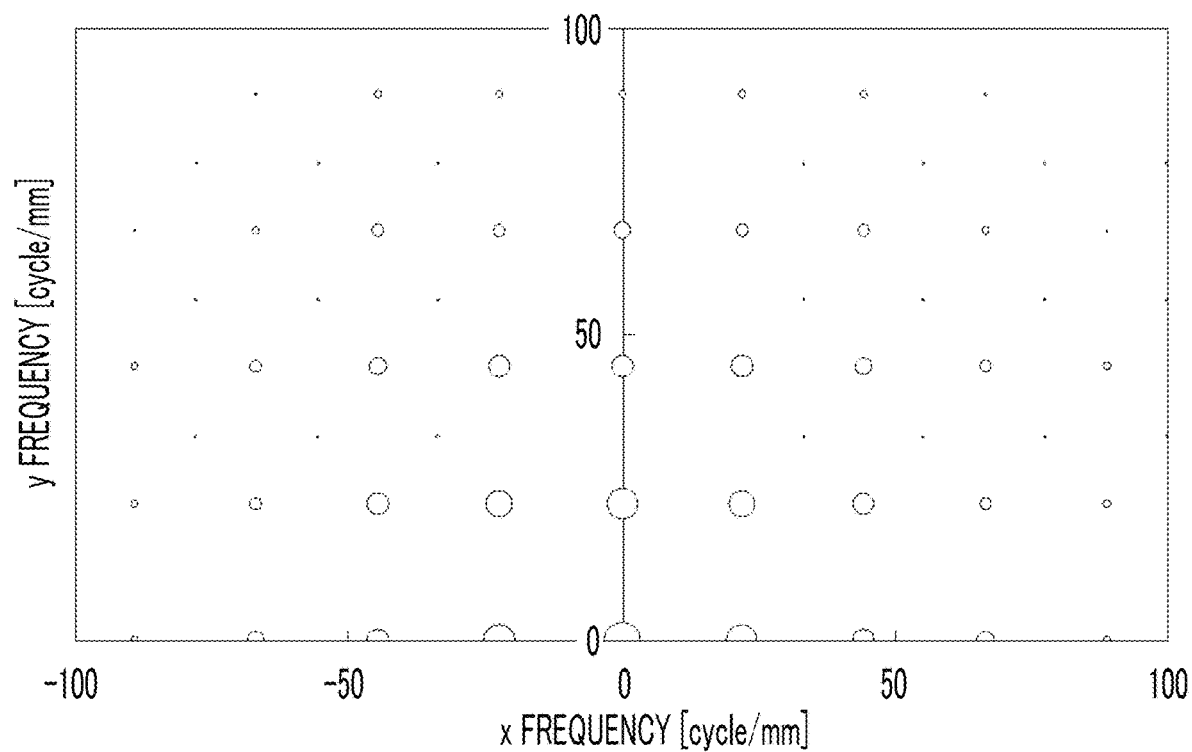
FIG. 60 is a diagram showing a 2-dimensional frequency distribution of the pixel array pattern shown in FIG. 59.

It should be noted that, In the embodiment of the present invention, as a display unit, it is possible to use a display unit of a display having different pixel array patterns for at least two colors of red (R), green (G), and blue (B), as in an organic EL display (OELD). FIG. 59 schematically shows another example of the luminance pattern of any pixel array of the sub-pixels RGB of the display unit 30*a* of such an organic EL display (OELD). Further, FIG. 60 is a 2-dimensional frequency distribution of the pixel array pattern of FIG. 59 (that is, the luminance pattern of the pixel array), where the intensity of each frequency component is indicated by the area of the circle. Here, FIG. 59 shows a pixel array pattern corresponding to FIG. 11, and FIG. 60 shows a 2-dimensional frequency distribution corresponding to FIG. 14.

Figure 16:
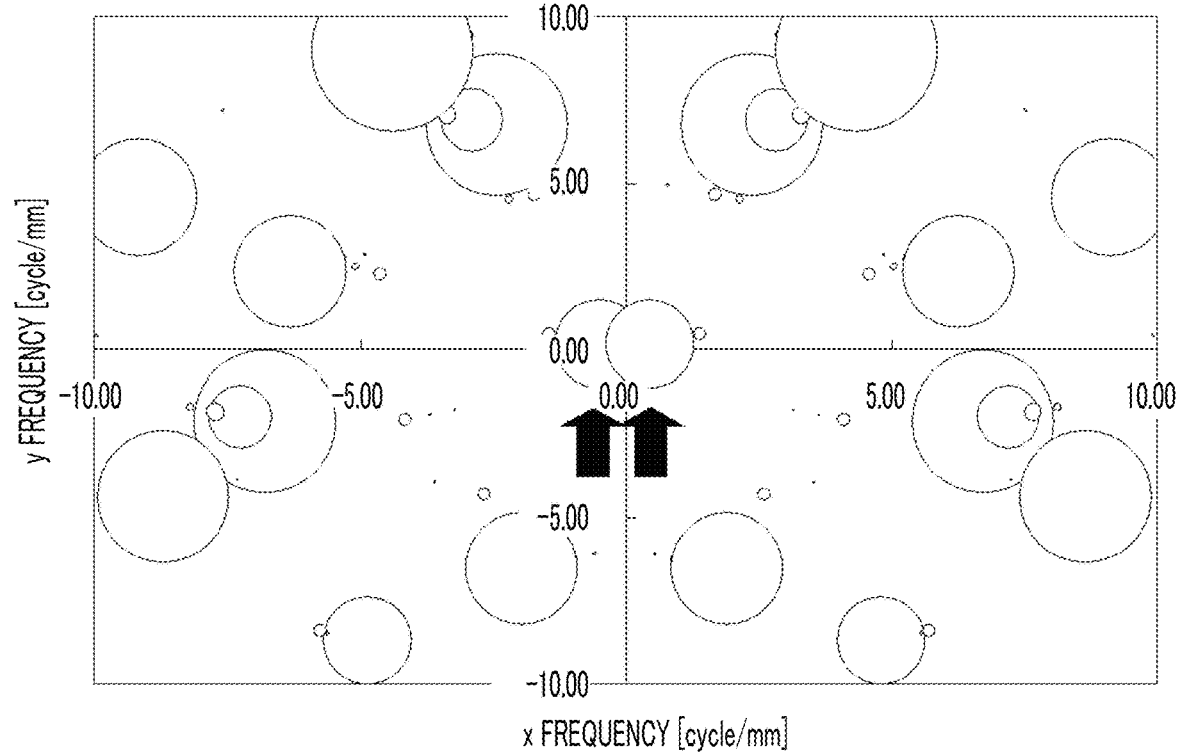
FIG. 16 is a diagram in which moiré components calculated from frequency components of the pixel array pattern shown in FIG. 14 and frequency components of the wiring pattern shown in FIG. 15 are plotted.

FIG. 16 is a diagram in which a multiplication value of each intensity is plotted at the difference frequency obtained by calculating a difference between moiré components, that is, a difference between frequencies, which are calculated from each frequency component of the pixel array pattern shown in FIG. 14 and each frequency component of the wiring pattern 25c shown in FIG. 15. Here, FIG. 16 differs from FIG. 14 and FIG. 15 in the scale range of the x frequency and the y frequency, and also there is a difference in the relationship between the area of the circle of each component and the intensity.

Here, as can be seen from Expression (8), in order to accurately derive the moiré component, it is necessary for all frequency components of the pixel array pattern (including components of the conjugate relation) and all frequency components of the wiring to be multiplied by the coefficients (complex numbers) of the components and to be plotted on the frequency of the sum of the frequencies of the components (the sum with the negative frequencies corresponds to the above difference calculation). However, description thereof will be omitted for simplification of description. FIG. 16 is a diagram in which moirés of components are plotted. The components include components in a region in which the y frequency is 0 or less in the 2-dimensional frequency distribution of the pixel array pattern and components obtained by excluding components of the frequency 0 from a region in which the y frequency is 0 or more in the region of the 2-dimensional frequency distribution of the wiring pattern.

Here, as can be seen from Expression (7), the pattern, in which the pixel array pattern and the wiring pattern are overlapped, includes, in addition to the moiré given by the expression in the fourth row of Expression (7), "the frequency components of the wiring pattern multiplied by the average luminance of the pixel array pattern" given by the third row of Expression (7). In FIG. 16, these components are also included. Specifically, the component of the frequency 0 of the pixel array pattern (corresponding to A0 in Expression (7)) is multiplied by the components of the wirings, and the multiplication values are plotted on the sum of the frequencies of the component of the frequency 0 and the components of the wirings, that is, in the frequencies of the components of the wirings.

The pattern obtained by overlapping the pixel array pattern and the wiring pattern includes "each frequency component of the luminance pattern of the pixel array multiplied by the average transmittance of the wiring pattern" given in the second row of Expression (7). However, in FIG. 16, this component is not included. Specifically, in a case where the multiplication values of the frequency components of the pixel array pattern and the frequency components of the wiring pattern are plotted on the frequency of the sum of the frequencies of the respective components, the component of the frequency 0 of the wiring pattern (corresponding to C0 in Expression (7)) is excluded. In the plot of FIG. 16, the phase information of each moiré component is not necessary and only the intensity thereof may be derived therefrom. Therefore, the intensity can be easily derived from each frequency component of the pixel array pattern of FIG. 14 and each frequency component of the wiring pattern of FIG. 15. That is, the difference between each frequency component of the wiring pattern of FIG. 15 and the frequency of each frequency component of the pixel array pattern of FIG. 14 is simply calculated, and the multiplication values of the intensities of the components are plotted on the frequencies of the differences.

Here, as described above, the plot of FIG. 16 includes "each frequency component of the wiring pattern multiplied by the average luminance of the pixel array pattern". Therefore, the frequency distribution of the pixel array pattern of FIG. 14 includes the frequency distribution of the component of the frequency 0 (corresponding to A0 in Expression (7)), and does not include "each frequency component of the pixel array pattern multiplied by the average transmittance of the wiring pattern". As a result, the frequency distribution of the wiring pattern of FIG. 15 does not include the component of the frequency 0 (corresponding to C0 in Expression (7)). In the embodiment of the present invention, not only FIG. 16 but also any moiré component diagrams in the following description include "each frequency component of the wiring pattern multiplied by the average luminance of the pixel array pattern", and does not include "each frequency component of the pixel array pattern multiplied by the average transmittance of the wiring pattern".

The human eye's visual response characteristics are sensitive to low frequencies, that is, only the low-frequency components of the moiré components in FIG. 16 are visible to the human eye.

Figure 17:
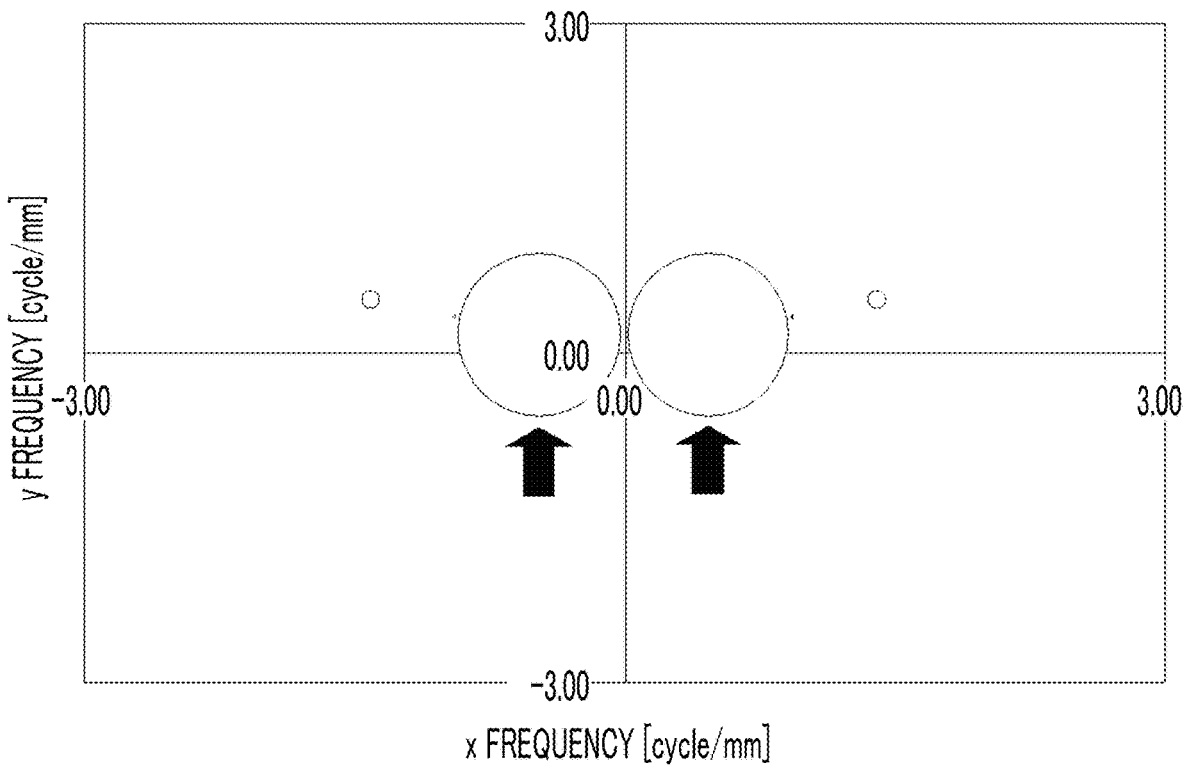
FIG. 17 is a diagram showing a result of multiplying each moiré component shown in FIG. 16 by the sensitivity of the human eye's visual characteristics.

FIG. 17 shows a result of multiplying each moiré component shown in FIG. 16 by the sensitivity of the human eye's visual response characteristics. Here, FIG. 17 differs from FIG. 16 in the scale range of the x frequency and the y frequency. In addition, the intensity indicated by the area of the circle of each component is different, and each component is plotted as a circle having a larger area in FIG. 17. In the embodiment of the present invention, as the sensitivity of the human eye's visual response characteristics, the Dooley-Shaw expression (R. P. Dooley, R. Shaw: Noise Perception in Electrophotography, J. Appl. Photogr. Eng., 5, 4 (1979), pp. 190-196.) is used, which is represented by Expression (1). Here, Expression (1) is given as the visual transfer function VTF.

$k \leq \log(0.238/0.138)/0.1$ $VTF = 1$ $k > \log(0.238/0.138)/0.1$ $VTF = 5.05e^{-0.138k}(1 - e^{-0.1k})$ $k = \pi du/180$ \hfill (1)

Here, k is a spatial frequency (cycle/deg) defined by a solid angle, and is represented by the above expression. u is a spatial frequency (cycle/mm) defined by a length, and d is an observation distance (mm).

The Dooley-Shaw expression is given by $VTF = 5.05e^{-0.138k}(1 - e^{-0.1k})$ in Expression (1), and is less than 1 around 0 cycle/mm, and has so-called characteristics of a bandpass filter. However, in the embodiment of the present invention, even in a case where the spatial frequency band is low ($k \leq \log(0.238/0.138)/0.1$), the value of VTF is set to 1 so as to eliminate attenuation in sensitivity of low-frequency components.

Figure 18A:
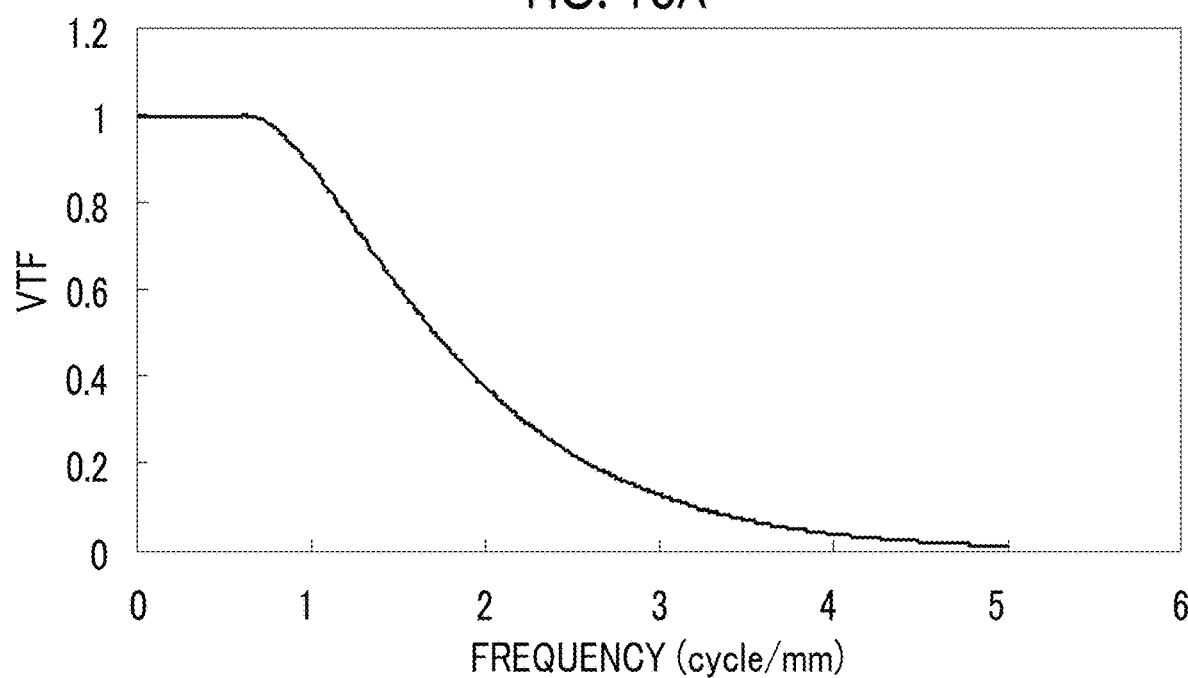
FIG. 18A is a graph of a visual transfer function indicating the sensitivity of the human eye's visual characteristics.
Figure 18B:
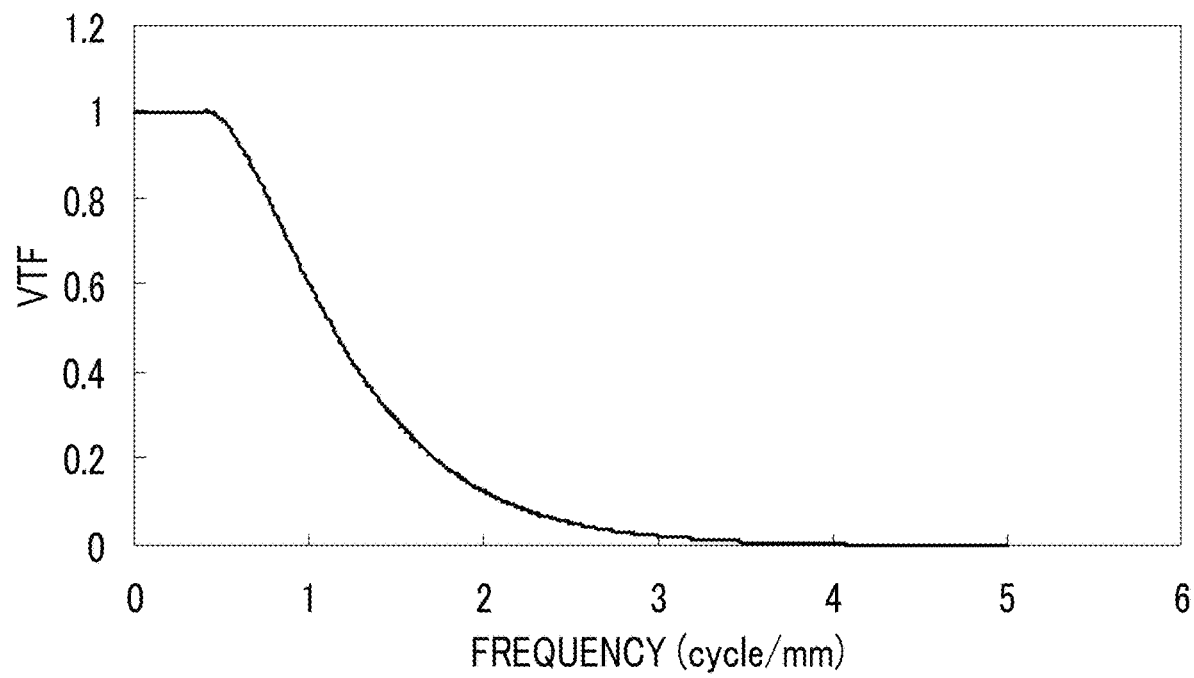
FIG. 18B is a graph of another visual transfer function indicating the sensitivity of the human eye's visual characteristics.

FIGS. 18A and 18B show examples of an observation distance of 500 mm and an observation distance of 750 mm as examples of VTF. In the description of the present specification, the VTF at the observation distance of 500 mm is used as the sensitivity of the human eye's visual response characteristics.

In FIG. 17, it can be seen that there is a moiré component in the low frequency range of 1 cycle/mm or less, and there is moiré that is visible to the human eye.

This moiré is caused by the components (x=22.2 cycle/mm, y=44.4 cycle/mm) indicated by the black arrows in the frequency distribution of the pixel array pattern of FIG. 14 and the components (x=21.8 cycle/mm, y=44.6 cycle/mm) indicated by the black arrows in the frequency distribution of the wiring pattern of FIG. 15.

As described above, it can be seen that in a case where there are close components of frequencies in the frequency distribution of the pixel array pattern and the frequency distribution of the wiring pattern, low-frequency moiré visible to the human eye occurs.

It should be noted that, as in the components indicated by the black arrows in FIG. 17, a component having the highest intensity among the moiré components obtained by applying the human eye's visual response characteristics is referred to as "a frequency component of moiré that contributes most to the moiré" or "a main moiré component".

(Principle of Moiré Reduction According to Embodiment of Present Invention)

Next, the present invention is characterized in that there is provided "a separate-direction non-equal pitch wiring pattern in which the average wiring pitch is different in each of at least two or more directions, as a wiring pattern in which straight line wirings in two or more directions are overlapped".

From the above-described principle of moiré occurrence, in a case where the frequency of each frequency component of the wiring pattern can be set apart from the frequency of each frequency component of the pixel array pattern, it can be seen that a low-frequency moiré visually perceived by human eyes does not occur. Therefore, in the embodiment of the present invention, the reduction of moiré is achieved by the "separate-direction non-equal pitch wiring pattern in which the wiring pitches differ in two or more directions".

First, the "separate-direction non-equal pitch wiring pattern in which the wiring pitch is different in each of two or more directions" will be described.

Figure 19:
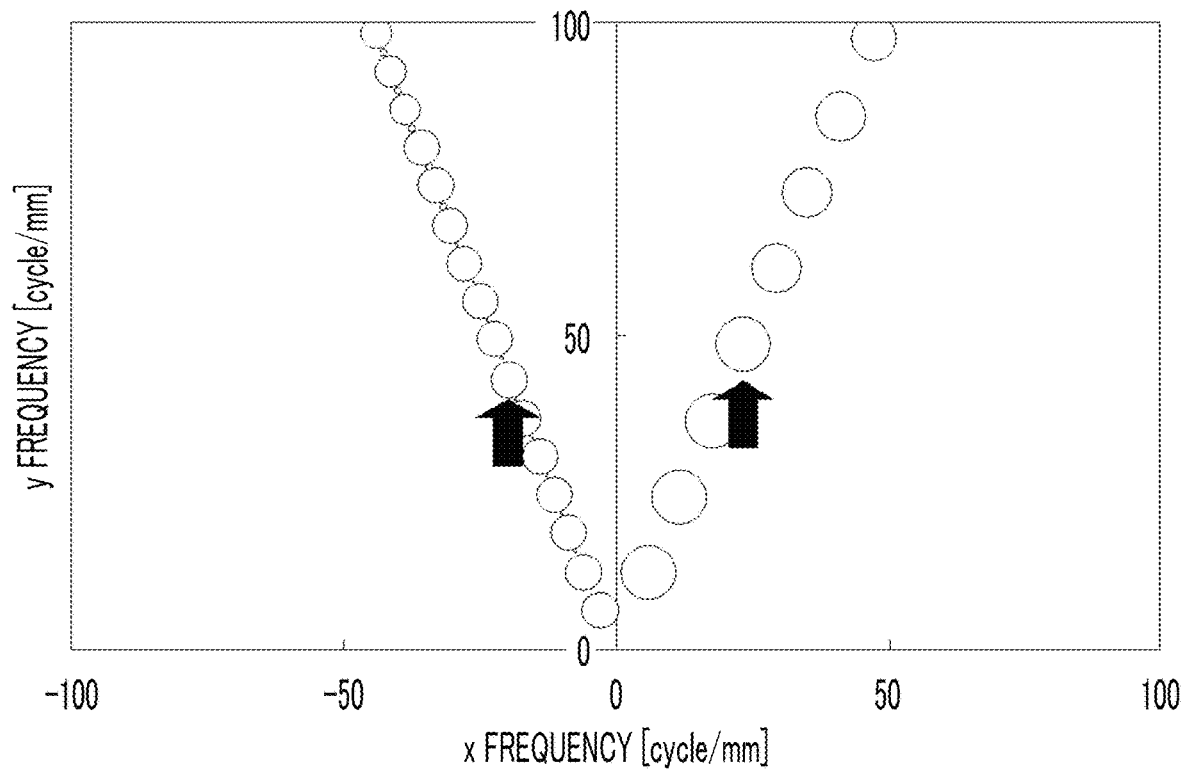
FIG. 19 is a diagram showing a 2-dimensional frequency distribution of the wiring pattern shown in FIG. 2.
Figure 20:
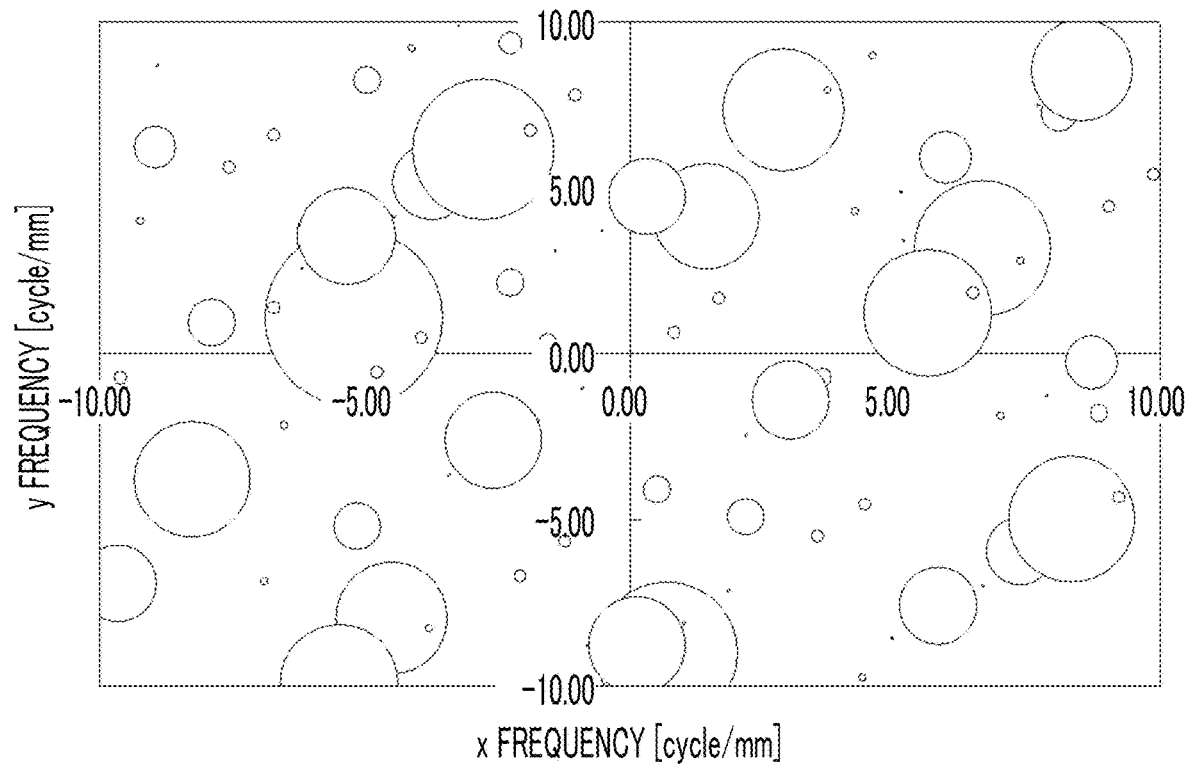
FIG. 20 is a diagram in which moiré components calculated from frequency components of the pixel array pattern shown in FIG. 14 and frequency components of the wiring pattern shown in FIG. 19 are plotted.

FIG. 19 shows 2-dimensional frequency distribution of the separate-direction non-equal pitch wiring pattern 25a in which the wiring pitches in the right direction and the left direction shown in FIG. 2 are different from each other. FIG. 20 is a diagram showing the frequency distribution of moiré in the separate-direction non-equal pitch wiring pattern 25a shown in FIG. 2, and a diagram in which moiré components calculated from frequency components of the pixel array pattern shown in FIG. 14 and frequency components of the wiring pattern shown in FIG. 19 are plotted.

Figure 21:
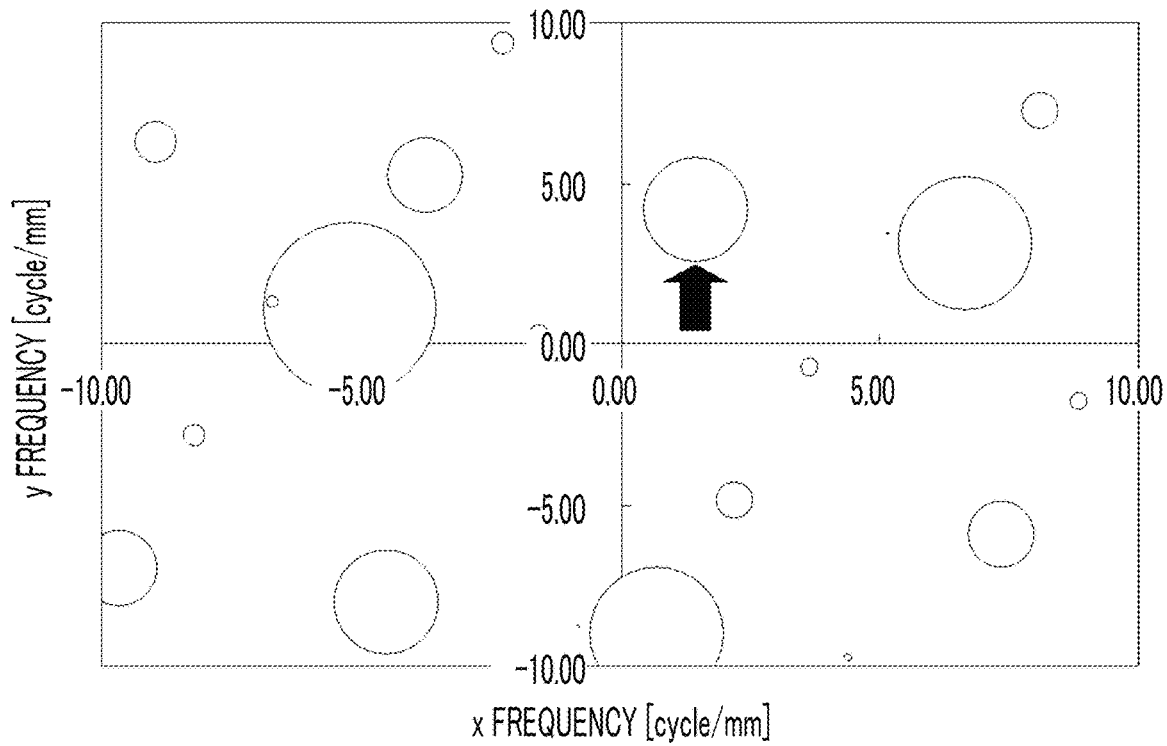
FIG. 21 is a moiré component calculated on the basis of the straight line wiring shown in FIG. 3 among the moiré components shown in FIG. 20.
Figure 22:
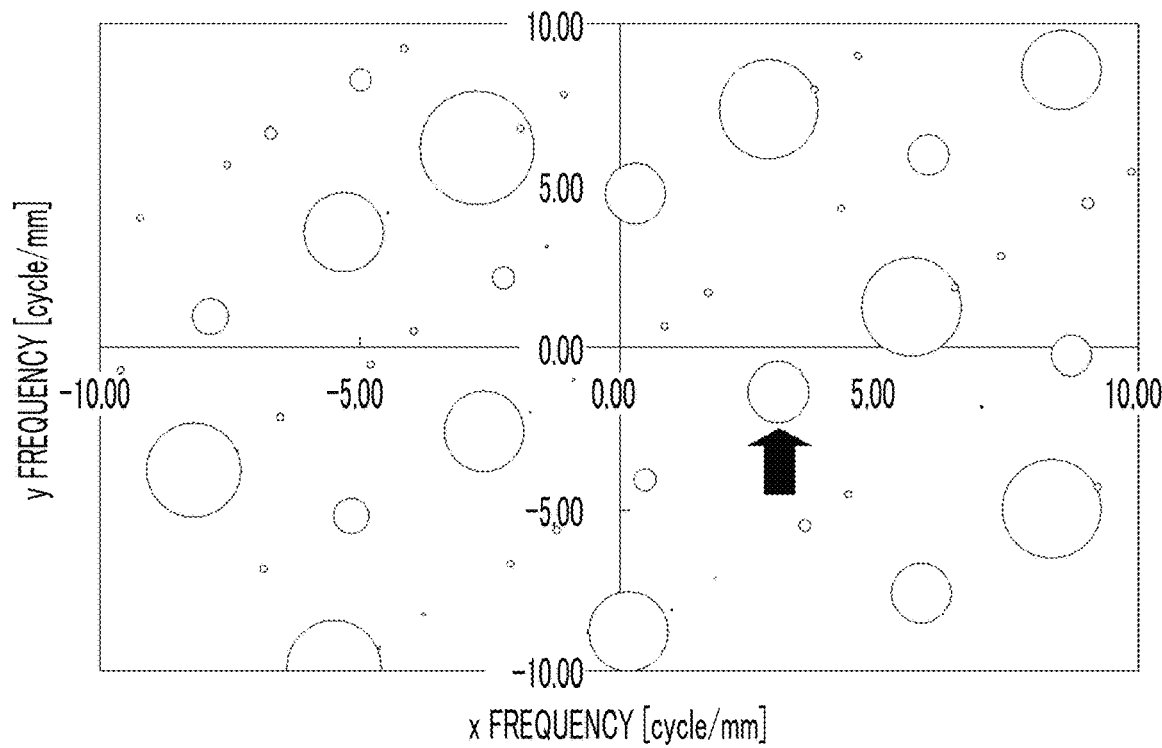
FIG. 22 is a moiré component calculated on the basis of the straight line wiring shown in FIG. 4 among the moiré components shown in FIG. 20.

In addition, FIG. 21 shows moiré components calculated from the frequency components (first quadrant components) of the wiring pattern (straight line wiring 21a shown in FIG. 3) in the right direction, among the frequency components of the pixel array pattern shown in FIG. 14 and the frequency components of the wiring shown in FIG. 19. That is, FIG. 21 shows the moiré components calculated on the basis of the straight line wiring 21a shown in FIG. 3, among the moiré components shown in FIG. 20. FIG. 22 shows moiré components calculated from the frequency components (second quadrant components) of the wiring pattern (straight line wiring 21b shown in FIG. 4) in the left direction, among the frequency components of the pixel array pattern shown in FIG. 14 and the frequency components of the wiring shown in FIG. 19. That is, FIG. 22 shows the moiré components calculated on the basis of the straight line wiring 21b shown in FIG. 4, among the moiré components shown in FIG. 20.

The wiring pattern 25a shown in FIG. 2 and the wiring pattern 25c shown in FIG. 12 each have the same number of wirings per unit area, that is, the same average transmittance. Here, assuming that the pitch of the rightward straight line wiring is p1 and the pitch of the leftward straight line wiring is p2, in a case where the value of (1/p1+1/p2) is equal, the number of the thin metal wires 14 arranged per unit area is equal. That is, assuming that the pitch of the rightward straight line wiring 21a shown in FIG. 3 in the wiring pattern 25a shown in FIG. 2 is p1, the pitch of the leftward straight line wiring 21b shown in FIG. 4 is p2, and the pitches of the rightward straight line wiring 21d1 shown in FIG. 13 and the leftward straight line wiring 21d2 (refer to FIG. 12) in the wiring pattern 25c shown in FIG. 12 are p, 1/p1+1/p2=2/p is established.

Further, the frequency distribution of the wiring pattern 25a shown in FIG. 19 and the frequency distribution of the wiring pattern 25c shown in FIG. 15 each have the same magnitudes of intensities indicated by the areas of the circles of the respective components. In addition, the moiré frequency distribution of the wiring pattern 25a shown in FIG. 20 and the moiré frequency distribution of the wiring pattern 25c shown in FIG. 16 each have the same magnitudes of intensities indicated by the areas of the circles of the respective components.

Further, the angle of the rightward wiring pattern (straight line wiring 21a) shown in FIG. 3 is 26° which is the same as the straight line wirings 21d1 and 21d2 of the equal pitch wiring pattern 25c in FIG. 12, but the angle of the leftward wiring pattern (straight line wiring 21b) shown in FIG. 4 is 24°.

Figure 23:
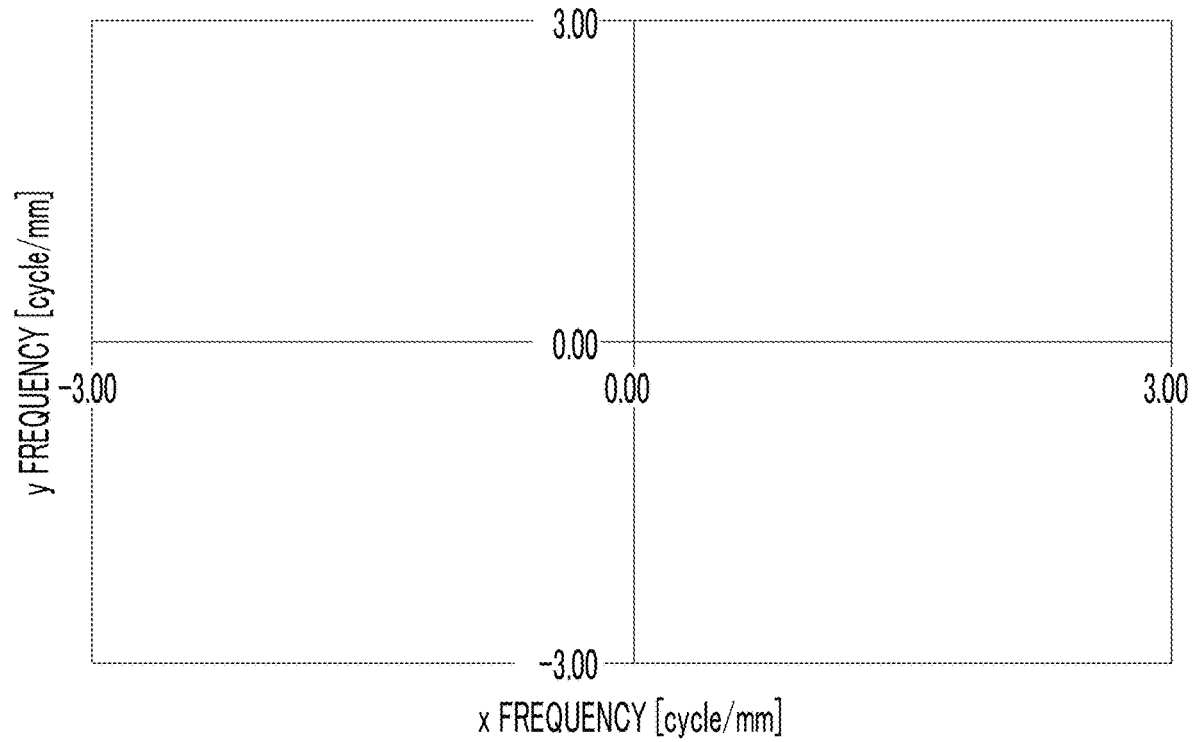
FIG. 23 is a diagram showing a result of multiplying each moiré component shown in FIG. 20 by the sensitivity of the human eye's visual characteristics.

As can be seen by comparing FIGS. 16 and 20, the low-frequency area moiré components (indicated by the black arrows in FIG. 16) found in the moiré frequency distribution (refer to FIG. 16) of the omnidirectional-equal pitch wiring pattern 25c are not present in FIG. 20. In the frequency distribution of the wiring pattern 25a shown in FIG. 19, the frequency components closest to the frequency components of the pixel array pattern indicated by the black arrows in FIG. 14 are indicated by the black arrows. From the frequency distribution of the moirés shown in FIG. 20 of the wiring pattern 25a shown in FIG. 2, as compared with the low-frequency area moiré components (indicated by the black arrows in FIG. 16) found in the moiré frequency distribution shown in FIG. 16 of the omnidirectional-equal pitch wiring pattern 25c shown in FIG. 12, it can be seen that high-frequency moiré components occur. In a case where each moiré component shown in FIG. 20 is multiplied by the VTF of Expression (1), the result is as shown in FIG. 23, and it can be seen that there is no moiré component having a magnitude at a level that can be indicated by the area of the circle in the graph. That is, it can be seen that the low-frequency area moiré components indicated by the arrows in FIGS. 21 and 22 are eliminated as shown in FIG. 23 in a case of multiplication of the VTF of Expression (1). That is, it can be seen that the moiré evaluation value, which is the sum of moiré components, in the wiring pattern 25a shown in FIG. 2 is smaller than that in the wiring pattern 25c shown in FIG. 12.

Compared to the frequency distribution of the omnidirectional-equal pitch wiring pattern 25c shown in FIG. 15, the pitches of the rightward and leftward wiring patterns (the straight line wirings 21a and 21b) may be changed as shown in FIG. 2. In this case, with respect to the at least the rightward wiring pattern (straight line wiring 21a), the frequencies of the frequency components shown in FIG. 19 are farther than those in the case of equal pitches in all directions (refer to FIG. 15). Therefore, components close to the frequency components of the pixel array pattern shown in FIG. 14 is hardly likely to occur. As a result, low-frequency moiré is hardly likely to occur.

On the other hand, with respect to the leftward wiring pattern (straight line wiring 21b), the frequencies of the frequency components shown in FIG. 19 are closer than those in the case of equal pitches in all directions (refer to FIG. 15), and thus components close to the frequency components of the pixel array pattern shown in FIG. 14 occurs. As a result, it is considered that low-frequency moirés are likely to occur.

Therefore, the present inventor variously changes the pitch of the rightward and leftward wirings within a range in which (1/p1+1/p2) is not greater than a predetermined value (a range in which the transmittance is allowable), and also changes the angles of the rightward and leftward wirings, thereby obtaining the moiré evaluation value which is the sum of moiré components. Here, since the pixel array pattern 38 shown in FIG. 11 (and the frequency distribution of the pixel array pattern of FIG. 14) is bilaterally symmetric, in a case where the pitches of the rightward and leftward wirings are the same (refer to FIG. 12), moiré is optimized at the same wiring angle. However, in a case where the pitches of the rightward and leftward wirings are different (refer to FIG. 2), moiré is not necessarily optimized at the same angle. Thus, by changing the angles of the rightward and leftward wirings separately in such a manner, the moiré evaluation value, which is the sum of moiré components, was investigated.

As a result, it was found that moiré can be reduced in some cases as compared with the case where the pitches of the rightward and leftward wirings are equal. In other words, as compared with the case of the same angles and pitches, it was found that the moiré may be reduced by not changing the angles and pitches of the rightward and leftward wiring patterns to the same angles and pitches but changing the angles and pitches separately. It is considered that the degree of moiré reduction is different depending on the pixel array pattern, the allowable range of transmittance, the range of the angle of the wiring, and the like.

For example, as in the separate-direction non-equal pitch wiring pattern 25b shown in FIG. 5, in the case of a wiring pattern in which the rightward straight line wiring 21a shown in FIG. 3 and the leftward straight line wiring 21c shown in FIG. 6 are overlapped, the wiring pitch of the rightward straight line wiring 21a is, for example, 74 μm, and the wiring pitch of the leftward straight line wiring 21c is, for example, 149 μm. With such a separate-direction non-equal pitch wiring pattern 25b, it is possible to reduce moiré compared to the omnidirectional-equal pitch wiring pattern 25c having the same average transmittance (having the same number of wirings per unit area) shown in FIG. 12. As described above, the separate-direction non-equal pitch wiring pattern 25b shown in FIG. 5 and the omnidirectional-equal pitch wiring pattern 25c shown in FIG. 12 have different wiring pitches, but the inclination angles of the rightward straight line wiring and the leftward straight line wiring are both the same and are 26°.

Figure 24:
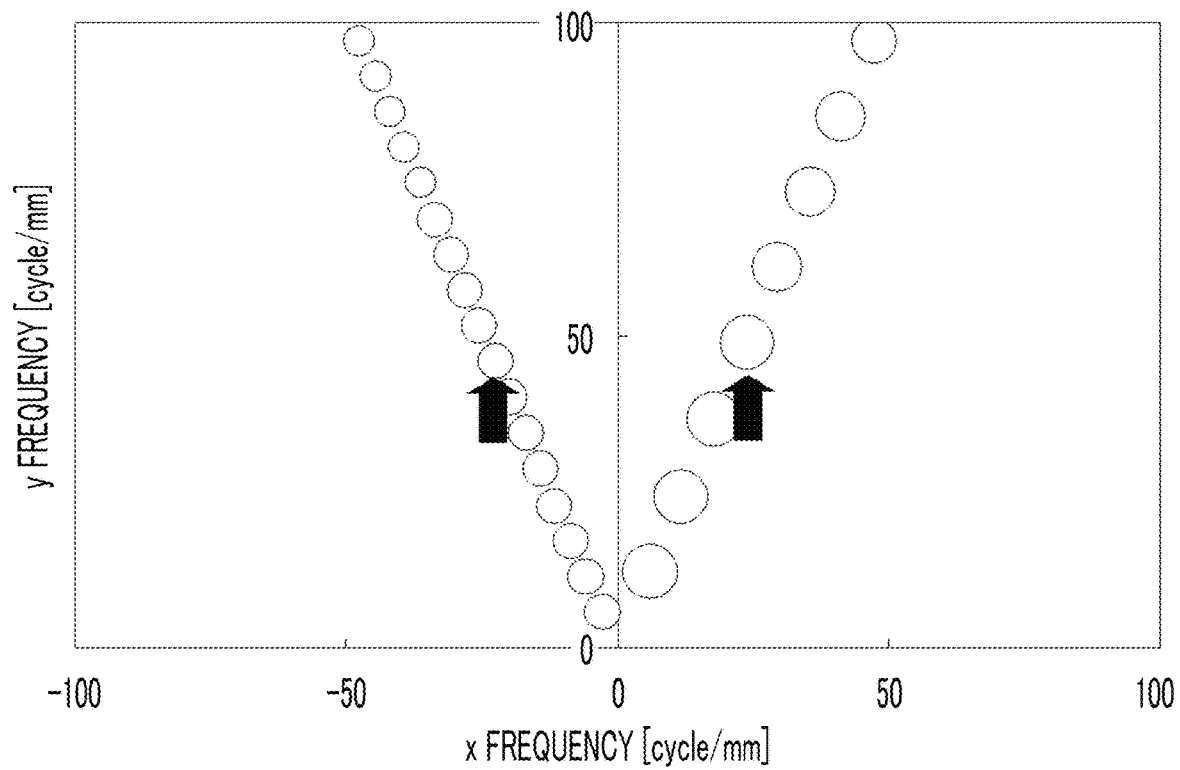
FIG. 24 is a diagram showing a 2-dimensional frequency distribution of the wiring pattern shown in FIG. 5.

Here, FIG. 24 shows the frequency distribution of the separate-direction non-equal pitch wiring pattern 25b shown in FIG. 5.

Figure 25:
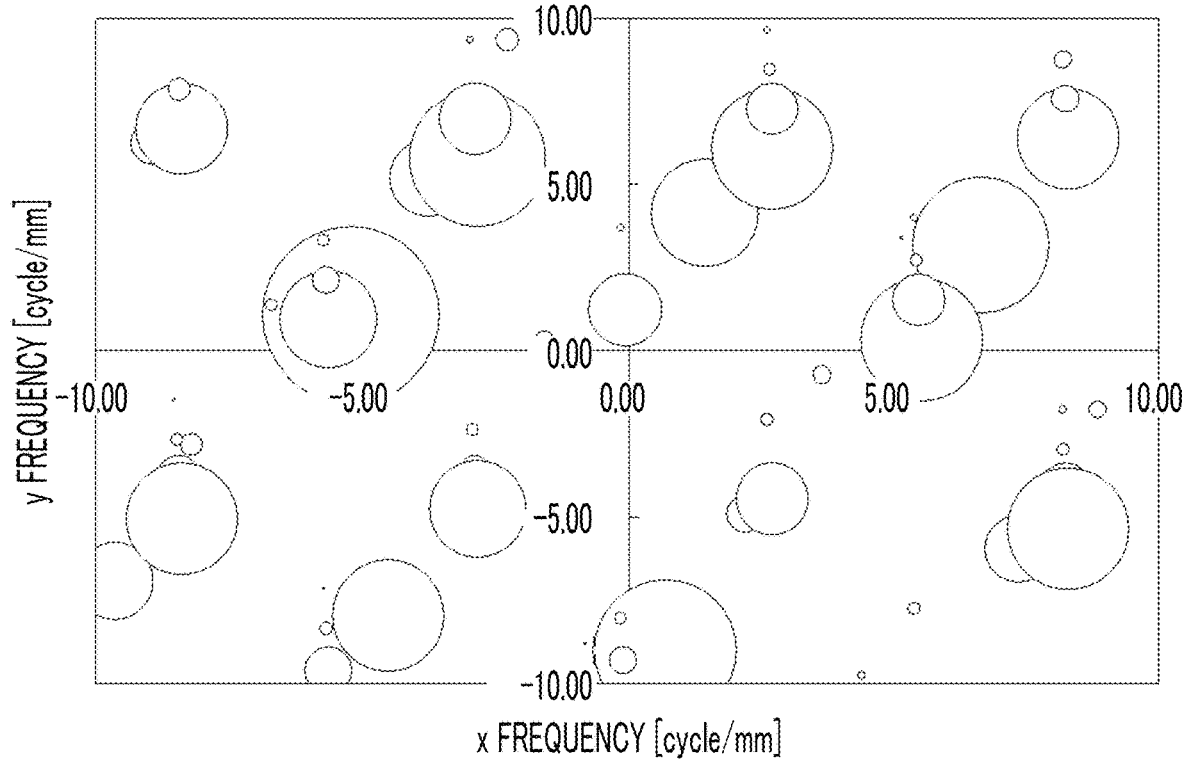
FIG. 25 is a diagram in which moiré components calculated from frequency components of the pixel array pattern shown in FIG. 14 and frequency components of the wiring pattern shown in FIG. 24 are plotted.

FIG. 25 is a diagram showing the frequency distribution of moiré in the separate-direction non-equal pitch wiring pattern 25b shown in FIG. 5, and a diagram in which moiré components calculated from frequency components of the pixel array pattern 38 shown in FIG. 14 and frequency components of the wiring pattern 25b shown in FIG. 24 are plotted.

Here, comparing FIG. 25 with FIG. 16, it can be seen that the moiré components of the separate-direction non-equal pitch wiring pattern 25b of the embodiment of the present invention shown in FIG. 25 each have a smaller magnitude than and each is closer to the high frequency side than each of the moiré components of the omnidirectional-equal pitch wiring pattern 25c shown in FIG. 16.

Figure 26:
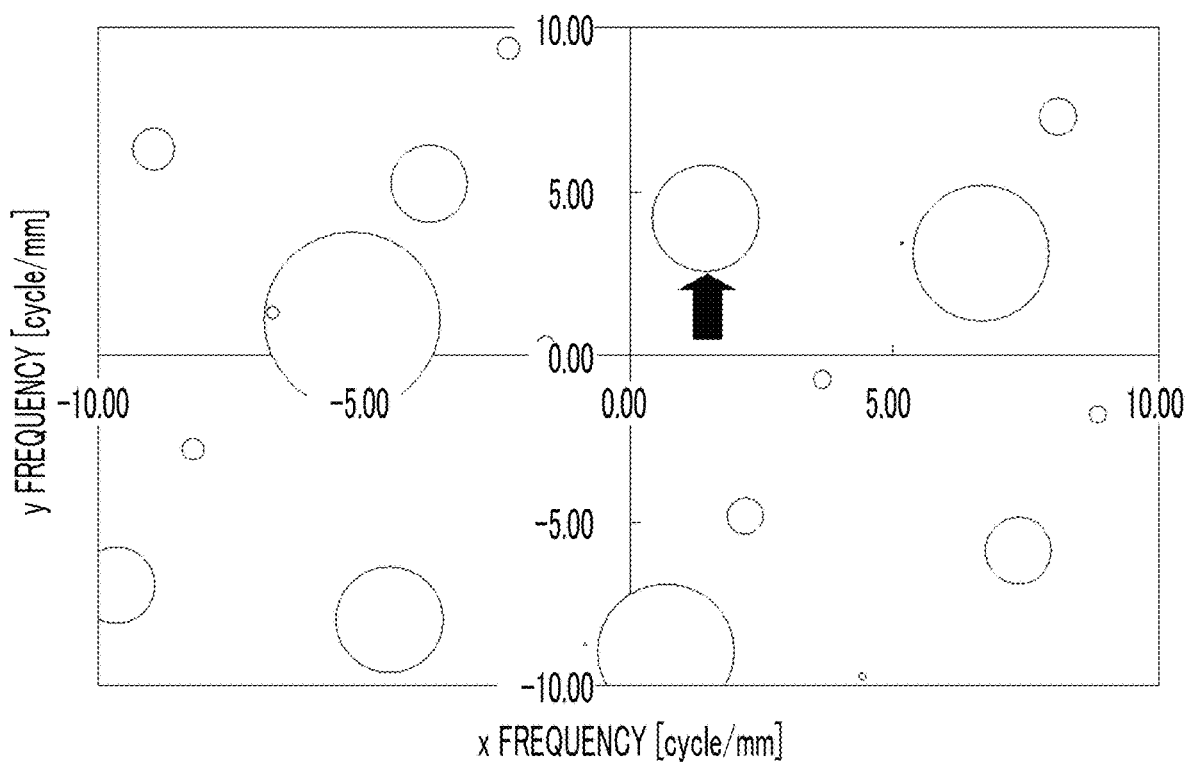
FIG. 26 is a moiré component calculated on the basis of the straight line wiring shown in FIG. 3 among the moiré components shown in FIG. 25.

FIG. 26 shows moiré components calculated from the frequency components (first quadrant components) of the wiring pattern (straight line wiring 21a shown in FIG. 3) in the right direction, among the frequency components of the pixel array pattern shown in FIG. 14 and the frequency components of the wiring shown in FIG. 24. That is, FIG. 26 shows the moiré components calculated on the basis of the straight line wiring 21a shown in FIG. 3, among the moiré components shown in FIG. 25. The moiré component indicated by the black arrow in FIG. 26 is due to the frequency component indicated by the black arrow on the right side of FIG. 24.

Figure 27:
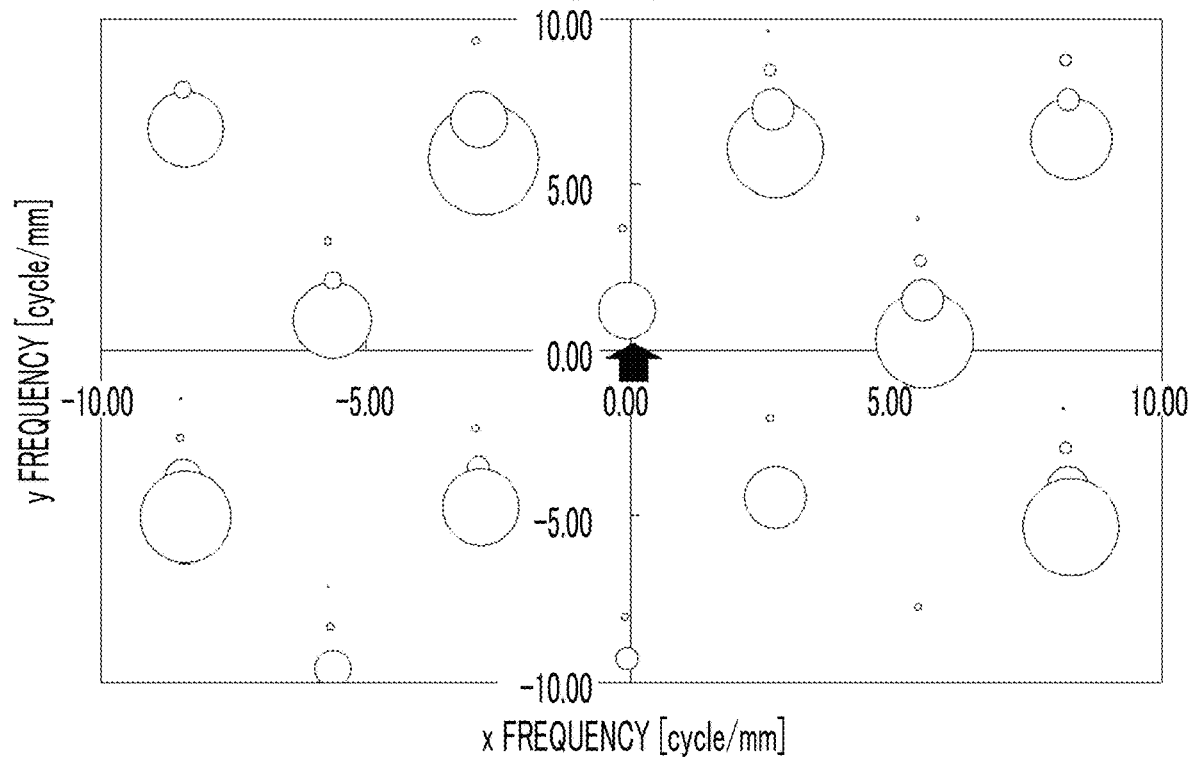
FIG. 27 is a moiré component calculated on the basis of the straight line wiring shown in FIG. 6 among the moiré components shown in FIG. 25.

In addition, FIG. 27 shows moiré components calculated from the frequency components (second quadrant components) of the wiring pattern (straight line wiring 21c shown in FIG. 6) in the left direction, among the frequency components of the pixel array pattern 38 shown in FIG. 14 and the frequency components of the wiring shown in FIG. 24. That is, FIG. 27 shows the moiré components calculated on the basis of the straight line wiring 21c shown in FIG. 6, among the moiré components shown in FIG. 25. The moiré component indicated by the black arrow in FIG. 27 is due to the frequency component indicated by the black arrow on the left side of FIG. 24.

Figure 28:
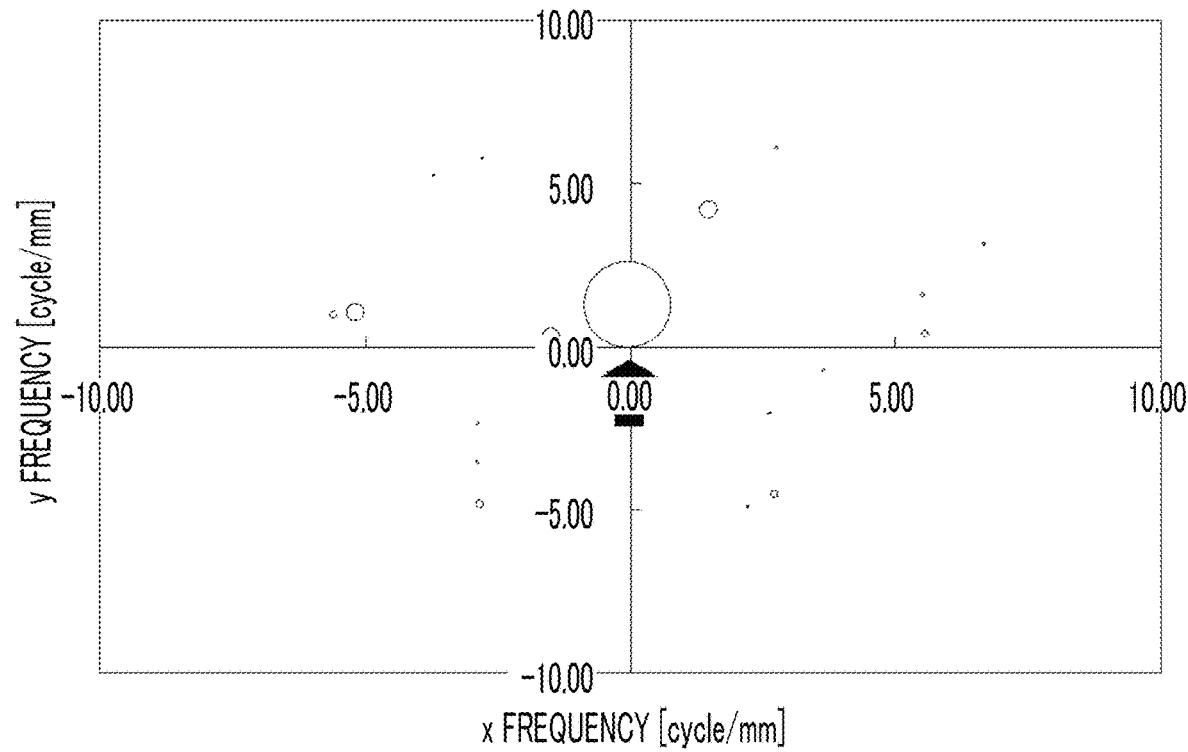
FIG. 28 is a diagram showing a result of multiplying each moiré component shown in FIG. 25 by the sensitivity of the human eye's visual characteristics.

Here, each moiré component shown in FIG. 25 is multiplied by the VTF of Expression (1) indicating the sensitivity of the human eye's visual characteristics to obtain the result shown in FIG. 28. From FIG. 28, it can be seen that there is no moiré component visible to the human eye due to the rightward straight line wiring 21a shown in FIG. 3, and moiré component visible to the human eye due to the leftward straight line wiring 21c shown in FIG. 6 (indicated by a black arrow).

In addition, it can be seen that the magnitude of the moiré component (black arrow) displayed by the area of each circle in the graph of FIG. 28 is smaller and less than the magnitude of the moiré component (black arrow) after VTF multiplication of the omnidirectional-equal pitch wiring pattern 25c shown in FIG. 17. That is, the moiré evaluation value, which is the sum of moiré components, in the wiring pattern 25b shown in FIG. 5 is smaller than the moiré evaluation value in the omnidirectional-equal pitch wiring pattern 25c shown in FIG. 12.

By the way, in the separate-direction non-equal pitch wiring pattern 25a (26° in the right direction and 24° in the left direction) shown in FIG. 2 and the wiring pattern 25b (26° in the right and left directions) shown in FIG. 5, compared to FIG. 20, 22, 25, or 27, it can be seen that moiré is reduced since the moiré component (black arrow) by the leftward straight line wiring 21b shown in FIG. 22 is closer to the high frequency side than the moiré component (black arrow) by the leftward straight line wiring 21c shown in FIG. 27.

That is, in FIG. 28 showing the result of multiplying each moiré component shown in FIG. 25 by the VTF of Expression (1), it can be seen that there is a moiré component (indicated by the black arrow) which is small but visible to the human eye. In FIG. 23 showing the result of multiplying each moiré component shown in FIG. 20 by the VTF of Expression (1), it can be seen that there is no moiré component having a magnitude at a level that can be indicated by the area of the circle in the graph.

Therefore, in these examples, it can be seen that not only the wiring pitches of the rightward and leftward straight line wirings are changed, but also the inclination angles of both straight line wirings are changed, whereby moiré can be further reduced.

In the embodiment of the present invention, as in the separate-direction non-equal pitch wiring patterns 25a and 25b shown in FIGS. 2 and 5, the pitch of the wiring pattern of each straight line wiring 21 is changed in each of two or more directions. Therefore, even in the case of the bilaterally symmetric pixel array pattern 38 in FIG. 14, the optimum angle (tilt angle) at which the moiré is reduced is different for each direction. For example, in a case where the number of directions is two and the wiring pattern 25c shown in FIG. 12 has an equal pitch in all directions, the optimum angle, at which moiré is reduced, is bilaterally symmetric for each of the wiring patterns of the leftward straight line wiring 21d2 and the rightward straight line wiring 21d1. The result is as shown in FIG. 15. However, in a case where the wiring pitches of the wiring pattern of the leftward straight line wiring 21b and the wiring pattern of the rightward straight line wiring 21a are different, the optimum angles, at which moiré is reduced, therefor are different. The result is as shown in FIG. 19. However, in the embodiment of the present invention, as described above, the angles may be the same or different as long as the pitches in two or more directions are different.

Further, in the embodiment of the present invention, as described above, it is desirable that the wiring pitch is as narrow as possible since the frequencies of the components in the frequency distribution are farther apart. From this, it is preferable that the number of directions of the wiring pattern of the embodiment of the present invention is small. The reason for this is that there is an upper limit to the number of wirings per unit area in order to secure the transmittance. Thus, by decreasing the number of directions of the wiring pattern, the number of wirings per one direction can be increased. As a result, the wiring pitch can be narrowed. However, it is needless to say that at least two directions are necessary to maintain the sensor function. Therefore, it is desirable that the wiring pattern of the embodiment of the present invention has two directions.

(Non-Equal Pitch Wiring Pattern in which Predetermined Number of Repetitive Pitches in One Direction are Equal Pitches and Predetermined Number of Pitches are Non-Equal Pitches)

Next, description will be given of an example in which the present invention is applied to, as an application of the embodiment of the present invention, "the wiring pattern in which straight line wirings in two or more directions are overlapped, and the non-equal pitch wiring pattern in which the repetitive pitches of the predetermined number of the thin metal wires are equal pitches and the respective pitches of the predetermined number of the thin metal wires are non-equal pitches in the straight line wiring 21 in at least one direction". Therefore, first, description will be given of "the wiring pattern in which straight line wirings in two or more directions are overlapped, and the non-equal pitch wiring pattern in which the repetitive pitches of the predetermined number of the thin metal wires are equal pitches and the respective pitches of the predetermined number of the thin metal wires are non-equal pitches in the straight line wiring 21 in at least one direction".

In the following description, in the embodiment of the present invention, a first requirement is "a wiring pattern in which straight line wirings in two or more directions are overlapped, and a separate-direction non-equal pitch wiring pattern in which an average pitch of the straight line wiring in at least one direction is different from an average pitch of the straight line wiring in at least one different direction". In addition, a second requirement is "a wiring pattern in which straight line wirings in two or more directions are overlapped, and a non-equal pitch wiring pattern in which the repetitive pitches of the predetermined number of the thin metal wires are equal pitches and the respective pitches of the predetermined number of the thin metal wires are non-equal pitches in a straight line wiring 21 in at least one direction".

Figure 29:
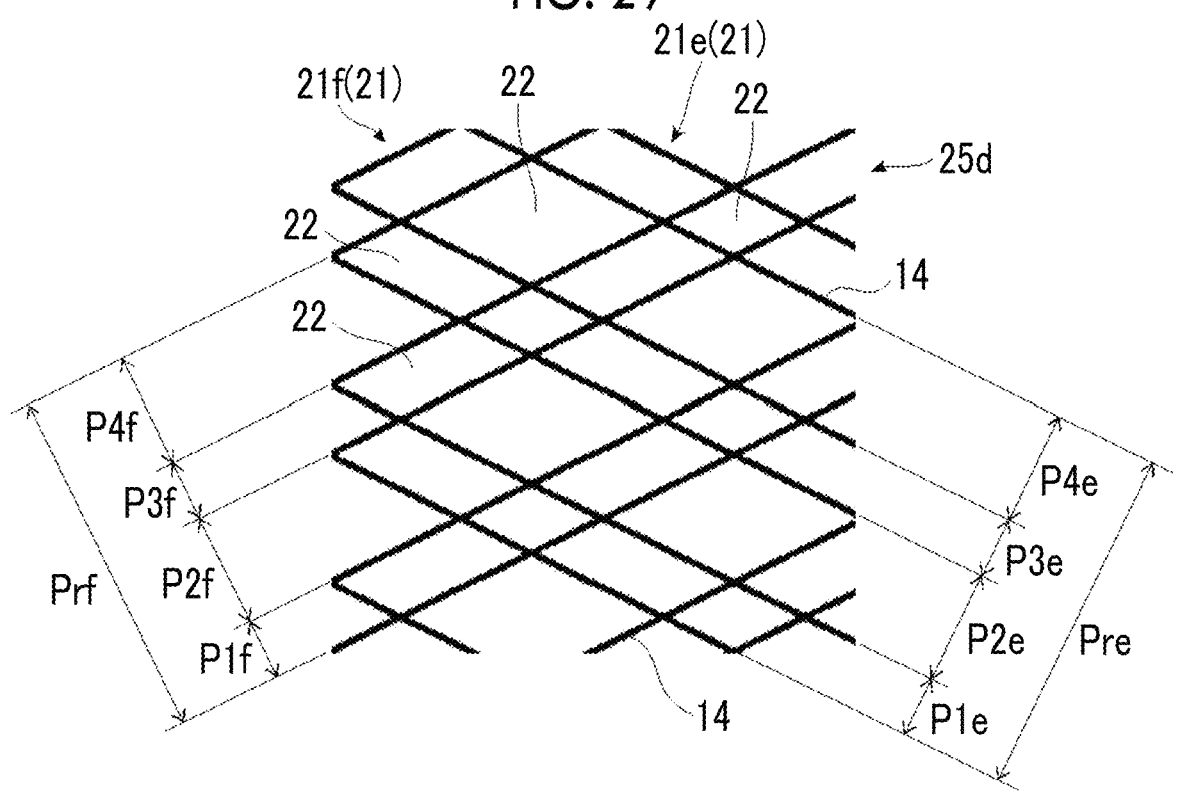
FIG. 29 is a plan view schematically showing a reference example of a wiring pattern of a wiring portion of the conductive film shown in FIG. 1.

It should be noted that, for example, as shown in the reference example of FIG. 29, the wiring pattern 25d having the second requirement applied to the embodiment of the present invention is a wiring pattern including: a wiring pattern in which straight line wirings 21 each being composed of a plurality of thin metal wires 14 arranged in parallel in one direction are overlapped in two or more directions; and a non-equal pitch wiring pattern, in which the repetitive pitches of the predetermined number of the thin metal wires 14 are equal pitches and the respective pitches of the predetermined number of the thin metal wires 14 are non-equal pitches in the straight line wiring 21 in at least one direction. The wiring pattern 25d is a wiring pattern which is optimized in terms of moiré visibility with respect to the pixel array pattern having a predetermined luminance of the display unit.

Figure 30:
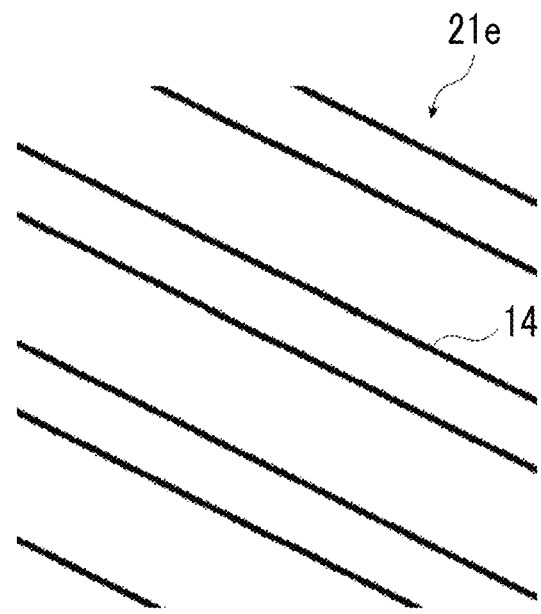
FIG. 30 is a plan view schematically showing a non-equal pitch wiring pattern in straight line wiring of the wiring pattern in one direction shown in FIG. 29.
Figure 31:
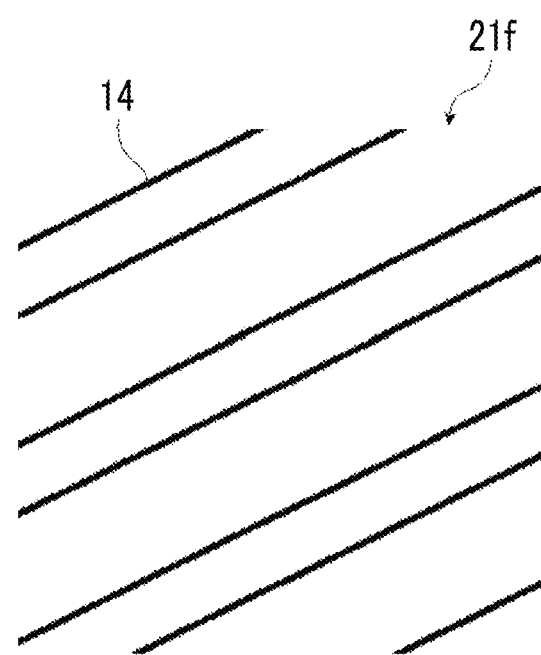
FIG. 31 is a plan view schematically showing a non-equal pitch wiring pattern in a straight line wiring of the wiring pattern in another direction shown in FIG. 29.

Here, the wiring pattern 25d shown in FIG. 29 is a mesh-shaped wiring pattern in which wirings are arranged in a mesh shape by overlapping a straight line wiring 21e being composed of a plurality of thin metal wires 14 arranged in parallel in one direction shown in FIG. 30 and a straight line wiring 21f being composed of the plurality of thin metal wires 14 arranged in parallel in another direction shown in FIG. 31.

The wiring pattern 25d shown in FIG. 29 is a non-equal pitch wiring patterns in which each of the respective straight line wiring 21e and 21f has a repetitive pitch Pre or Prf of four thin metal wires 14. The repetitive pitches Pre and Prf are equal pitches (Pre and Prf are constant values), and the pitches P1e, P2e, P3e, and P4e of the four thin metal wires 14 of the straight line wiring 21e are non-equal pitches (among P1e, P2e, P3e, and P4e, at least two pitches are different). At the same time, the wiring pattern is a non-equal pitch wiring patterns in which the pitches P1f, P2f, P3f, and P4f of the respective four thin metal wires 14 of the straight line wiring 21f are non-equal pitches (at least two pitches among P1f, P2f, P3f, and P4f are different). Further, the repetitive pitches Pre and Prf of the four thin metal wires 14 of the straight line wirings 21e and 21f are equal (Pre=Prf), and the respective pitches of the four thin metal wires 14 of the straight line wirings 21e and 21f are also equal (P1e=P1f, P2e=P2f, P3e=P3f, and P4e=P4f). That is, the wiring pattern 25d is a wiring pattern that does not satisfy the first requirement of the embodiment of the present invention but satisfies only the second requirement.

As shown in FIG. 29, the wiring pattern 25d is a mesh-shaped wiring pattern in which the opening portions (cells) 22 each having a predetermined shape are arranged. The opening portions 22 are formed by intersecting the plurality of thin metal wires 14 with each other by overlapping the straight line wiring 21*e* and the straight line wiring 21*f* which are non-equal pitch wiring patterns.

Therefore, it can be said that the mesh-shaped wiring pattern 25*d* is a wiring pattern in which a plurality of opening portions 22, which have a plurality of types of parallelogram shapes having predetermined angles kept therebetween in plan view and having different pitches (accordingly, sizes), are successively connected in two directions forming the predetermined angle.

In the straight line wirings 21*e* and 21*f* of the mesh-shaped wiring pattern 25*d* shown in FIG. 29, the repetitive pitches of the four thin metal wires 14 are equal pitches, and the respective pitches of the four thin metal wires 14 are non-equal pitches. However, the present invention is not limited to this, and the repetitive pitches of the predetermined number of the thin metal wires 14 may be equal pitches, and the respective pitches of the predetermined number of the thin metal wires 14 may be non-equal pitches. Since the minimum number of the thin metal wires 14 that can be formed in the non-equal pitch is 2, the predetermined number is 2 or more. Further, the predetermined number is preferably 64 or less, more preferably 32 or less, and still more preferably 16 or less. A particularly preferable predetermined number is 2 or more and 8 or less. The reason for this is that, as will be described later, the minimum frequency of the straight line wirings 21 becomes lower and the straight line wirings 21 themselves becomes more visible as the predetermined number of non-equal pitches is increased. Further, the reason for this is that, as the predetermined number is increased, the frequency components of the straight line wirings 21 is more finely spread, as a result, a large number of fine moiré components are generated, and no matter how the pitches of the predetermined number of the thin metal wires 14 is optimized, it may be difficult to keep all of a large number of moirés away from each frequency component of the pixel array pattern. In the embodiment of the present invention, it is not necessary that all the pitches of the predetermined number of thin metal wires 14 are different, and pitches of at least two thin metal wires 14 of the predetermined number of the thin metal wires 14 may be different.

Further, in the example shown in FIG. 29, the straight line wirings 21 each being composed of the plurality of thin metal wires 14 arranged in parallel in one direction has two directions of the straight line wirings 21*e* and 21*f*. However, the present invention is not limited to this, and the straight line wirings 21 in three or more directions may be overlapped. In addition, the number of directions of the straight line wirings 21 having different overlapping directions is preferably 8 or less, more preferably 4 or less, and still more preferably two directions. The reason for this is that, as described above, there is an upper limit to the number of the thin metal wires 14 per unit area in order to secure the transmittance. Therefore, the smaller the number of directions of the straight line wirings 21, the more the number of the thin metal wires 14 per one direction, and as a result, the wiring pitches of the thin metal wires 14 can be narrowed such that moiré is hardly likely to occur. Further, as the wiring pitches of the thin metal wires 14 are narrower, the more freely the pitches of the predetermined number of the thin metal wires 14 can be optimized and the moiré can be reduced within a range in which visibility of the straight line wirings 21 themselves is not affected. On the other hand, in order to prevent loss of the function of the conductive film as the touch sensor, it is necessary for the number of directions of the straight line wirings 21 to be at least two directions, and thus two directions are most desirable.

In the example shown in FIG. 29, since the straight line wirings 21*e* and 21*f* of which the repetitive pitches are equal are overlapped in two directions, the unit of each repetitive pitch becomes a rhomboid. It is premised that the wiring pattern of the embodiment of the present invention satisfies the first requirement. That is, in a wiring pattern in which straight line wirings are overlapped in two directions, it is premised that the repetitive pitches in the two directions are different. The unit of each repetitive pitch is a parallelogram.

Further, in the example shown in FIG. 29, the mesh-shaped wiring pattern 25*d* is a non-equal pitch wiring pattern in which repetitive pitches of predetermined number (4) of thin metal wires 14 are equal pitches and pitches of the predetermined number (4) of the thin metal wires 14 are non-equal pitches in the straight line wirings 21 in the two directions of the straight line wirings 21*e* and 21*f*. However, the present invention is not limited to this. In the embodiment of the present invention, wiring patterns having different directions in the non-equal pitch wiring pattern in which the repetitive pitches of the predetermined number of the thin metal wires 14 are equal pitches and the respective pitches of the predetermined number of the thin metal wires 14 are non-equal pitches may be only the straight line wiring 21 in one direction (either one of the straight line wirings 21*e* and 21*g*), as in the wiring pattern 25*e* shown in FIG. 32A. Further, although not shown, all the straight line wirings 21 in three or more directions each may be a non-equal pitch wiring pattern in which the repetitive pitches of the predetermined number of the thin metal wires 14 are equal pitches and the respective pitches of the predetermined number of the thin metal wires 14 are non-equal pitches.

Figure 32A:
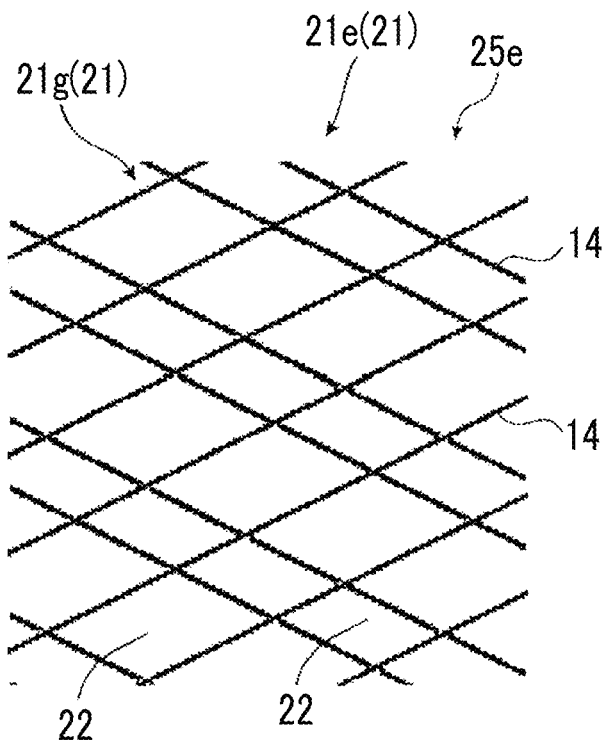
FIG. 32A is a plan view schematically showing another example of a wiring pattern of a wiring portion of the conductive film shown in FIG. 1.
Figure 32B:
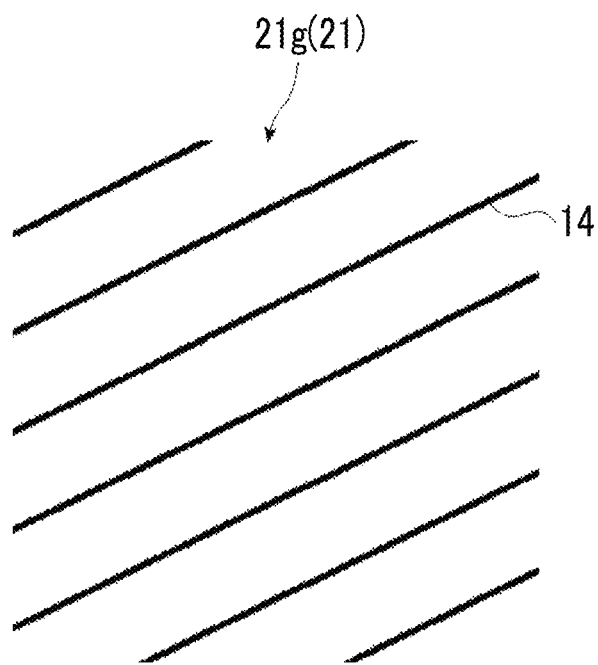
FIG. 32B is a plan view schematically showing an equal pitch wiring pattern in a straight line wiring of the wiring pattern in another direction shown in FIG. 32A.

The wiring pattern 25*e* shown in FIG. 32A is a mesh-shaped wiring pattern in which the straight line wiring 21*e* and the straight line wiring 21*g* are overlapped and arranged in a mesh shape. In the straight line wiring 21*e*, the repetitive pitches of the predetermined number (4) of thin metal wires 14 arranged in parallel in one direction shown in FIG. 30 are equal pitches, and the pitches of the predetermined number (4) of the thin metal wires 14 are non-equal pitches. The straight line wiring 21*g* is composed of a plurality of thin metal wires 14 arranged in parallel in one direction shown in FIG. 32B.

Therefore, it can be said that the wiring pattern 25*e* includes a non-equal pitch wiring pattern of the straight line wiring 21*e*, and is a wiring pattern in which a plurality of opening portions 22, which have a plurality of types of parallelogram shapes having predetermined angles kept therebetween in plan view and having different pitches (accordingly, sizes), are successively connected in two directions forming the predetermined angle.

It should be noted that, needless to say, the number of the straight line wirings 21 having different directions, in which the repetitive pitches of the predetermined number of thin metal wires 14 are equal pitches and the respective pitches of the predetermined number of thin metal wires 14 are non-equal pitches, is equal to or less than the number of directions of straight line wirings overlapped in different directions but preferably equal to the number of directions of straight line wirings overlapped in different directions. That is, it is preferable that the repetitive pitches of the predetermined number of thin metal wires 14 in the straight line wirings 21 overlapped in all the directions are equal pitches, and the pitches of the predetermined number of the thin metal wires 14 are non-equal pitches. The reason for this is as follows. As will be described later, in the straight line wirings 21 in the respective directions, each of the predetermined number of the thin metal wires 14 has a non-equal pitch so as to cancel out the frequency components that cause moiré. Thereby, moiré can be reduced rather than that in the case of setting the equal pitches. Thus, it is preferable to reduce moiré by setting the non-equal pitches so as to cancel out the frequency components that cause moiré in the straight line wirings 21 in all directions. Further, in the embodiment of the present invention, the repetitive pitches of the predetermined number of the thin metal wires 14 to be non-equal pitches, the respective pitches of the thin metal wires 14, and the predetermined numbers thereof may be equal in all directions or may be different in the respective directions.

In the straight line wirings 21 (21e, 21f, and 21g) of the wiring patterns 25d and 25e, assuming that the average pitch obtained by dividing the repetitive pitches by the predetermined number is 100%, non-equal pitches of at least two thin metal wires 14 among the predetermined number of the thin metal wires 14 of which the repetitive pitches are equal pitches are preferably 10% or more or 190% or less in order to make the straight line wirings 21 themselves invisible, and are preferably 99% or less or 101% or more in order to obtain an effect of reducing moiré. That is, it is preferable that the non-equal pitches of at least two thin metal wires are 10% or more and 99% or less, or 101% or more and 190% or less in order to obtain the effect of reducing moiré without making the straight line wirings 21 themselves visible.

Further, the variation of the predetermined number of repetitive pitches is preferably within ±20%, more preferably within ±10%, and still more preferably within ±5%.

The present embodiment is characterized in a non-equal pitch wiring pattern. In the pattern, in a straight line wiring in at least one direction, the repetitive pitches of the predetermined number of the thin metal wires are equal pitches, and the pitches of at least two thin metal wires among the respective pitches of the predetermined number of thin metal wires are non-equal pitches. In this case, as described above, by setting the pitches of the thin metal wires to non-equal pitches, the minimum frequency of the wiring pattern becomes lower than that in the case of equal pitch. Thus, it should be taken into account that it is necessary to make the wiring pattern not visible. Therefore, the average pitch is preferably 300 µm or less, more preferably 200 µm or less, still more preferably 150 µm or less, in order to sufficiently optimize the pitch and reduce moiré within a range that does not affect visibility of the wiring pattern.

(Principle of Moiré Reduction by Setting Repetitive Pitches of Predetermined Number of Wirings as Equal Pitches and Setting Respective Pitches of Predetermined Number of Wirings as Non-Equal Pitches)

From the above-described principle of moiré occurrence, in a case where the frequency of each frequency component of the wiring pattern can be set apart from the frequency of each frequency component of the pixel array pattern, it can be seen that a low-frequency moiré visually perceived by human eyes does not occur. Here, description will be given of the following. The moiré can be reduced by the configuration in which "the repetitive pitches of the predetermined number of wirings are set as equal pitches and the respective pitches of the predetermined number of wirings are set as non-equal pitches".

Figure 33:
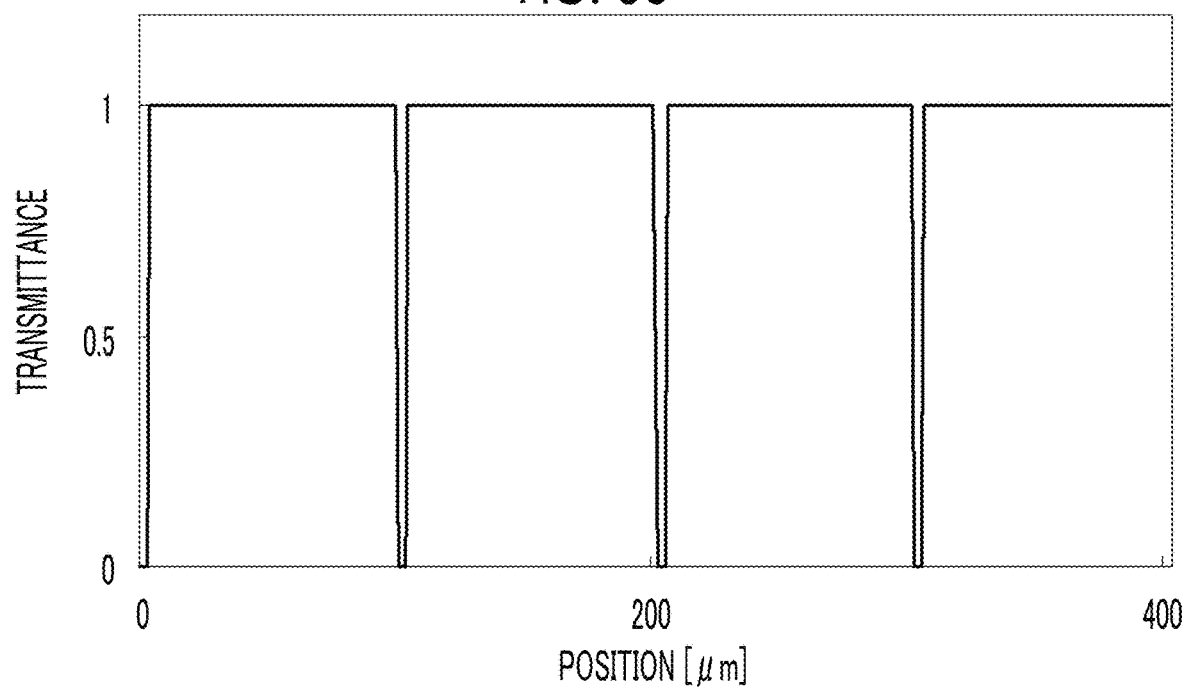
FIG. 33 is a 1-dimensional profile of the transmittance of four wirings of the wiring pattern shown in FIG. 12.
Figure 34:
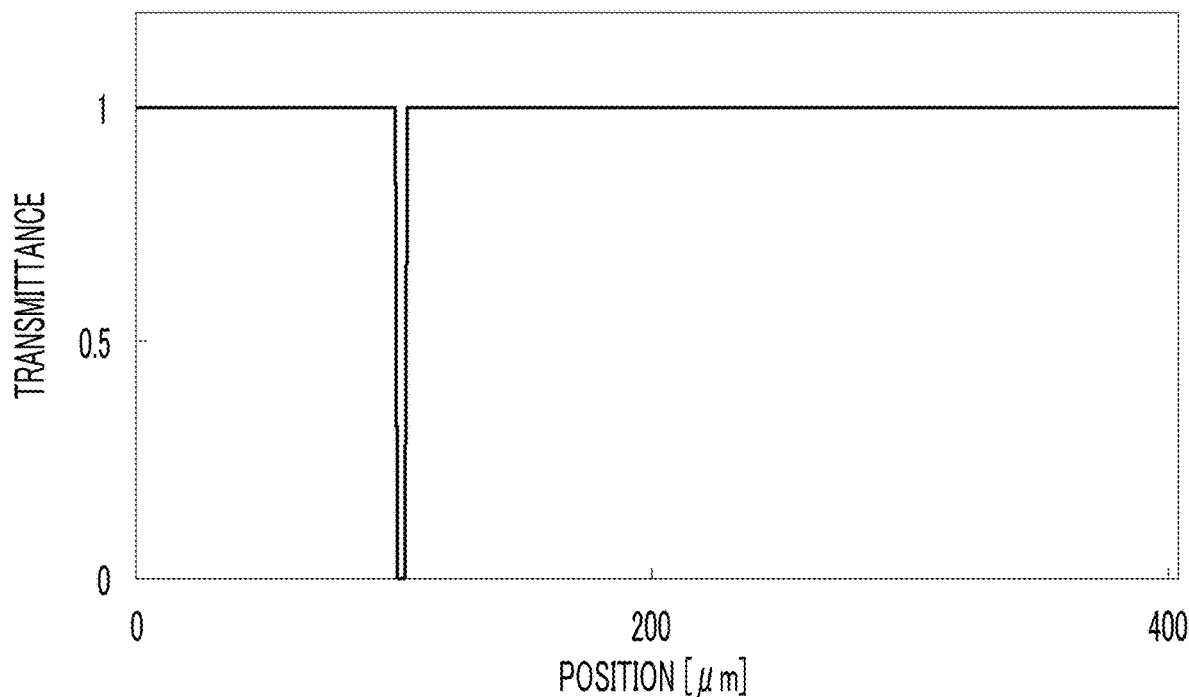
FIG. 34 is a 1-dimensional profile of the transmittance of the second wiring of the four wirings shown in FIG. 33.

The wiring pattern shown in FIG. 12 will be described as a typical example. As the straight line wiring in one direction, that is, the straight line wiring 21d1 in the right direction or the straight line wiring 21d2 in the left direction is viewed along the direction of the wiring in the wiring pattern (transmittance pattern of the wiring) shown in FIG. 12, the straight line wiring is as shown in FIG. 33. In FIG. 33, there are four wirings. As might be expected, all the respective pitches of the four wirings are equal pitches, which are 101 µm. Although only four wirings are shown in FIG. 33, there are wirings after this and the pitches thereof are naturally 101 µm. Here, only the second wiring in FIG. 33 is extracted and the extracted portion is shown in FIG. 34. The second wiring is repeated with a pitch of 404 µm for four wirings.

Figure 35:
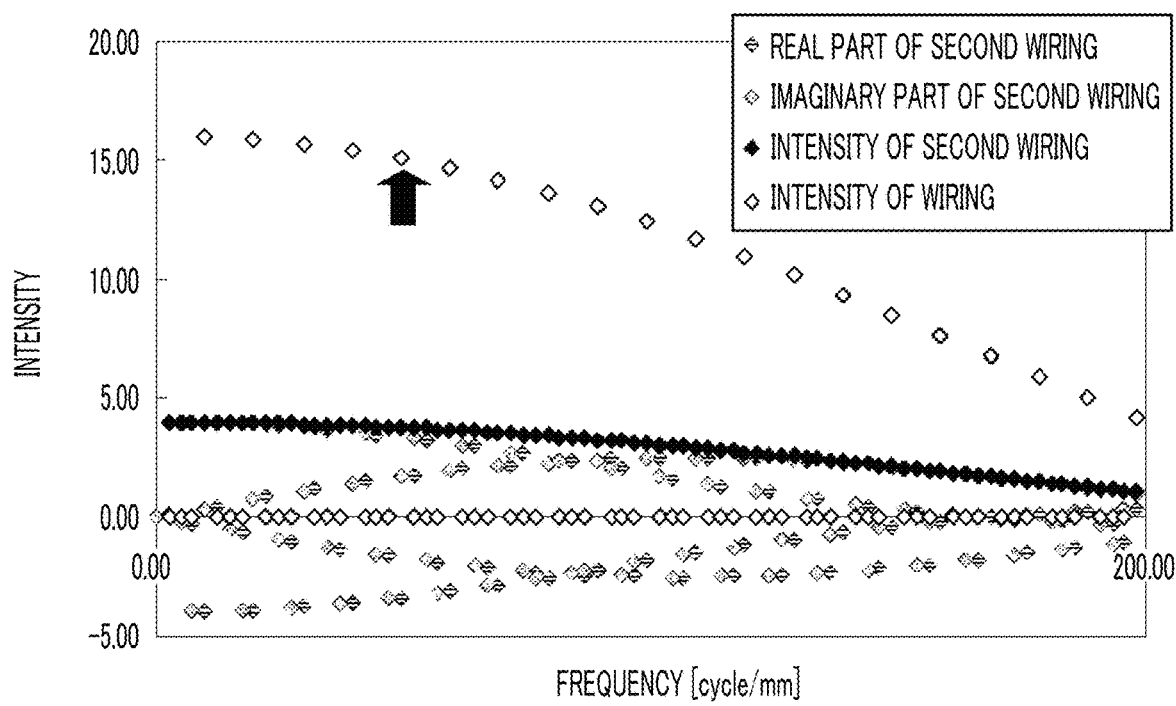
FIG. 35 is a diagram showing a 1-dimensional frequency distribution of the wiring pattern shown in FIG. 33.

Here, FIG. 35 shows a 1-dimensional frequency distribution of the wiring patterns shown in FIGS. 33 and 34. It can be seen from FIG. 35 that the second extracted wiring has four times more (finer) frequency components than the original wiring, and the minimum frequency thereof is lower (¼) than that of the original wiring. Since the pitch of the second extracted wiring is four times longer than that of the original wiring, the frequency components are present at frequencies four times finer, and the minimum frequency thereof is also ¼ times lower. While the second extracted wiring has four times more frequency components than the original wiring, the number of the frequency components of the original wiring is small. The reason for this is that the respective frequency components of the second extracted wiring and the respective frequency components of the other wiring cancel each other. That is, each of the first wiring, the second wiring, the third wiring, and the fourth wiring has four times more frequency components than the original wiring. However, in a case where all the frequency components of those wirings are added, only a component of a specific frequency (a frequency that is an integer multiple of the frequency corresponding to the pitch of the original wiring) is added and can be enhanced to remain, and the components of other frequencies cancel each other and become the frequency components of the original wiring. The addition in the frequency space may be subtraction (addition of a negative value) depending on the phase relationship of the components to be added, and thus the components may cancel each other. The addition in the frequency space is performed by separately adding the real parts and the imaginary parts of the respective components. However, each of the real parts and the imaginary parts may have a negative value depending on the phase (refer to FIG. 35), and thus the parts may cancel each other.

Here, the present inventor has found that the frequency distribution of the wirings can be changed by setting the respective pitches of the predetermined number of wirings to be non-equal pitches while setting the repetitive pitches of the predetermined number of wirings to be equal pitches. This point will be described in the above-described example (example in which the predetermined number is four). The intensity of each frequency component of the first wiring, the third wiring, and the fourth wiring is the same as the intensity of the second wiring indicated by each black dot (rhomboid) in FIG. 35. Even in a case where the position of each wiring is changed (that is, even in a case where the pitch of each wiring is changed), the repetitive pitch of the four lines does not change. Therefore, the intensity of the second wiring is the same as that of the second wiring indicated by the black dots in FIG. 35 without change in intensity of each frequency component. However, in a case where the position of each wiring is changed (in a case where the pitch of each wiring is changed), the values of the real part and the imaginary part of each frequency component change as the phase changes. In a case where the position of the second wiring is changed, the values of the real part and the imaginary part shown in FIG. 35 change. This change is able to change the frequency distribution of the result obtained by adding the frequency components of the first wiring, the second wiring, the third wiring, and the fourth wiring.

Since the component indicated by the black arrow in FIG. 35 is close to the frequency component of the black arrow in the pixel array pattern of FIG. 14, a low-frequency moiré visible to the human eye occurs as shown in FIG. 17.

Therefore, optimization of the positions (pitches) of the first wiring, the second wiring, the third wiring, and the fourth wiring was examined such that the component indicated by the black arrow in FIG. 35 becomes small. The results are shown in FIGS. 36 and 37.

Figure 36:
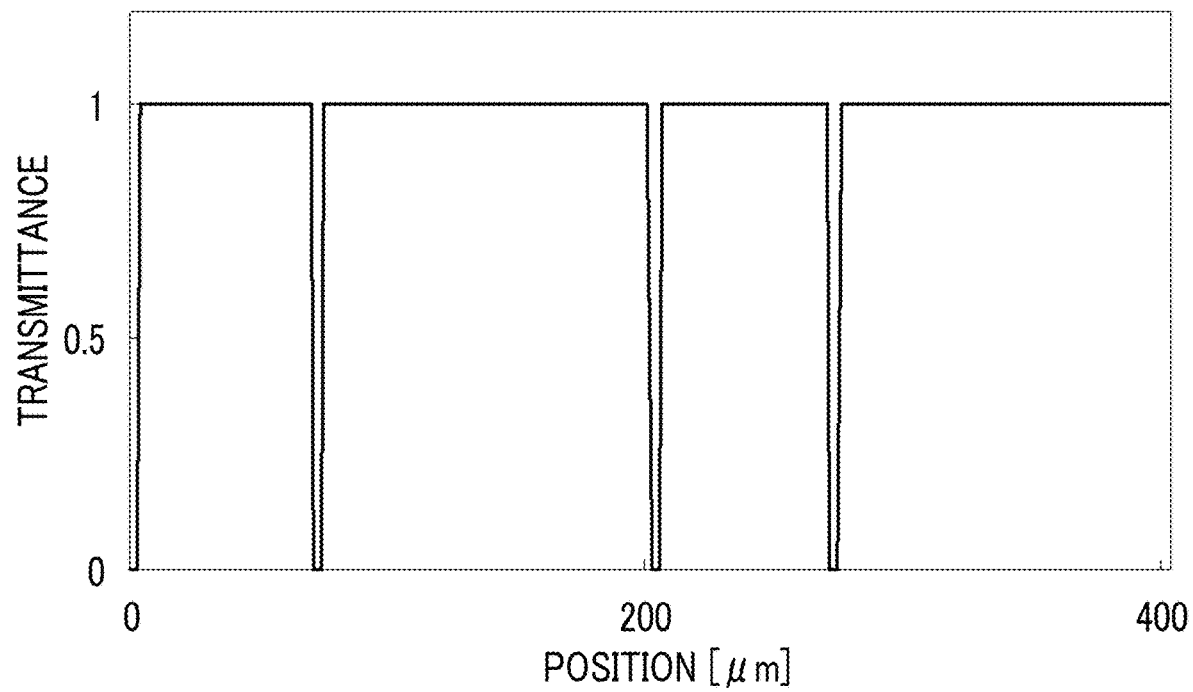
FIG. 36 is a 1-dimensional profile of the transmittance of four wirings, which is the optimization result shown in FIG. 29.
Figure 37:
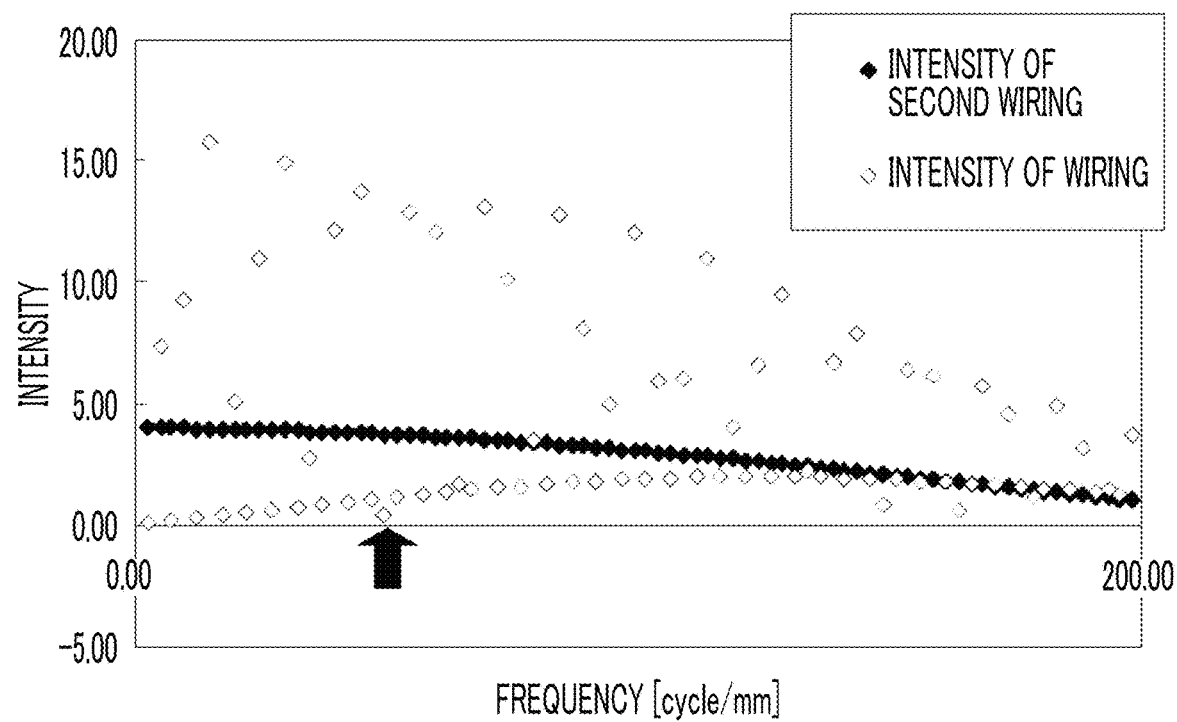
FIG. 37 is a diagram showing a 1-dimensional frequency distribution of the wiring pattern shown in FIG. 36.

FIG. 36 is a 1-dimensional profile of the transmittances of the four wirings as an optimization result. FIG. 37 shows a frequency distribution. It can be clearly seen from FIG. 37 that the intensity of the frequency component indicated by the black arrow can be reduced.

Figure 38:
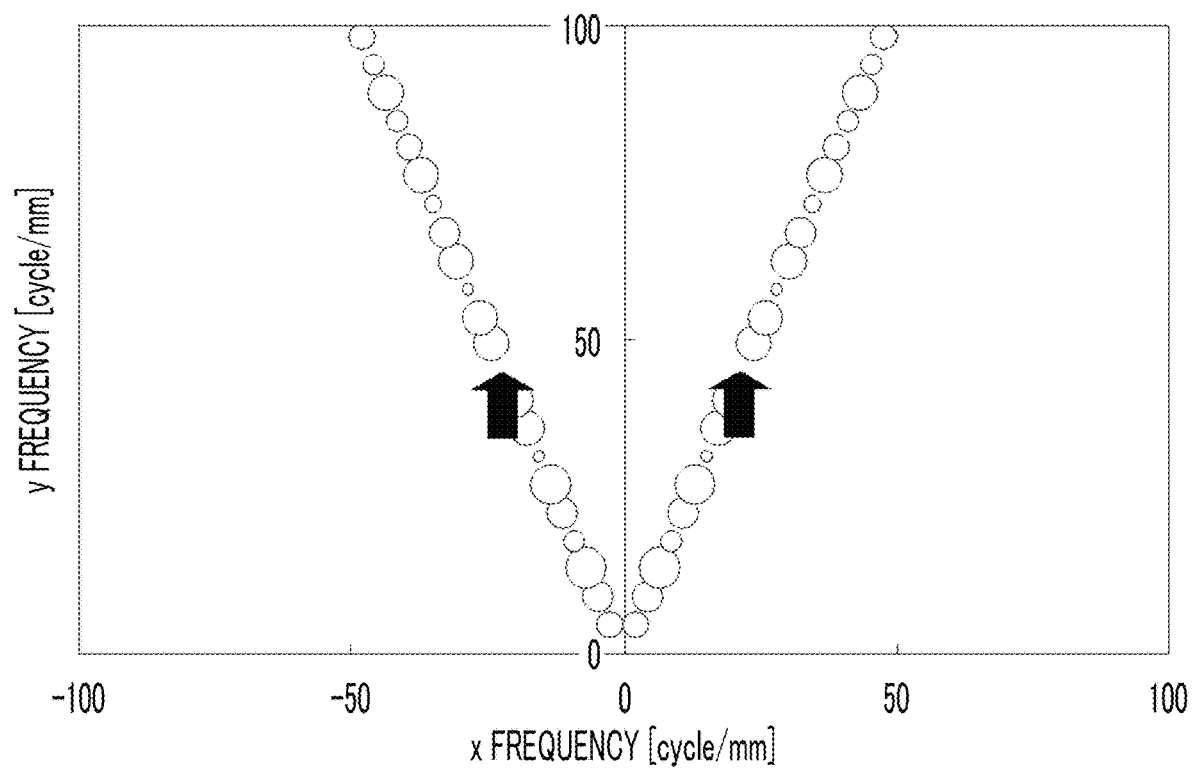
FIG. 38 is a diagram showing a 2-dimensional frequency distribution of the wiring pattern shown in FIG. 29.

Further, FIG. 29 shows the transmittance pattern of the wiring as the optimization result. In the wiring pattern shown in FIG. 29, the repetitive pitches of the four wirings are 404 µm, which is the same as those in FIGS. 12 and 13. FIG. 38 is a 2-dimensional frequency distribution of the wiring pattern shown in FIG. 29, where the intensity of each frequency component is indicated by the area of the circle. It can be seen that in the frequency distribution of the pixel array pattern in FIG. 14, the intensity of the component (indicated by the black arrow) close to the component indicated by the black arrow is smaller than that in FIG. 15.

Figure 39:
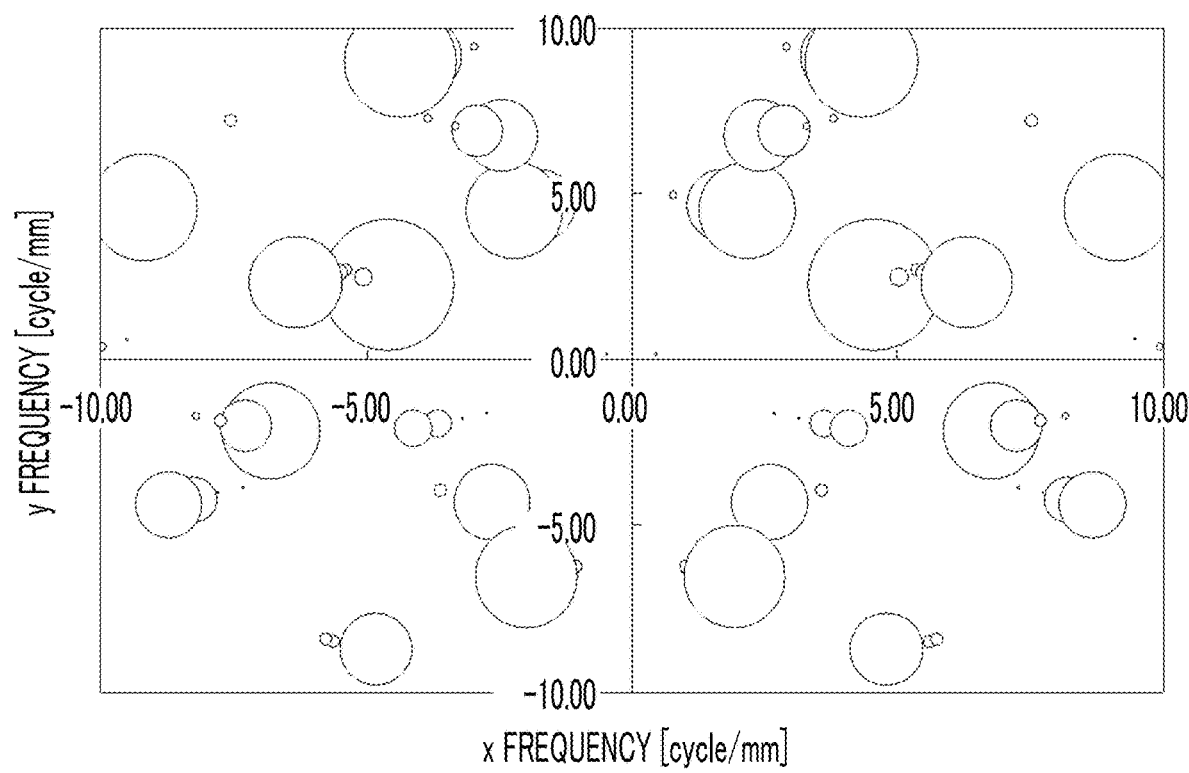
FIG. 39 is a diagram in which each frequency component of the pixel array pattern shown in FIG. 14 and a moiré component calculated from each frequency component of the wiring pattern shown in FIG. 29 are plotted.

FIG. 39 shows each frequency component of the pixel array pattern shown in FIG. 14 and the moiré component calculated from each frequency component of the wiring pattern shown in FIG. 29. The result of multiplying each moiré component shown in FIG. 39 by the visual transfer function VTF indicating the sensitivity of the human eye's visual response characteristics shown by Expression (1) is the same as that shown in FIG. 23. It can be seen from FIG. 23 that there is no low-frequency moiré as shown in FIG. 17. It should be noted that in FIGS. 15 and 38, FIGS. 16 and 39, and FIGS. 17 and 23, the magnitudes of intensities respectively indicated by the areas of the circles of components are the same.

Here, as can be seen by comparing FIG. 35 and FIG. 37 and comparing FIG. 15 and FIG. 38, the wiring pattern, in which "the repetitive pitches of the predetermined number of wirings are set as equal pitches, and the respective pitches of the predetermined number of wirings are set as non-equal pitches", has a smaller minimum frequency than the equal pitch wiring. For example, in a case where the predetermined number is 4, as shown in FIGS. 36 and 29, the minimum frequency is ¼. The reason can be described as follows. As described above, each of the first to fourth wirings shown in FIG. 35 has four times more frequency components than the original equal pitch wiring, and the minimum frequency thereof is also ¼. In a case where the frequency components of these wirings are added, at equal pitches, only frequencies that are integer multiples of the frequencies corresponding to the pitch of the original wiring (a pitch of ¼ of the first to fourth wirings) are added and can be enhanced to remain, and the components of other frequencies cancel each other.

However, as described above, in a case where the pitches of the first to fourth wirings are set to non-equal pitches, the components remain without being canceled. As described above, a low-frequency component of the wiring pattern occurs as compared with the equal pitch wiring. Thus, it should be taken into account that it is necessary to make the wiring pattern not visible. For that purpose, in Expression (7) representing the pattern in which the pixel array pattern and the wiring pattern are overlapped, not only the moiré component of the expression in the fourth row, but also "each frequency component of the wiring pattern multiplied by the average luminance A0 of the pixel array pattern" in the expression in the third row may be evaluated. Specifically, in a case of deriving the moiré component of FIG. 39 from each frequency component of the pixel array pattern of FIG. 14 and each frequency component of the wiring pattern of FIG. 38, a component of the frequency 0 may be included in the frequency distribution of the pixel array pattern (corresponding to A0 in Expression (7)). Each moiré component shown in FIG. 39 is a moiré component derived in such a manner by adding the component of the frequency 0 to the frequency distribution of the pixel array pattern. The moiré components shown below also mean "a moiré component derived by adding a component of the frequency 0 to the frequency distribution of the pixel array pattern" unless otherwise specified.

The principle of moiré reduction described above will be described once again. First, assuming that the predetermined number of wiring patterns is n, each wiring pattern (herein referred to as a sub-wiring pattern) in which only the first wiring, . . . , and the nth wiring are extracted will be considered. Each sub-wiring pattern has n times finer and more frequency components than the original wiring pattern (4 times in FIG. 35), and includes a frequency component that causes low-frequency moiré visible to the human eye in the vicinity of each frequency component of the pixel array pattern. The sub-wiring patterns are overlapped at equal pitch (corresponding to the original wiring pattern), and each frequency component can be canceled and reduced most, and the minimum frequency can be increased. On the other hand, the frequency component that causes moiré included in each sub-wiring pattern remains (in FIG. 35, the largest one is indicated by a black arrow). Therefore, by overlapping the sub-wiring patterns with pitches that cancel out the frequency components included in the respective sub-wiring patterns that cause moiré, the number of frequency components becomes greater than that in the case of overlapping with the equal pitches, and the minimum frequency thereof is lowered, but moiré can be reduced. The above is the principle of moiré reduction.

Here, the present invention is characterized in the wiring pattern which has the moiré frequency distributions shown in FIGS. 39 and 23 with respect to the moiré frequency distributions of the equal pitch wiring pattern shown in FIGS. 16 and 17 and in which "the predetermined number of repetitive pitches are equal pitches and the predetermined number of respective pitches are non-equal pitches".

The wiring pattern has a "predetermined number of repetitive pitches at equal intervals", and is characterized in that the sum of moirés becomes smaller compared to the frequency distribution of the moiré in such a case of the equal pitch wiring patterns shown in FIGS. 16 and 17, as shown in the frequency distribution of moiré in FIGS. 39 and 23. As described in FIG. 35, the larger the number of non-equal pitches, the lower the minimum frequency. Therefore, the wiring pattern may be visible. Similarly, as can be seen from FIG. 35, as the number of non-equal pitches increases, the frequency components of the sub-wiring patterns become finer. Among the frequency components, many frequency components, which cause low-frequency moirés visible to the human eye are included therein. Thus, it may be difficult to optimize the such pitches that these frequency components cancel each other.

Therefore, it is desirable to reduce the number of non-equal pitches as much as possible. According to an experiment conducted by the present inventor, the number of moirés that can be reduced by setting the pitches of the predetermined number of wirings to non-equal pitches is 16 or less at most as compared with the equal pitch wiring pattern. Even in a case where the pitches of the 16 or more wirings are set as non-equal pitches, the moiré reduction effect does not change or becomes worse, while the wiring pattern itself is easily visible. In most cases, the effect of reducing moiré is maximized in a case where the number of wirings having non-equal pitch is about 2 to 8, and does not change or becomes worse even in a case where the number of wirings is further increased. Therefore, in order to sufficiently reduce moiré without making the wiring pattern visible, it is desirable that the number of non-equal pitches is 16 or less at most. The examples shown in FIGS. 36 and 37 are examples in which the optimization of the pitches of the four wirings was studied. However, as a result, the repetitive pitches of the two wirings are approximately equal pitches. That is, the examples show that the same moiré reduction effect can be obtained by optimizing the pitches of the two wirings.

By the way, it is preferable that the wiring pattern of the wiring portion is a wiring pattern of a straight line wiring in a direction, in which the average pitch is the narrowest is the non-equal pitch wiring pattern, among the straight line wirings in two or more directions.

(Application Example of Present Invention in Wiring Pattern in which Repetitive Pitches of Predetermined Number of Wirings are Set as Equal Pitches and Respective Pitches of Predetermined Number of Wirings are Set as Non-Equal Pitches)

Next, description will be given below of an example in which the present invention is applied to, as another embodiment of the present invention, the second requirement "the wiring pattern in which straight line wirings in two or more directions are overlapped, and the non-equal pitch wiring pattern in which the repetitive pitches of the predetermined number of the thin metal wires are equal pitches and the respective pitches of the predetermined number of the thin metal wires are non-equal pitches in the straight line wiring 21 in at least one direction".

Figure 40:
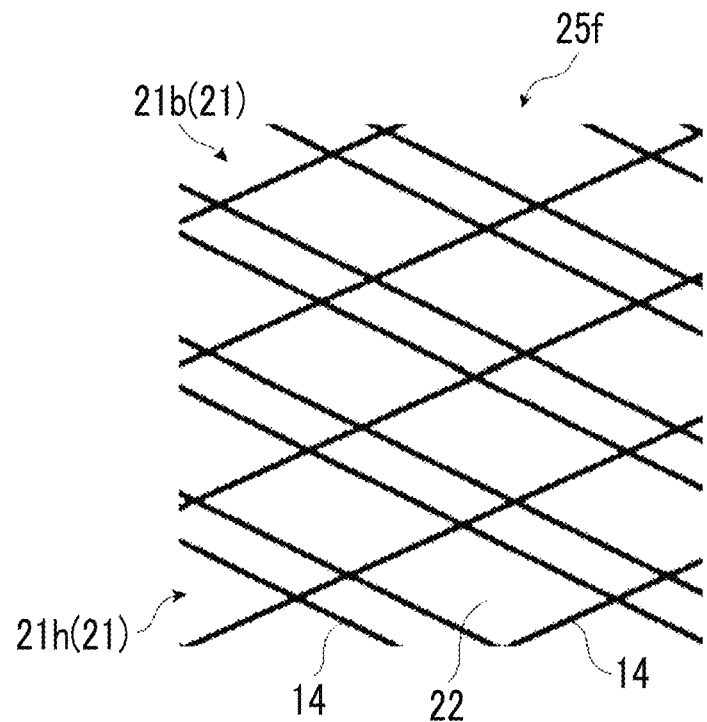
FIG. 40 is a plan view schematically showing another example of a wiring pattern of a wiring portion of the conductive film shown in FIG. 1.
Figure 41:
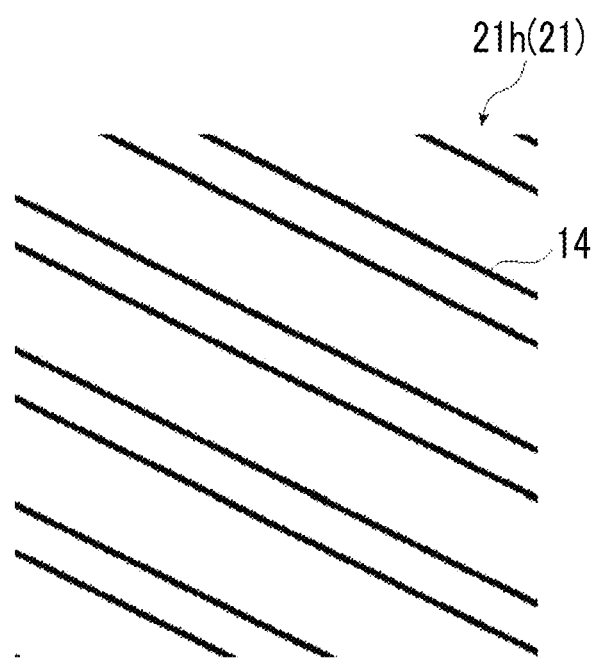
FIG. 41 is a plan view schematically showing a non-equal pitch wiring pattern in the straight line wiring of the wiring pattern in one direction shown in FIG. 40.

FIG. 40 shows the wiring pattern 25f of the third example in which the present invention is applied to the second requirement "a non-equal pitch wiring pattern in which the repetitive pitches of the predetermined number of the thin metal wires are equal pitches and the respective pitches of the predetermined number of thin metal wires are non-equal pitches". In the wiring pattern 25f shown in FIG. 40, the rightward straight line wiring 21h (refer to FIG. 41) has substantially the same average pitch as the rightward straight line wiring 21a of FIGS. 2 and 3, and the four wirings are set at non-equal pitches. On the other hand, the leftward straight line wiring 21b is the same as the leftward straight line wiring 21b (FIG. 4) of FIG. 2. It is needless to say that the first requirement is satisfied, unlike the average pitch of the rightward straight line wiring 21h shown in FIG. 41 and the average pitch of the leftward straight line wiring 21b shown in FIGS. 2 and 4. That is, the wiring pattern 25f shown in FIG. 40 satisfies both the first requirement and the second requirement described above.

Figure 42:
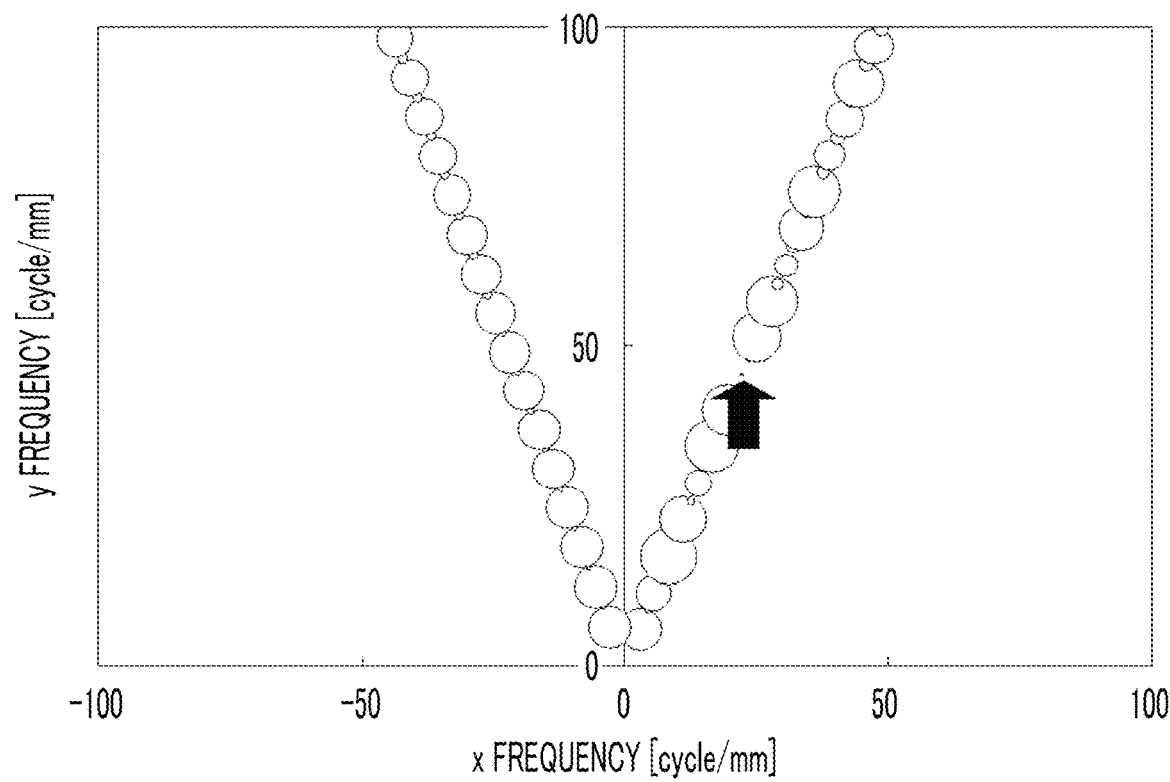
FIG. 42 is a diagram of a 2-dimensional frequency distribution of the wiring pattern shown in FIG. 40.
Figure 43:
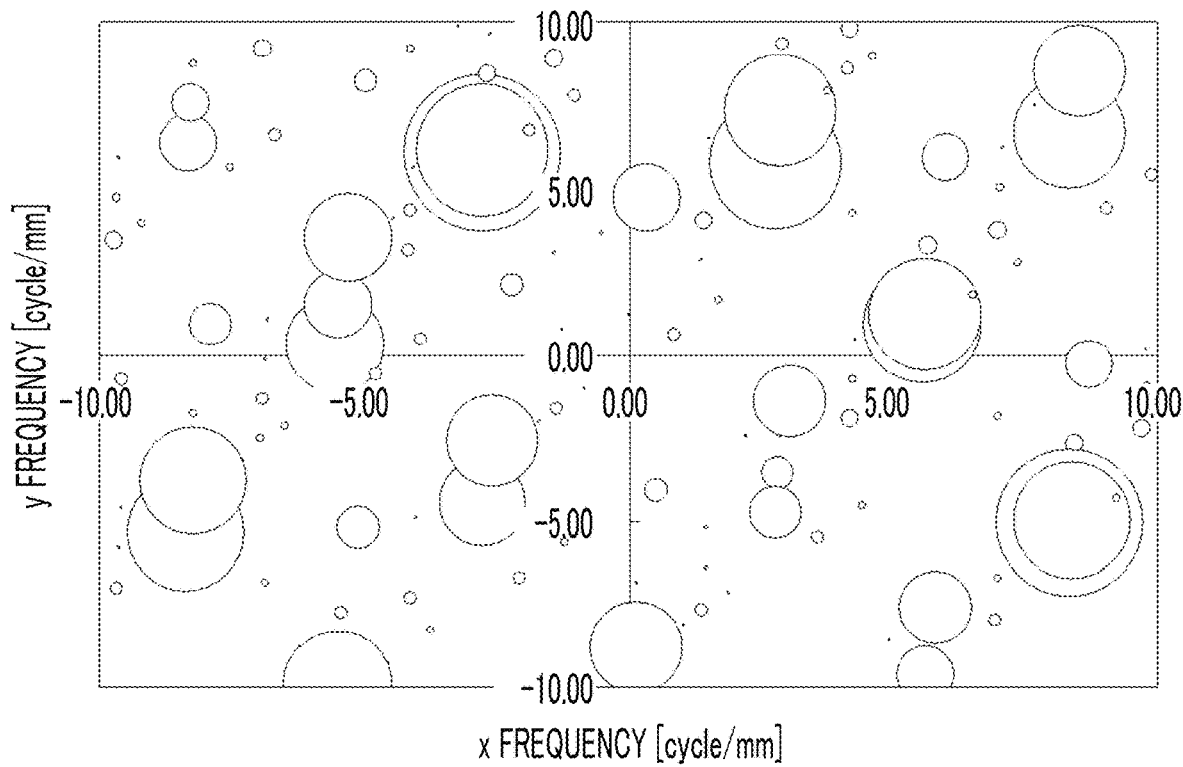
FIG. 43 is a diagram in which moiré components calculated from frequency components of the pixel array pattern shown in FIG. 14 and frequency components of the wiring pattern shown in FIG. 42 are plotted.
Figure 44:
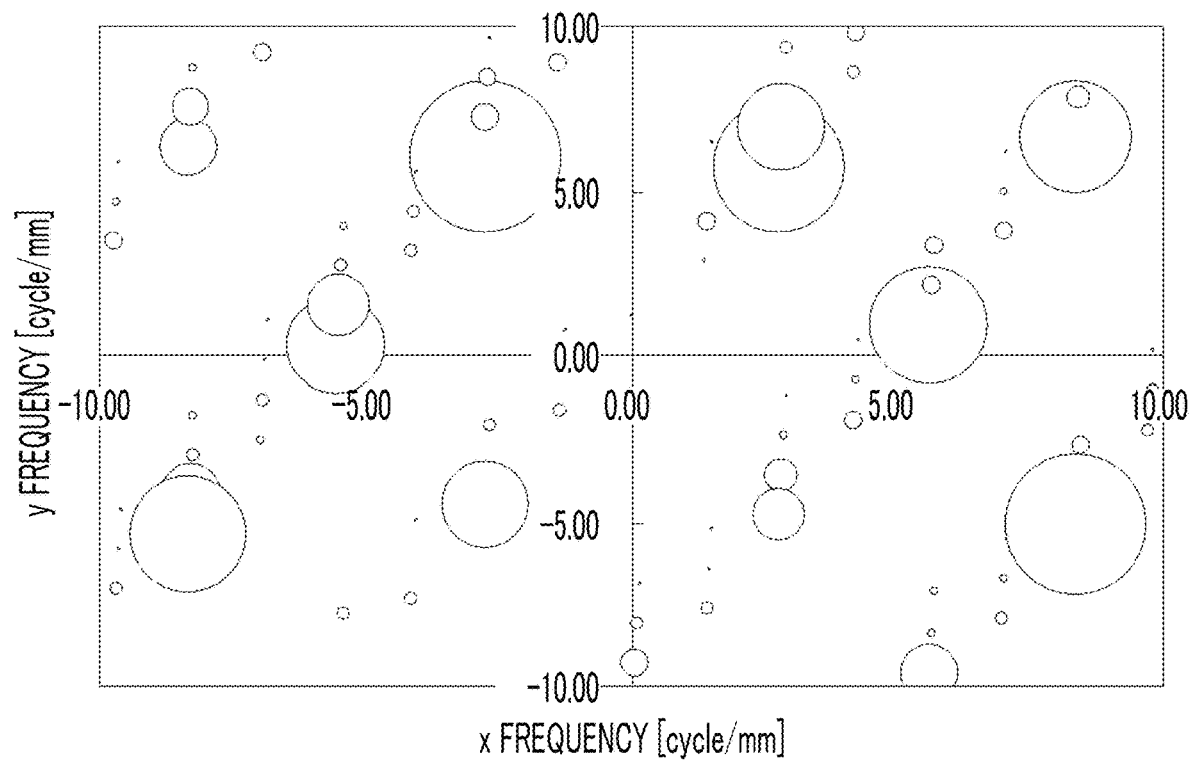
FIG. 44 is a moiré component calculated on the basis of the straight line wiring shown in FIG. 41 among the moiré components shown in FIG. 43.

FIG. 42 is a diagram of a 2-dimensional frequency distribution of the wiring pattern 25f shown in FIG. 40. FIG. 43 is a frequency distribution of moiré of the wiring pattern 25f shown in FIG. 40, and is a diagram in which the moiré components calculated from the frequency components of the pixel array pattern shown in FIG. 14 and the frequency components of the wiring pattern shown in FIG. 42 are plotted. FIG. 44 is a frequency distribution of the moiré components based on only the rightward straight line wiring 21e. The magnitudes of the intensities indicated by the areas of the circles of the components are the same in the frequency distributions of the wiring patterns shown in FIGS. 42 and 19 and in the moiré frequency distributions shown in FIGS. 43, 44, 20, 21, and 22.

Here, the low-frequency moiré in the moiré frequency distribution based only on the rightward straight line wiring 21h (refer to FIG. 41) shown in FIG. 44 is smaller than the low-frequency moiré in the moiré frequency distribution based on only the rightward straight line wiring 21a (refer to FIG. 3) shown in FIG. 21.

Figure 45:
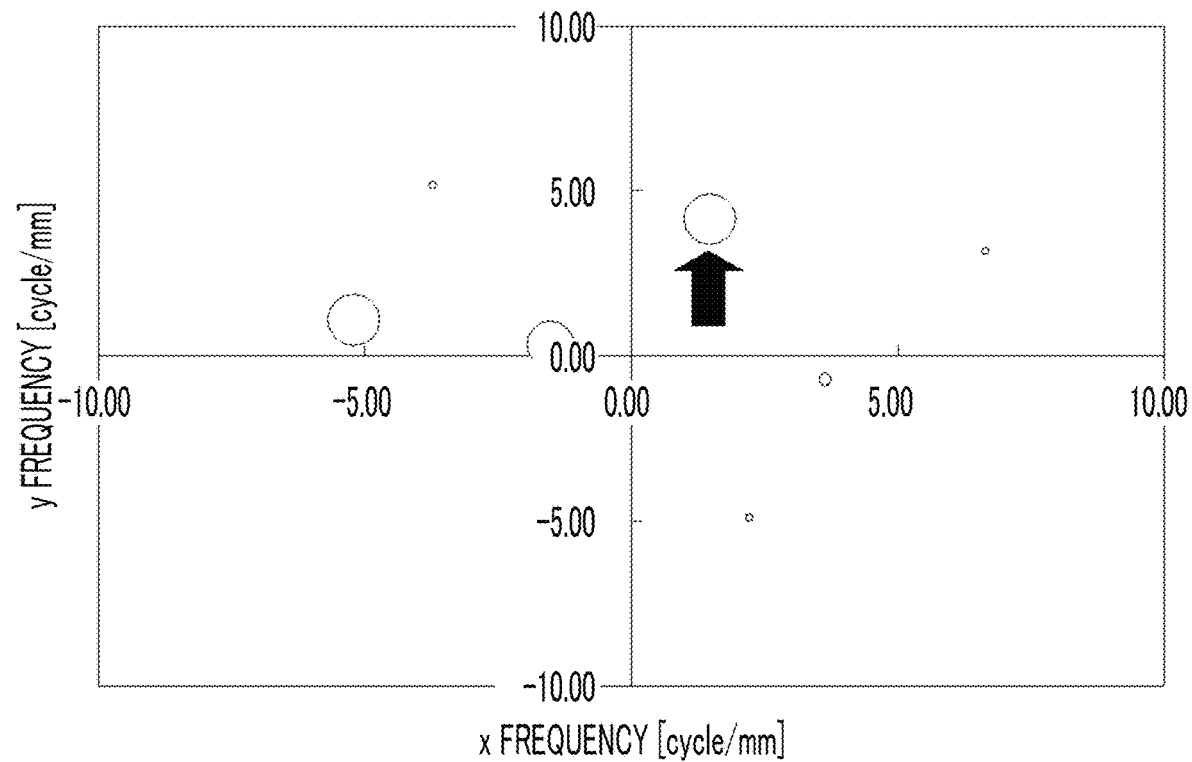
FIG. 45 is a diagram showing a result of multiplying each moiré component shown in FIG. 21 by the sensitivity of the human eye's visual characteristics.
Figure 46:
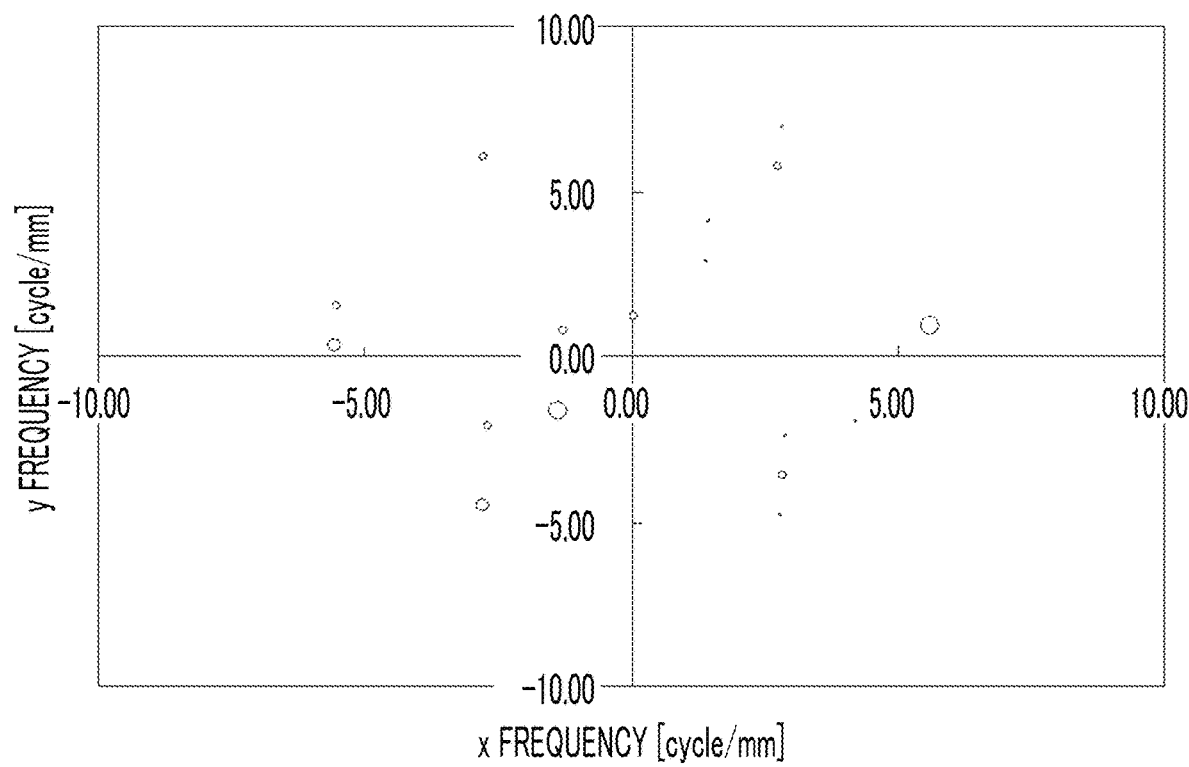
FIG. 46 is a diagram showing a result of multiplying each moiré component shown in FIG. 44 by the sensitivity of the human eye's visual characteristics.

Further, FIG. 45 shows distribution obtained by multiplying the moiré component of FIG. 21 by the VTF of Expression (1). FIG. 46 shows distribution obtained by multiplying the moiré component of FIG. 44 by the VTF of Expression (1). It can be seen that the sum of moiré components in FIG. 46 is smaller than the sum of moiré components in FIG. 44.

As described above, by applying the embodiment of the present invention also to "the non-equal pitch wiring pattern in which the repetitive pitches of the predetermined number of wirings are set as equal pitches and the respective pitches of the predetermined number of wirings are set as non-equal pitches", moiré can be further reduced. In FIG. 40, "the non-equal pitch wiring pattern in which the repetitive pitches of the predetermined number of wirings are set as equal pitches and the respective pitches of the predetermined number of wirings are set as non-equal pitches" is applied to only the wiring pattern in the right direction. However, it is needless to say that the non-equal pitch wiring pattern may be applied to the wiring pattern in the left direction.

However, as described above, in a case where the wiring has such a non-equal pitch wiring pattern, a low-frequency component occurs in the frequency of the wiring. Therefore, in a case where the wiring pattern having the non-equal pitch in the direction in which the average wiring pitch is as narrow as possible is applied, there is more room for changing the pitch within the range where the wiring is not visible to the human eye. Accordingly, there is more room for reducing moiré.

In addition, in the case of the wiring pattern 25f of the third example shown in FIG. 40, as in the case of the wiring pattern 25d shown in FIG. 29, it is considered that moiré is reduced by making four wirings have non-equal pitches. However, as in the case of the wiring pattern 25d shown in FIG. 29, as a result, the repetitive pitches of the two wirings are approximately equal pitches. That is, it can be seen that the same moiré reduction effect can be obtained by optimizing the pitches of the two wirings.

(Summary of Characteristics of Wiring Pattern of Embodiment of Present Invention and Method of Producing Wiring Pattern)

The characteristics of the wiring pattern of the embodiment of the present invention will be summarized below, and the method of producing the wiring pattern of the conductive film of the embodiment of the present invention will be described.

To summarize the characteristics of the wiring pattern of the embodiment of the present invention, the wiring pattern of the embodiment of the present invention has the following characteristics.

There is a wiring pattern in which straight line wirings in two or more directions are overlapped.

The wiring pitch differs in at least two directions.

The wiring pattern of the embodiment of the present invention also has the following characteristics.

The sum of moiré components (moiré evaluation value) derived from the luminance pattern of the pixel array and the separate-direction non-equal pitch wiring pattern is less than the moiré evaluation value of the omnidirectional-equal pitch wiring pattern in which the directions of the respective wirings are the same and the number of wirings per unit area is the same.

In the above characteristic, "the number of wirings per unit area is the same" means that n/p=1/p1+1/p2+ . . . +1/pn is satisfied. Here, n is the number of directions, and is the same in the wiring pattern of the embodiment of the present invention and the omnidirectional-equal pitch wiring pattern. p is the pitch of the omnidirectional-equal pitch wiring pattern. p1, p2, . . . , and pn represent average pitches in the direction 1, the direction 2, . . . , and the direction n of the wiring pattern of the embodiment of the present invention.

Here, the above-mentioned moiré component is a moiré component obtained by applying human eye's visual response characteristics. To act on the human eye's visual response characteristics means to multiply by the visual transfer function VTF (Dooley-Shaw expression) represented by Expression (1). The observation distance d in Expression (1) is any distance in the range of 100 mm to 1000 mm. Here, the observation distance is preferably 300 mm to 800 mm. However, in the example of the embodiment of the present invention, the observation distance was set to 500 mm.

Here, in the past visual sense research, an experimental result showing that "visibility of a pattern in which a plurality of frequencies is overlapped is not a linear sum of visibilities of the frequencies but a non-linear sum" is obtained. Therefore, in the embodiment of the present invention, as a method of obtaining a moiré evaluation value from each moiré component, a method of "deriving a nonlinear sum of intensities of the moiré components" is used. In the past visual sense research, generally the following two types of models have been proposed and these methods are used.

After converting the intensities of the moiré components through a non-linear function (assuming a conversion function (transducer function) from luminance contrast to psychological contrast), the sum (linear sum) thereof is derived as the moiré evaluation value. Here, since various conversion expressions such as the expression proposed by Hamerly et al. or Wilson et al. have been proposed as a non-linear conversion function (transducer function), any one of these expressions is used for conversion.

Alternatively, the stochastic addition values of the intensities of the moiré components are derived as the moiré evaluation values. Here, the moiré evaluation value I is derived using Expression (2), which is proposed by Quick et al., as a stochastic addition expression.

$$I=(\Sigma(R[i])^x)^{1/x} \qquad (2)$$

Here, R[i] indicates the intensity of the i-th frequency component of the moiré, that is, each moiré component after VTF multiplication (refer to FIGS. 17, 23, 28, 45, and 46). The stochastic addition order x employs a certain value in the range of 1 to 4, which has been proposed as an order that fits well with the visual experiment results in the past visual sense research. Here, in a case where the order x=1, Expression (2) means that the sum (linear sum) of the intensities of the moiré components is derived as the moiré evaluation value. Even in this case, since it was possible to produce a separate-direction non-equal pitch wiring pattern with less moiré than the omnidirectional-equal pitch wiring pattern, the order x=1 is also employed. As the typical order x, the order x=2 presented by Quick is employed.

Among the moiré components after VTF multiplication (refer to FIGS. 17, 23, 28, 45, and 46), the component having the highest intensity is defined as the main moiré component, the main moiré component based on the separate-direction non-equal pitch wiring pattern of the embodiment of the present invention is defined as a non-equal pitch main moiré component, and the main moiré component based on the omnidirectional-equal pitch wiring pattern in which the directions of the respective wirings are the same and the number of wirings per unit area is the same is defined as an equal pitch main moiré component. With such definitions, the wiring pattern of the embodiment of the present invention also has one of the following characteristics.

The intensity of the non-equal pitch main moiré component is smaller than that of the equal pitch main moiré component.

The sum of moiré components in the frequency range equal to or less than the frequency of the equal pitch main moiré component is smaller than that of the omnidirectional-equal pitch wiring pattern.

The frequency of the non-equal pitch main moiré component is higher than that of the equal pitch main moiré component.

Further, the frequency component of the wiring pattern that causes the main moiré component is defined as the main wiring frequency component, the main wiring frequency component of the separate-direction non-equal pitch wiring pattern of the embodiment of the present invention is defined as the non-equal pitch main wiring frequency component, and the main wiring frequency component of the omnidirectional-equal pitch wiring pattern in which the directions of the respective wirings are the same and the number of wirings per unit area is the same is defined as the equal pitch main wiring frequency component. With such definitions, the separate-direction non-equal pitch wiring pattern of the embodiment of the present invention also has any of the following characteristics.

The intensity of the non-equal pitch main wiring frequency component is less than that of the equal pitch main wiring frequency component.

The intensity of the frequency components of the equal pitch main wiring is less than that in the omnidirectional-equal pitch wiring pattern.

As described above, in the wiring pattern satisfying the second requirement, according to the findings of the present inventor, the wiring pattern is not visible, and in order to sufficiently reduce moiré, it is desirable to set the number of non-equal pitches to 16 or less at most. As one of the reasons why the moiré reduction effect does not change or worsen even in a case where the number of non-equal pitches is increased more than that in the wiring pattern that satisfies the second requirement, the present inventor consider the following reason. In a case where the number of non-equal pitches is increased, the frequency components of the wiring pattern spread finely, and as a result, a large number of fine moiré components are generated. Thus, no matter how the wiring pitch is optimized, it is difficult to remove all of the large number of moiré components from the low frequency range visible to the human eye (to keep all of the frequency components of the large number of wiring patterns away from the frequency components of the pixel array pattern).

The separate-direction non-equal pitch wiring pattern of the embodiment of the present invention also has the following characteristics.

The sum of moiré components (moiré evaluation value) derived from the luminance pattern of the pixel array and the separate-direction non-equal pitch wiring pattern is less than the moiré evaluation value of the omnidirectional-equal pitch wiring pattern in which the number of directions are the same, the directions of the respective wirings are optional, and the number of wirings per unit area is the same.

Whether or not the wiring pattern has the characteristics of the embodiment of the present invention can be easily specified from the light emission luminance pattern of the pixel array and the transmittance pattern of the wiring. It may be determined whether a requirement for "a wiring pattern in which straight line wirings in two or more directions are overlapped" and a requirement that "the wiring pitches differ in at least two directions" are satisfied. Further, it may be determined whether or not the above characteristics are satisfied by "distribution of the frequency components of the wiring pattern", or "distribution of the moiré components derived from the pixel array pattern and the wiring pattern", or "the pitch of the wiring pattern".

Hereinafter, an implementation method for deriving the wiring pattern of the embodiment of the present invention will be described.

With reference to FIG. 14, as compared with FIGS. 15 to 17 of frequency distribution at the equal pitches in all directions, the wiring pattern of the embodiment of the present invention can be obtained by performing optimization as follows. By various changing the pitches of the wiring pattern in at least two or more directions and deriving the frequency distributions as shown in FIGS. 24 to 28, 19 to 23, and 42 to 46, the moiré components are reduced. The embodiment of the present invention (first requirement) can be obtained by variously changing the pitches and angles of the wiring patterns in two or more directions by trial and error. The second requirement added to the embodiment of the present invention can be obtained in the same manner by variously changing the wiring pitches to be non-equal pitches by trial and error.

However, in the embodiment of the present invention (first requirement), it is necessary to perform the optimization within a range in which the number of wirings per unit area is not greater than the upper limit, that is, a range in which (1/p1+1/p2+ . . . +1/pn) is not greater than the upper limit, where p1, p2, . . . , and pn are the average pitches of the direction 1, the direction 2, . . . , and the direction n.

Hereinafter, the producing method of the wiring pattern of the conductive film of the embodiment of the present invention for obtaining an optimum wiring pattern automatically will be described. That is, the method of automatically optimizing the wiring pattern of the conductive film of the embodiment of the present invention will be described.

FIG. 47 shows a flow of a method of producing a wiring pattern of a conductive film of the embodiment of the present invention.

First, in Step S10, the luminance pattern of the pixel array of the display is provided in advance. The luminance pattern of the pixel array may be image data captured by a microscope or the like, or may be created by performing convolution of the digital data of the pixel array pattern and an appropriate blurring function. The blurring function is preferably determined on the basis of the degree of blurring of the luminance pattern of the pixel array of the image having captured the displayed image on the display. In addition, as might expected, it is desirable that the luminance pattern of the pixel array provided herein reproduces the luminance pattern in a case where this pixel array actually emits light. In other words, in a case of using image data captured by a microscope or the like as the luminance pattern of the pixel array, or in a case of determining the blurring function of the luminance pattern of the pixel array from the image captured by the microscope, it is desirable that the effect of blurring caused by the imaging system such as the microscope is small. In other words, it is desirable to perform imaging through a system capable of capturing images sufficiently including and not reducing the high-frequency component of the luminance pattern in a case where this pixel array actually emits light. In a case where the high-frequency component of the luminance pattern of the pixel array is reduced due to blurring caused by the imaging system in the captured image, it is desirable that the image data that compensates for the reduction is used as the luminance pattern of the pixel array or the blurring function is determined from the compensated image data.

Further, in Step S10, it is preferable to derive the 2-dimensional frequency distribution in advance.

Next, in Step S12, the direction i is set to 1 (i=1).

Next, in Step S14, the average wiring pitch and angle in the direction i of the wiring pattern of the conductive film are acquired.

Next, in Step S16, processing of calculating the moiré value of the non-equal pitch wiring pattern is performed by the method described below.

Next, in Step S18, the calculated moiré value and non-equal pitch information are stored in a memory or the like in association with the average wiring pitch and angle by the method described below.

Next, in Step S20, it is determined whether or not there is an average wiring pitch and angle in the direction i to be acquired.

In a case where there is an average wiring pitch and angle in the direction i to be acquired (YES), the processing returns to Step S14, the average wiring pitch and angle in the required direction i is acquired, and steps S14 to S20 are repeated. This loop means a loop in which the average wiring pitch and angle are variously changed.

On the other hand, in a case where there is no average wiring pitch and angle in the direction i to be acquired (NO), the processing proceeds to Step S22.

The moiré value calculation processing of the non-equal pitch wiring pattern in Step S16 means processing of calculating the moiré value of the non-equal pitch wiring pattern in which "the repetitive pitches of the predetermined number of thin metal wires are equal pitches and the respective pitches of the predetermined number of the thin metal wires are non-equal pitches" which satisfies the second requirement on the premise that the wiring pattern satisfies the first requirement of the invention and further satisfies the second requirement. The "non-equal pitch information" in Step S18 means the information about the non-equal pitches of the non-equal pitch wiring pattern that satisfies the second requirement. As might expected, even in a case of a wiring pattern that satisfies only the first requirement of the embodiment of the present invention and does not satisfy the second requirement (that is, the pitches of the thin metal wires in the straight line wiring 21 in each direction are the equal pitches), it is possible to automatically obtain an optimum wiring pattern through a simpler method. Here (and in the producing method of FIG. 47), the producing method will be described on the premise that the wiring pattern satisfies the first requirement of the embodiment of the present invention and further satisfies the second requirement. In addition, a case in which the wiring pattern satisfies only the first requirement and does not satisfy the second requirement will also be described as appropriate.

In Step S22, it is determined whether the direction i is n (i=n) (whether the direction i remains).

In a case where the direction i is not n (i≠n) (NO), the direction i is set to i+1 (i=i+1) in Step S24, the processing returns to Step S14, and steps S14 to S20 are repeated.

In a case where the direction i is n (i=n) (YES), the processing proceeds to Step S26.

Next, in Step S26, the sum of the moiré value in the direction 1, the moiré value in the direction 2, . . . , and the moiré value in the direction n is set as the total moiré value (moiré evaluation value), and the pitch and angle in each direction i, in which the total moiré value is minimized, are derived.

As described above, in the embodiment of the present invention (first requirement), it is necessary to optimize the wiring pattern within a range in which the number of wirings per unit area is not greater than the upper limit from the viewpoint of the transmittance of the wirings, that is, a range in which (1/p1+1/p2+ . . . +1/pn) is not greater than the upper limit where p1, p2, . . . , and pn are respectively the average pitches in the direction 1, the direction 2, . . . , and the direction n. Therefore, in Step S26, (1/p1+1/p2+ . . . +1/pn) is limited to only combinations having a predetermined value or less, and the total moiré value is calculated, thereby deriving the minimum pitch and angle in each direction i.

Thus, the method of producing a wiring pattern of the conductive film of the embodiment of the present invention is completed.

As described above, according to the flow shown in FIG. 47, it is possible to derive combinations of the respective pitches and angles of the direction 1, the direction 2, . . . , and the direction n in which the moiré value is the minimum within the range where the number of wirings per unit area is not greater than the upper limit. In the combinations in which the derived moiré value is the minimum, the pitches in the direction 1, the direction 2, . . . , and the direction n have different values. In addition, the pitches and the angles have different values.

Here, a linear sum may be used as a method of calculating the sum of moiré values in the direction 1, the direction 2, . . . , and the direction n. That is, the sum may be calculated by the following expression.

Moiré Value in Direction 1+Moiré Value in Direction 2+ . . . +Moiré Value in Direction n However, in the non-equal pitch moiré calculation processing, in a case where the moiré value is calculated by the stochastic addition described later, it is desirable that the sum thereof is also calculated by the stochastic addition. That is, it is desirable to calculate the sum by the following expression.

$$((\text{Moiré Value in Direction 1})^x+(\text{Moiré Value in Direction 2})^x+\ldots+(\text{Moiré Value in Direction } n)^x)^{1/x}$$

Here, the order x is set to the same value as the order of stochastic addition in the non-equal pitch moiré value calculation processing.

Further, the angular range in the direction 1, the direction 2, . . . , and the direction n is set to 0 to 180° (the angle formed with the x direction) such that the respective angular ranges do not overlap (do not include the same direction). In a case where there are four directions, for example, the angular range in the direction 1 is set to 0 degrees or more and less than 45 degrees, the angular range in the direction 2 is set to 45 degrees or more and less than 90 degrees, the angular range in the direction 3 is set to 90 degrees or more and 135 degrees or less, and the angular range in the direction 4 is set to more than 135 degrees and 180 degrees or less. In a case where there are two directions, the angular range in the direction 1 is set to 0 degrees or more and less than 90 degrees, and the angular range in the direction 2 is set to 90 degrees or more and 180 degrees or less. Here, in a case where the pixel array pattern is bilaterally symmetric as shown in FIG. 11, the 2-dimensional frequency distribution of the pixel array pattern is also bilaterally symmetric as shown in FIG. 14. Thus, in a case where the moiré value at the bilateral symmetry angle and the non-equal pitch information have already been derived, the information may be diverted to the other bilateral symmetry angle. For example, in a case where there are two directions, the moiré value and the non-equal pitch information are derived for each angle and the average pitch of the angular range of 0 degree or more and less than 90 degrees in the direction 1, and thereafter the information may be diverted to a symmetry angle in an angular range of more than 90 degrees and 180 degrees or less in the direction 2.

Although it takes a long time to search, the angular range of 0 to 180 degrees in all of the direction 1, the direction 2, . . . , and the direction n may be searched for (the angular range to be searched for in each direction may be widened and overlap each other). By allowing overlapping in such a manner and searching for a wide angular range, it is possible to reduce the moiré value as compared to avoiding overlapping. The reason for this is that there may be a plurality of angles in which the moiré value becomes small in a specific angular range. For example, in the angular range of 0 to 180 degrees, in a case where there is an angle with the smallest moiré value in the angular range of 0 degrees or more and less than 45 degrees and there is also an angle with the second smallest moiré value, the angle of the wiring pattern in the direction 1 is set to an angle having the smallest moiré value in the angular range of 0 degree or more and less than 45 degrees, and the angle of the wiring pattern in the direction 2 is set to an angle having the second smallest moiré value in the angular range of 0 degree or more and less than 45 degrees. In such a manner, it is possible to reduce the moiré value as compared with the case where the angle of the wiring pattern in the direction 2 is searched for in an angular range different from the angular range of 0 degree or more and less than 45 degrees. However, in the case of allowing overlapping in such a manner and searching in a wide angular range, finally, it is necessary to pay attention such that the angles of the direction 1, the direction 2, . . . , and the direction n are not the same when a combination of the wiring pitches and angles in the direction 1, the direction 2, . . . , and the direction n in which the total moiré value becomes the minimum is derived.

Further, among the direction 1, the direction 2, . . . , and the direction n, the direction in which the wiring pitch and the angle are changed may be limited. In a case where there are four directions, for example, the angle in the direction 2 is fixed to 67.5 degrees, the angle in the direction 3 is fixed to 112.5 degrees, and the wiring pitches in both the directions 2 and 3 are fixed to a predetermined value, and the wiring pitches and the angles only in the directions 1 and 4 are changed, thereby deriving the combination in which the moiré value becomes the minimum.

Further, it is not necessary to perform the "non-equal pitch moiré value calculation processing" for the direction not including the non-equal pitch, and the moiré value may be calculated for the specified wiring pitch and angle. The method of calculating the moiré value is as described above, but will be briefly described once again. First, a transmittance pattern of the wiring is created at a specified wiring pitch and angle, and a 2-dimensional frequency distribution is derived. Next, the moiré component is derived from the 2-dimensional frequency distribution of the luminance pattern of the pixel array and the 2-dimensional frequency distribution of the transmittance pattern of the wiring. Finally, after each moiré component is multiplied by VTF, the sum is calculated to be set as a moiré value.

In all directions, in a case where the pitches of the thin metal wires in the straight line wirings 21 do not include the non-equal pitches, that is, in a case of the wiring pattern that satisfies only the first requirement of the embodiment of the present invention and does not satisfy the second requirement, the moiré value for the specified wiring pitch and angle may be calculated.

In the following description, three types of implementation methods will be described for the calculation processing of the moiré value of the non-equal pitch wiring pattern (Step S16 in FIG. 47). The calculation processing of the moiré value of the non-equal pitch wiring pattern means processing of calculating the moiré value that satisfies the second requirement on the premise that the wiring pattern satisfies the first requirement of the embodiment of the present invention and further satisfies the second requirement.

(Implementation Method 1 of Moiré Value Calculation Processing for Non-Equal Pitch Wiring Pattern)

Figure 48:
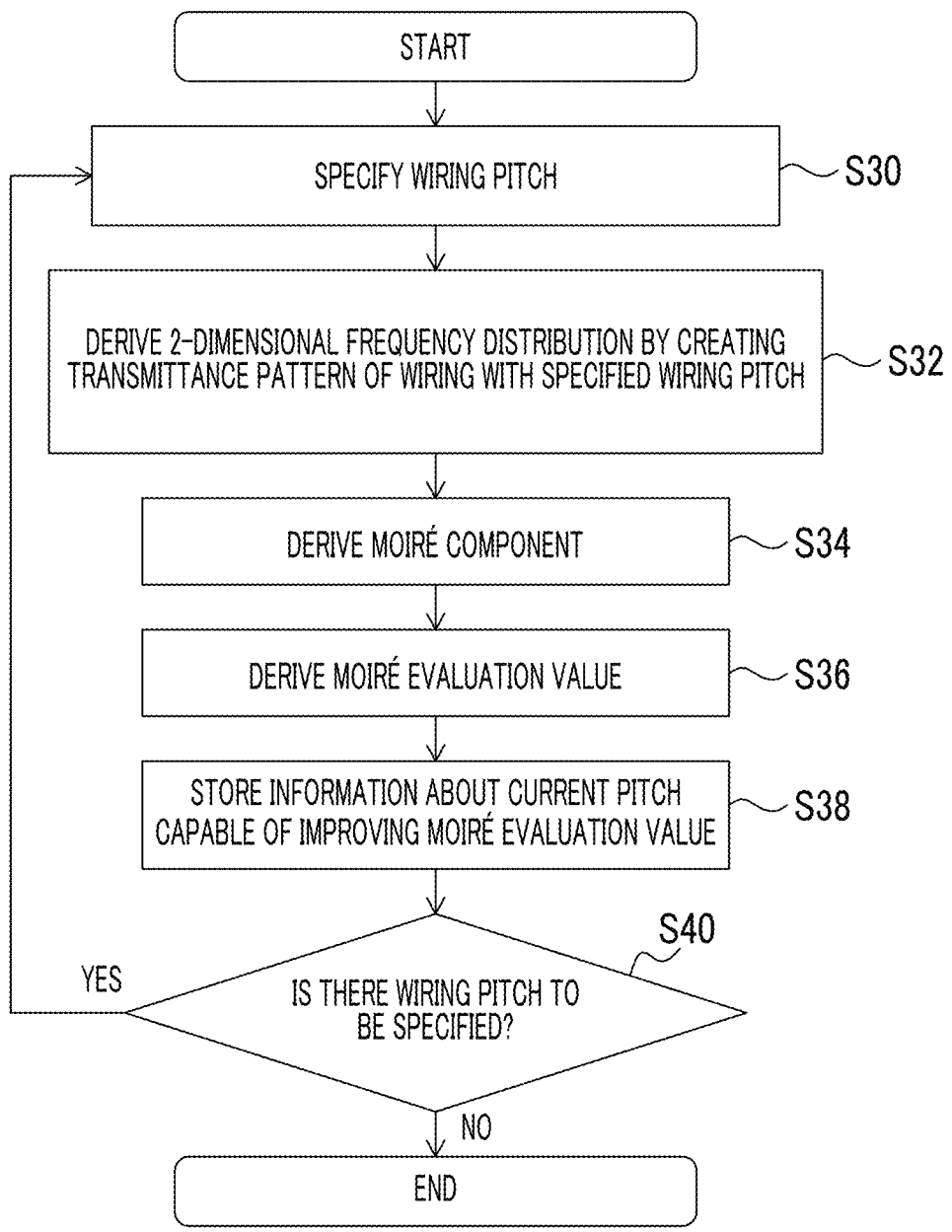
FIG. 48 is a flowchart showing an example of a moiré value calculation processing method of the non-equal pitch wiring pattern according to the embodiment of the present invention.

FIG. 48 shows a flow of Implementation Method 1 of the moiré value calculation processing for the non-equal pitch wiring pattern in the embodiment of the present invention.

In this method, information about a predetermined number of wiring pitches of non-equal pitches is provided in advance, and all the pitches are evaluated.

First, in Step S30, the information about the predetermined number of wiring pitches of non-equal pitches is provided in advance, and the information about the predetermined number of wiring pitches of non-equal pitches is acquired and specified.

Next, in Step S32, the transmittance pattern of the wiring is created at the specified wiring pitch, and the 2-dimensional frequency distribution is derived.

Next, in Step S34, the moiré component is derived using the 2-dimensional frequency distribution of the pixel array pattern and the 2-dimensional frequency distribution of the wiring pattern.

Next, in Step S36, a moiré evaluation value is derived from the moiré component.

Next, in Step S38, in a case where the moiré evaluation value is improved from the stored moiré evaluation value, the improved pitch information is stored.

Next, in Step S40, in the information about the predetermined number of wiring pitches of non-equal pitches provided in advance, in a case where the information about the predetermined number of wiring pitches of non-equal pitches at which the moiré evaluation values are not obtained remains and there is information about the wiring pitches of the predetermined number of non-equal pitches to be specified (YES), the processing returns to Step S30, and steps S30 to S38 are repeated.

In contrast, in a case where there is no information about the predetermined number of wiring pitches of non-equal pitches to be specified (NO), the implementation method 1 of the moiré value calculation processing of the non-equal pitch wiring pattern ends.

The information about the wiring pitches of non-equal pitches (information about non-equal pitches) is easily obtained through a method of giving a random number in a predetermined range to the equal pitch.

In the flow of FIG. 47, the average wiring pitch is changed variously. Therefore, in order to be able to reuse the same non-equal pitch information for each average wiring pitch, it is preferable to provide the non-equal pitch information as information about the ratios of the non-equal pitches to the average pitch. For example, in a case where the predetermined number is 4, the following information is used.

−0.055154472, 1.009144324, 2.087233728, 3.073827362
0.048012206, 0.980814732, 1.931622256, 3.008651204
0.043818677, 0.915255691, 1.956276096, 2.940351965
. . .

The above information is the pitch information in which the pitches of the four wirings from the first wiring are 0, 1, 2, and 3, respectively, and random numbers in the range of −0.1 to +0.1 are given to the pitches. The above information is composed of information about combinations of pitches of the predetermined number of the first to fourth wirings. The greater the number of combinations, the more moiré can be evaluated in non-equal pitch combinations, and the higher the probability of finding a pitch combination with smaller moiré (however, the search time becomes longer). As described above, by providing the pitches as the ratio information, the pitches can be reused for an optional average pitch. For example, at an average pitch of 200 µm, on the basis of pitch information "−0.055154472, 1.009144324, 2.087233728, and 3.073827362", it is possible to obtain a non-equal pitch combination of "−11 µm, 202 µm, 417 µm, and 615 µm". Further, here, as the non-equal pitch combination, the average pitch is multiplied by the pitch information of the ratio, and then the first decimal place is rounded off.

The method of deriving the moiré component and the method of deriving the moiré evaluation value are as described above. As a moiré evaluation value, a method of deriving the sum of the intensities of the respective moiré components after VTF multiplication will be described later.

(Implementation Method 2 of Moiré Value Calculation Processing for Non-Equal Pitch Wiring Pattern)

Figure 49:
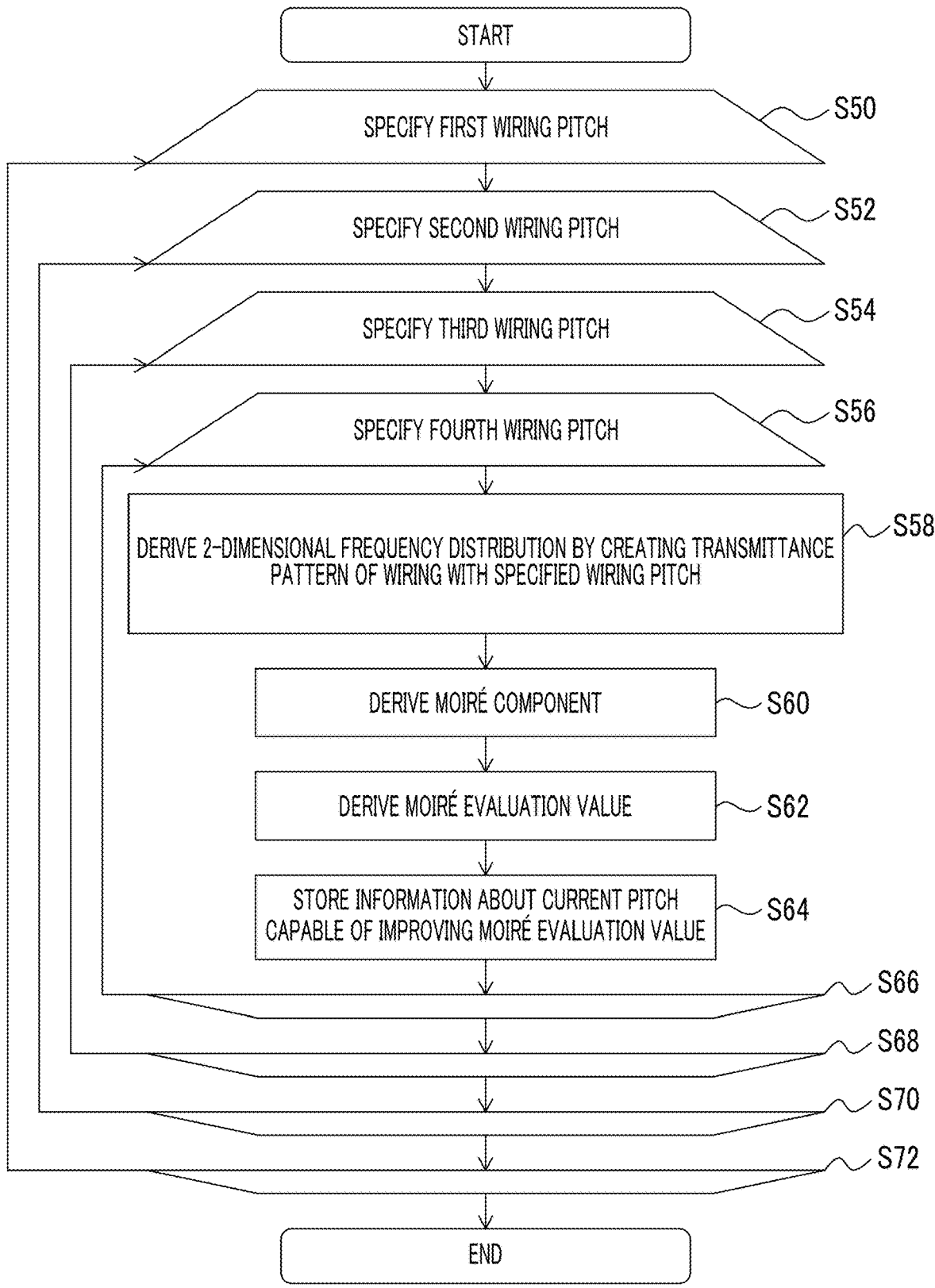
FIG. 49 is a flowchart showing another example of the moiré value calculation processing method of the non-equal pitch wiring pattern according to the embodiment of the present invention.

FIG. 49 shows a flow of Implementation Method 2 of the moiré value calculation processing for the non-equal pitch wiring pattern in the embodiment of the present invention.

In this method, the predetermined number is 4, and the moiré is evaluated by changing the pitch by a predetermined minute value within a predetermined range of values added to and subtracted from the pitch of the equal pitch wiring for each wiring.

First, in Step S50, as for the first wiring pitch, a predetermined minute value is provided in advance within the predetermined range of values added to and subtracted from the pitch of the equal pitch wiring, and the first wiring pitch is sequentially specified.

Next, in Step S52, as for the second wiring pitch, a predetermined minute value is provided in advance within the predetermined range of values added to and subtracted from the pitch of the equal pitch wiring, and the second wiring pitch is sequentially specified.

Next, in Step S54, as for the third wiring pitch, a predetermined minute value is provided in advance within the predetermined range of values added to and subtracted from the pitch of the equal pitch wiring, and the third wiring pitch is sequentially specified.

Next, in Step S56, as for the fourth wiring pitch, a predetermined minute value is provided in advance within the predetermined range of values added to and subtracted from the pitch of the equal pitch wiring, and the fourth wiring pitch is sequentially specified.

Next, in Step S58, the transmittance pattern of the wiring is created at the specified first, second, third, and fourth wiring pitches, and the 2-dimensional frequency distribution is derived.

Next, in Step S60, the moiré component is derived using the 2-dimensional frequency distribution of the pixel array pattern and the 2-dimensional frequency distribution of the wiring pattern.

Next, in Step S62, a moiré evaluation value is derived from the moiré component.

Next, in Step S64, in a case where the moiré evaluation value is improved from the stored moiré evaluation value, the improved pitch information is stored.

Next, in Step S66, in a case where the fourth wiring pitch to be specified remains, the predetermined minute value provided in advance is added to or subtracted from the current fourth wiring pitch, and thereby a new fourth wiring pitch to be specified is provided. The processing returns to Step S56, and steps S56 to S64 are repeated.

In a case where the fourth wiring pitch to be specified does not remain in Step S66, the processing proceeds to Step S68.

Next, in Step S68, in a case where the third wiring pitch to be specified remains, the predetermined minute value provided in advance is added to or subtracted from the current third wiring pitch, and thereby a new third wiring pitch to be specified is provided. The processing returns to Step S54, and steps S54 to S66 are repeated.

In a case where the third wiring pitch to be specified does not remain in Step S68, the processing proceeds to Step S70.

Next, in Step S70, in a case where the second wiring pitch to be specified remains, the predetermined minute value provided in advance is added to or subtracted from the current second wiring pitch, and thereby a new second wiring pitch to be specified is provided. The processing returns to Step S52, and steps S52 to S68 are repeated.

In a case where the second wiring pitch to be specified does not remain in Step S70, the processing proceeds to Step S72.

Next, in Step S72, in a case where the first wiring pitch to be specified remains, the predetermined minute value provided in advance is added to or subtracted from the current first wiring pitch, and thereby a new first wiring pitch to be specified is provided. The processing returns to Step S50, and steps S50 to S70 are repeated.

In Step S72, in a case where the first wiring pitch to be specified does not remain, Implementation Method 2 of the moiré value calculation processing for the non-equal pitch wiring pattern ends.

Since there are combinations in which the predetermined number of pitches are the same, it is desirable to omit the combinations in order to shorten the optimization time. Pitch information in which the same pitch combinations are omitted may be provided in advance, and may be optimized by Implementation Method 1 of the moiré value calculation processing of the non-equal pitch wiring pattern.

In Implementation Method 2 shown in FIG. 49, it is possible to perform an exhaustive search as compared with Implementation Method 1 shown in FIG. 48, but there is a disadvantage in that it takes a long time to search.

(Implementation Method 3 of Moiré Value Calculation Processing for Non-Equal Pitch Wiring Pattern)

Figure 50:
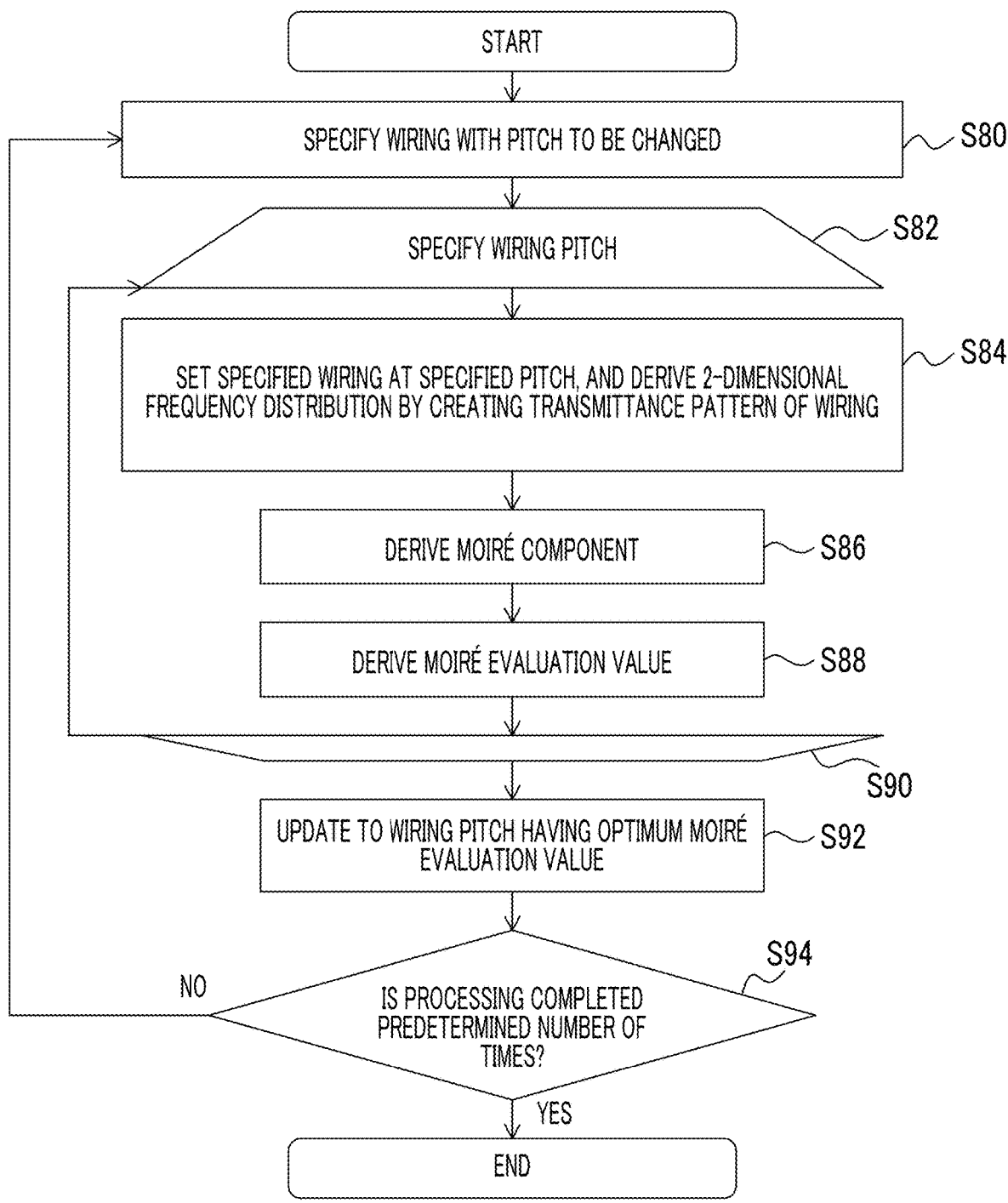
FIG. 50 is a flowchart showing another example of the moiré value calculation processing method of the non-equal pitch wiring pattern according to the embodiment of the present invention.

FIG. 50 shows a flow of Implementation Method 3 of the moiré value calculation processing for the non-equal pitch wiring pattern in the embodiment of the present invention.

This method is a method in which the search is repeated a predetermined number of times.

First, in Step S80, the wirings, of which the wiring pitches of the non-equal pitches will be changed, are specified. First, the first wiring may be specified, or the wiring in another order may be specified.

Next, in Step S82, the information about the wiring pitch is provided in advance, and the information about the wiring pitch is acquired and specified.

Next, in Step S84, the specified wiring is set at the specified wiring pitch, a transmittance pattern of the wiring is created, and a 2-dimensional frequency distribution is derived.

Next, in Step S86, the moiré component is derived using the 2-dimensional frequency distribution of the pixel array pattern and the 2-dimensional frequency distribution of the wiring pattern.

Next, in Step S88, a moiré evaluation value is derived from the moiré component.

Next, in Step S90, in the information about the wiring pitch provided in advance, in a case where information about the wiring pitch at which the moiré evaluation value is not obtained remains and there is information about the wiring pitch to be specified, the processing returns to S82, and steps S82 to S88 are repeated.

On the other hand, in a case where there is no information about the wiring pitch to be specified, the processing proceeds to Step S92.

In Step S92, the moiré evaluation value is updated at the optimum wiring pitch.

Next, in Step S94, it is determined whether changing the wiring pitch is completed a predetermined number of times.

In a case where the predetermined number of times of changing is not completed (NO), the processing returns to Step S80, and steps S80 to S92 are repeated.

In a case where the predetermined number of times of changing is completed (YES), Implementation Method 3 of the moiré value calculation processing for the non-equal pitch wiring pattern ends.

In the method shown in FIG. 50, in a case where the predetermined number is 4, the search is repeated a predetermined number of times in the order of the first wiring→the second wiring→the third wiring→the fourth wiring→the first wiring→ . . . . The order may be from first to fourth, or may be selected to be random.

Regarding the specified wiring, the moiré evaluation value is derived by increasing or decreasing the wiring pitch from the current pitch by ±by a predetermined amount. Simply, assuming that the current pitch is set to p, the evaluation may be performed by using the pitches of p+a, p, and p−a. The moiré evaluation value for the pitch p among the pitches has already been derived, and thus it is not necessary to derive the moiré evaluation value again. The moiré evaluation value is updated at the optimum pitch for the specified wiring.

The method shown in FIG. 50 requires less search time than the method shown in FIG. 49. Further, the method shown in FIG. 50 can be searched more finely than the method shown in FIG. 48. However, there is a disadvantage in that the method tends to result in a local solution.

The above-described method of producing a wiring pattern of the conductive film of the embodiment of the present invention shown in FIGS. 47 to 50 relates to a wiring pattern of a wiring portion which is carried out regardless of the presence or absence of a transparent substrate of the conductive film. Therefore, it can be said that the method may be a method of producing a wiring pattern of a conductive member having at least a wiring portion although the transparent substrate is not specified. That is, it can be said that FIGS. 47 to 50 show the flow of the method of producing the conductive member and the wiring pattern of the conductive film of the embodiment of the present invention.

(Points to Consider for Implementation)

JP2016-014929A discloses a method of determining a wiring pattern of which the moiré evaluation value is equal to or less than a threshold value by providing irregularities to the pitches of rhomboid-shaped wirings. However, the method has a problem. The problem is "excluding a moiré component having a small intensity by using a threshold value".

In this method, in addition to the "wiring pattern having a small amount of low-frequency area moiré components visible to the human eye" that is originally desired, a wiring pattern having a large amount of moiré components equal to or less than the threshold value is also selected. Originally, in a case where irregularity is provided to the wiring pitch, the frequency components of the wiring pattern increase, but in this case, the sum of the intensities of the frequency components of the wiring pattern inevitably increases. The reason for this is that since the square sum of the transmittance of the wiring pattern does not change regardless of whether or not irregularity is provided to the wiring pitch, according to Parseval's theorem, the sum of powers (the square of intensities) of the frequency components of the 2-dimensional frequency distribution of the wiring pattern does not change. The fact that the number of frequency components increases without changing the sum of powers (the square of intensities) means that the sum of intensities increases. The increase in sum of intensities of the wiring patterns also means the increase in sum of intensities of the moiré components. That is, as a result of the increase in number of frequency components of the wiring pattern, the moiré component is inevitably increased, and the sum of the intensities (multiplication values of the frequency components of the pixel array pattern and the frequency components of the wiring pattern) also increases. As a result, the sum of the intensities of the moiré components after being multiplied by VTF tends to increase. Under such a tendency, in a case where a wiring pattern to which irregularity is provided and of which the low moiré evaluation value (sum of intensities of moiré components after VTF multiplication) is low is selected, it is considered that a wiring pattern having a large number of moiré components of which the intensities are equal to or less than a threshold value tends to be selected (moiré components that are equal to or less than the threshold value are excluded from the evaluation value). In other words, even in a case where the search is performed by providing irregularity, it is considered that a wiring pattern having the following characteristic tends to be selected. Reduction in moiré evaluation value caused by "increasing the moiré components that are equal to or less than the threshold value" is greater than reduction in moiré evaluation value caused by "shifting the frequency of each moiré component to the high frequency side from the low frequency range visible to the human eye".

The present inventor had set the threshold value of the intensity of the moiré component as in the method of JP2016-014929A and searched for the non-equal pitch wiring pattern satisfying the second requirement of the embodiment of the present invention by the implementation method, and the above wiring pattern was derived. In such a wiring pattern, a large number of moiré components are distributed around the threshold value or less. In a case where the moiré evaluation value is derived by lowering the threshold value a little, the moiré evaluation value is rather worse than that of an equal pitch wiring pattern. Thus, the wiring pattern is not a desirable pattern. However, in a case where the moiré components of low intensity are not excluded by using the threshold value, in the non-equal pitch wiring pattern satisfying the second requirement of the embodiment of the present invention, more frequency components having small intensities than the equal pitch wiring pattern inevitably occur. Therefore, as described above, the moiré evaluation value tends to increase, and a sufficiently optimum wiring pattern cannot be selected.

Here, in the past visual sense research, an experimental result showing that "visibility of a pattern in which a plurality of frequencies is overlapped is not a linear sum of visibilities of the frequencies but a non-linear sum" is obtained. Therefore, in the embodiment of the present invention, the frequency components of the non-equal pitch wiring pattern satisfying the second requirement of the embodiment of the present invention are increased more than frequency components of the equal pitch wiring pattern. Even in this case, as a method of obtaining the evaluation value from each moiré component such that an accurate moiré evaluation value can be derived and a sufficiently optimum wiring pattern can be derived, there is a method of "deriving a non-linear sum of the intensities of the moiré components", instead of "deriving the sum (linear sum) of intensities by excluding the moiré components having small intensities through the threshold value" and "deriving the sum (linear sum) of intensities without the threshold value". In the past visual sense research, generally the following two types of models have been proposed and these methods are used.

After converting the intensities of the moiré components through a non-linear function (assuming a conversion function (transducer function) from luminance contrast to psychological contrast), the sum (linear sum) thereof is derived as the moiré evaluation value. Here, since various conversion expressions such as the expression proposed by Hamerly et al. or Wilson et al. have been proposed as a non-linear conversion function (transducer function), any one of these expressions is used for conversion.

Alternatively, the stochastic addition values of the intensities of the moiré components are derived as the moiré evaluation values. Here, the moiré evaluation value I is derived using Expression (2), which is proposed by Quick et al., as a stochastic addition expression.

$$I = (\Sigma (R[i])^x)^{1/x} \qquad (2)$$

Here, R[i] represents the intensity of the i-th frequency component of the moiré, that is, each moiré component after VTF multiplication. The stochastic addition order x employs a certain value in the range of 1 to 4, which has been proposed as an order that fits well with the visual experiment results in the past visual sense research. Here, in a case where the order x is 1, Expression (2) means that the sum (linear sum) of the intensities of the moiré components is derived as the moiré evaluation value. In this case, as described above, the moiré evaluation value of the non-equal pitch wiring pattern satisfying the second requirement of the embodiment of the present invention tends to increase more than the equal pitch wiring pattern. Therefore, it is difficult to select a sufficiently optimum wiring pattern. However, even in this case, since it is possible to select the non-equal pitch wiring pattern with at least less moiré than the equal pitch wiring pattern, the value 1 is also employed as the order x. As the typical order x, the value 2 presented by Quick is employed.

As already described, in the non-equal pitch pattern satisfying the second requirement of the embodiment of the present invention, visibility of the wiring pattern itself tends to be worse than that of the equal pitch (the low-frequency component which is not present in the equal pitch occurs as the frequency component of the wiring pattern). Therefore, it is desirable to evaluate not only moiré but also visibility of the wiring pattern itself.

In Expression (7), not only each moiré component represented by the expression on the fourth row, but also the frequency component of the wiring pattern represented by the expression on the third row is incorporated into the moiré evaluation value. Thereby, the components can be easily evaluated. Specifically, the frequency 0 (corresponding to A0 in Expression (7)) may be included in the frequency distribution of the pixel array pattern shown in FIG. 14. As a result, in a case of deriving each moiré component (for example, moiré component shown in FIG. 16) on the basis of each frequency component of the pixel array pattern of FIG. 14 and each frequency component of the wiring pattern (for example each frequency component shown in FIG. 15), each component represented by the expression on the third row of Expression (7) is derived as a moiré component with the frequency 0 (corresponding to A0 of Expression (7)) of the pixel array pattern, and then can be incorporated into the sum value (moiré evaluation value) derived by multiplying by the VTF.

The non-equal pitch wiring pattern satisfying the second requirement of the embodiment of the present invention may be a non-equal pitch satisfying the second requirement only in one direction or a non-equal pitch satisfying the second requirement in all directions in a wiring pattern in which straight line wirings in two or more directions are overlapped.

Further, the separate-direction non-equal pitch wiring pattern of the embodiment of the present invention is preferably a wiring pattern in which straight line wirings in two directions are overlapped. The reason for this is that there is an upper limit on the number of wirings per unit area in order to secure the transmittance. In a case where the number of wirings per unit area has an upper limit, the number of wirings in one direction can be increased in a case where the number of wiring patterns is small. As a result, the wiring pitch can be narrowed. The narrower the wiring pitch, the more difficult occurrence of moiré. Specifically, in a case where the wiring pitch is narrower, the frequency of each component in the frequency distribution is farther away. Therefore, a component close to each frequency component of the pixel array pattern is less likely to occur, and low-frequency moiré is less likely to occur. In addition, the narrower the wiring pitch, the more advantageous it is to reduce moiré due to the non-equal pitch wiring pattern which satisfies the second requirement of the embodiment of the present invention. In the non-equal pitch wiring pattern satisfying the second requirement of the embodiment of the present invention, a low-frequency component occurs as compared with the equal pitch wiring pattern. However, the narrower the wiring pitch, the higher the minimum frequency. Therefore, similarly to the non-equal pitch wiring pattern satisfying the second requirement, even in a case where the low-frequency component occurs, the influence on visibility of the wiring pattern is small. That is, it is possible to more freely optimize the pitch and reduce moiré within a range that does not affect visibility of the wiring pattern. As described above, the smaller the direction of the wiring pattern, the better the moiré and visibility of the wiring pattern. However, at least two directions are necessary to prevent the conductive film from losing a function as a touch sensor. That is, in order to maintain the sensor function even in a case where the wiring is disconnected, it is necessary to have a pattern in which wirings in at least two directions are overlapped and have intersections and a plurality of paths (current paths) to the electrodes. Therefore, a wiring pattern in which straight line wirings in two directions are overlapped is desirable.

In a case where the wiring pattern has a 2-layer structure, the positions (phases) of the wiring patterns of the two layers may deviate during oblique observation. In this case as well, the moiré can be similarly reduced by the wiring pattern of the embodiment of the present invention. In this case, the front observation may be performed as the frequency distribution of the wiring patterns shown in for example FIGS. 15, 19, 24, 38, 42, and the like. In addition, the frequency distribution in the case of observing from an oblique optional direction may also be derived, similarly, the moiré component may be derived and multiplied by VTF, the moiré evaluation value may be derived, and a separate-direction non-equal pitch wiring pattern, of which the worst value of the moiré evaluation value is better than the omnidirectional-equal pitch wiring pattern, may be derived. In a case where the wiring pattern has a 2-layer structure, the wiring pattern may be a separate-direction non-equal pitch wiring pattern of which the moiré evaluation value in a case of observation from at least one direction including not only front observation but also oblique observation from an optional direction is smaller than that of the omnidirectional-equal pitch wiring pattern. Then, the wiring pattern has the characteristics of the embodiment of the present invention. Similarly, in a case of observation from at least one direction including not only front observation but also oblique observation from any direction, the wiring pattern may be a separate-direction non-equal pitch wiring pattern in which "distribution of the frequency components of the wiring pattern", "distribution of moiré components derived from the pixel array pattern and the wiring pattern", or "the pitch of the wiring pattern" satisfies the characteristics of the above-described wiring pattern of the embodiment of the present invention. Then, the wiring pattern has the characteristics of the embodiment of the present invention.

In the case of OELD, there are displays with different pixel array patterns (for example, pen-tile array) for at least two colors of RGB. In the case of such a display, since the 2-dimensional frequency distributions of the pixel array patterns are different for at least two colors of R, G, and B, moirés are also different. In the case of such a display, it is necessary to provide a wiring pattern that reduces all R, G, and B moirés. In this case, the frequency distribution of the pixel array pattern shown in FIG. 14 may be derived for each color of R, G, B, the moiré component may be derived for each color of R, G, B from the frequency distributions of the pixel array patterns and the frequency distribution of the wiring pattern and the moiré component may be derived through multiplication of the VTF, and the separate-direction non-equal pitch wiring pattern of which the worst value of the moiré evaluation value is better than the omnidirectional-equal pitch wiring pattern may be derived. Even in a case where the pixel array patterns of R, G, and B are different, the wiring pattern has characteristics of the embodiment of the present invention as long as the wiring pattern is a separate-direction non-equal pitch wiring pattern having a moiré evaluation value smaller than the omnidirectional-equal pitch wiring pattern for any one of R, G, and B. Similarly, for any one of R, G, and B, the wiring pattern may be a separate-direction non-equal pitch wiring pattern in which "distribution of the frequency components of the wiring pattern", "distribution of moiré components derived from the pixel array pattern and the wiring pattern", or "the pitch of the wiring pattern" satisfies the characteristics of the above-described wiring pattern of the embodiment of the present invention. Then, the wiring pattern has the characteristics of the embodiment of the present invention.

The present invention is characterized in that the line wiring (line wiring in one direction) being composed of a plurality of thin metal wires arranged in parallel in one direction is a straight line wiring. However, in the embodiment of the present invention, the thin metal line does not have to be a perfect straight line, and may be bent as long as the line is within a predetermined range. The straight line wiring in the embodiment of the present invention can be defined as follows.

In the embodiment of the present invention, in the 2-dimensional frequency distribution of the transmittances of the line wiring in one direction, in a case where the frequency components of the line wiring are concentrated only in a specific direction, the line wiring can be regarded as a straight line wiring. Specifically, in the 2-dimensional frequency distribution of the transmittances of the line wiring, a ratio of the sum of intensities of the frequency components, from which the zero frequency component is excluded, in the angular range of −10 degrees or more to +10 degrees or less centered on a certain specific direction to the sum of the intensities of all frequency components (from which the zero frequency component is excluded) may be equal to or greater than a predetermined ratio. In this case, the line wiring can be regarded as a straight line wiring. Here, the predetermined ratio is 30%, more preferably 45%, and still more preferably 55%. In addition, the certain specific direction indicates both a direction of any angle of optional angles in the angular range of 0 degree or more and less than 360 degrees and a direction of an angle different from that angle by 180 degrees. In other words, the sum of the intensities of the frequency components in the angular range of −10 degrees or more to +10 degrees or less centered on a certain specific direction also includes the intensities of the frequency components having the conjugate relation (the frequency components in a direction different by 180 degrees (the opposite direction)).

Figure 52:
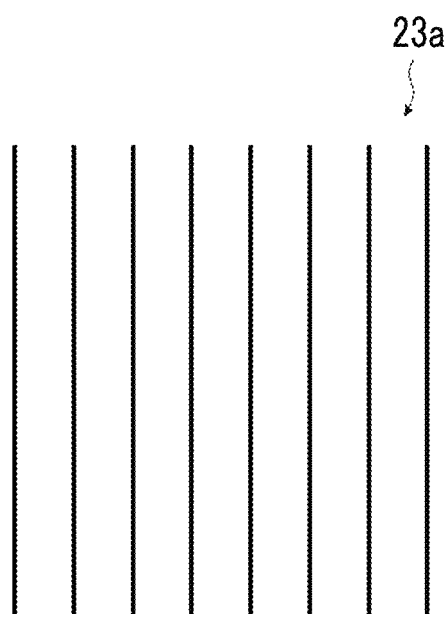
FIG. 52 is a plan view schematically showing an example of the line wiring of the wiring portion of the conductive film.
Figure 53:
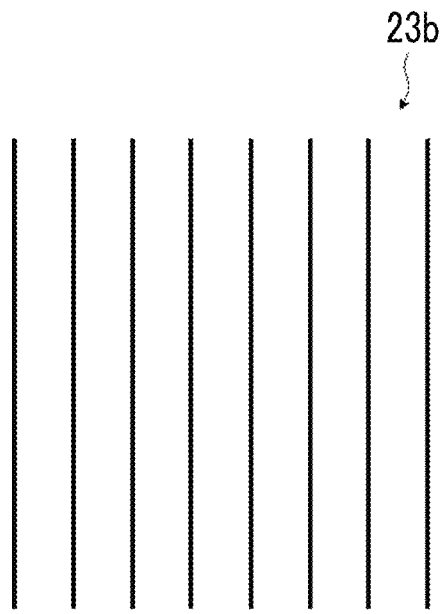
FIG. 53 is a plan view schematically showing another example of the line wiring of the wiring portion of the conductive film.
Figure 54:
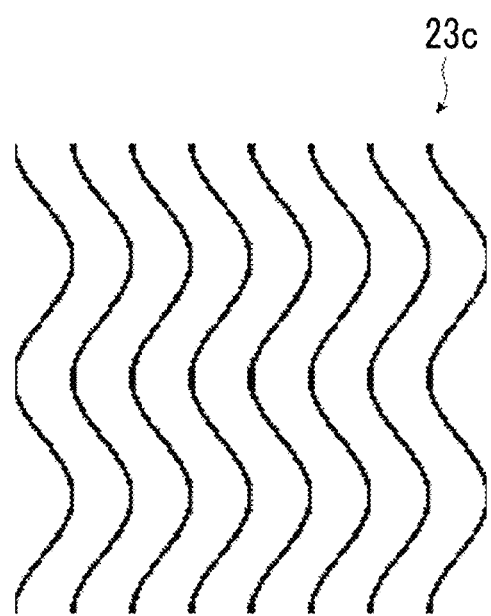
FIG. 54 is a plan view schematically showing another example of the line wiring of the wiring portion of the conductive film.
Figure 55:
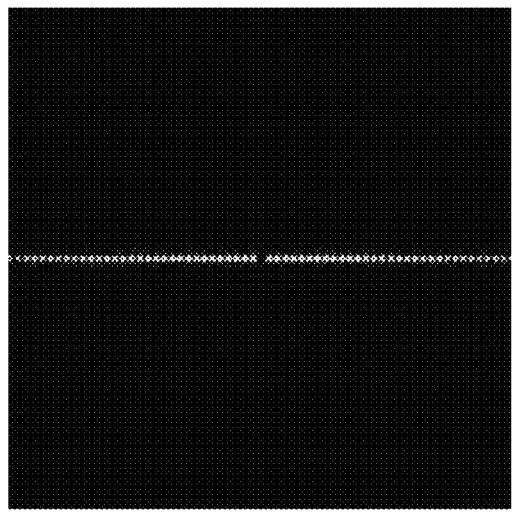
FIG. 55 is a diagram of a 2-dimensional frequency distribution of the wiring pattern shown in FIG. 52.
Figure 56:
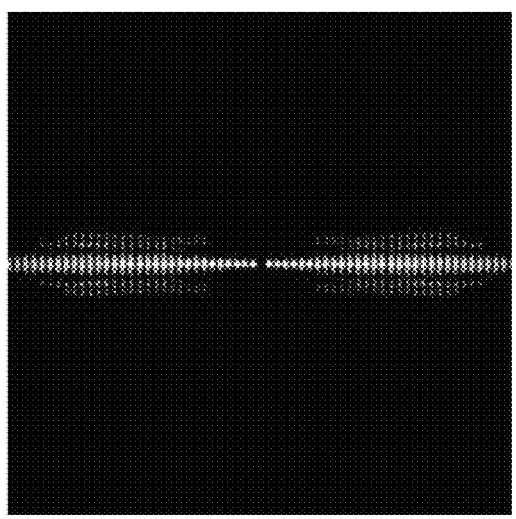
FIG. 56 is a diagram showing a 2-dimensional frequency distribution of the wiring pattern shown in FIG. 53.
Figure 57:
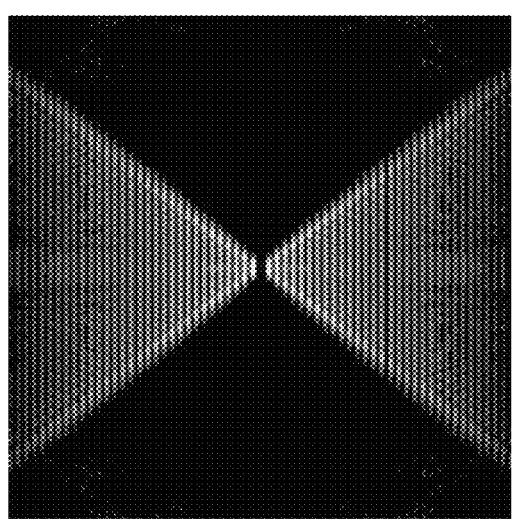
FIG. 57 is a diagram of a 2-dimensional frequency distribution of the wiring pattern shown in FIG. 54.

Here, as examples of the line wiring, line wirings shown in FIGS. 52 to 54 are shown. Further, FIGS. 55 to 57 show 2-dimensional frequency distributions of the transmittances of the line wirings shown in FIGS. 52 to 54, respectively. In addition, in the frequency distribution, the intensity scale is appropriately adjusted in order to make the intensities easily visible. Further, the zero frequency component is removed. The line wiring 23a shown in FIG. 52 is a straight line wiring in which perfect straight lines are arranged in the horizontal direction, and the frequency distribution shown in FIG. 55 is also concentrated only in the horizontal direction. In contrast, in the line wiring 23c shown in FIG. 54, the lines forming the wiring each have a cosine wave shape, and the frequency distribution shown in FIG. 57 spreads not only in the horizontal direction but also in the peripheral direction. Thus, the line wiring 23c can not be regarded as the straight line wiring. On the other hand, in the line wiring 23b shown in FIG. 53, although the lines forming the wiring each have a slight cosine wave shape, the frequency distribution shown in FIG. 56 is mostly concentrated in the horizontal direction. Therefore, the line wiring 23b can be regarded as a straight line wiring.

Figure 58:
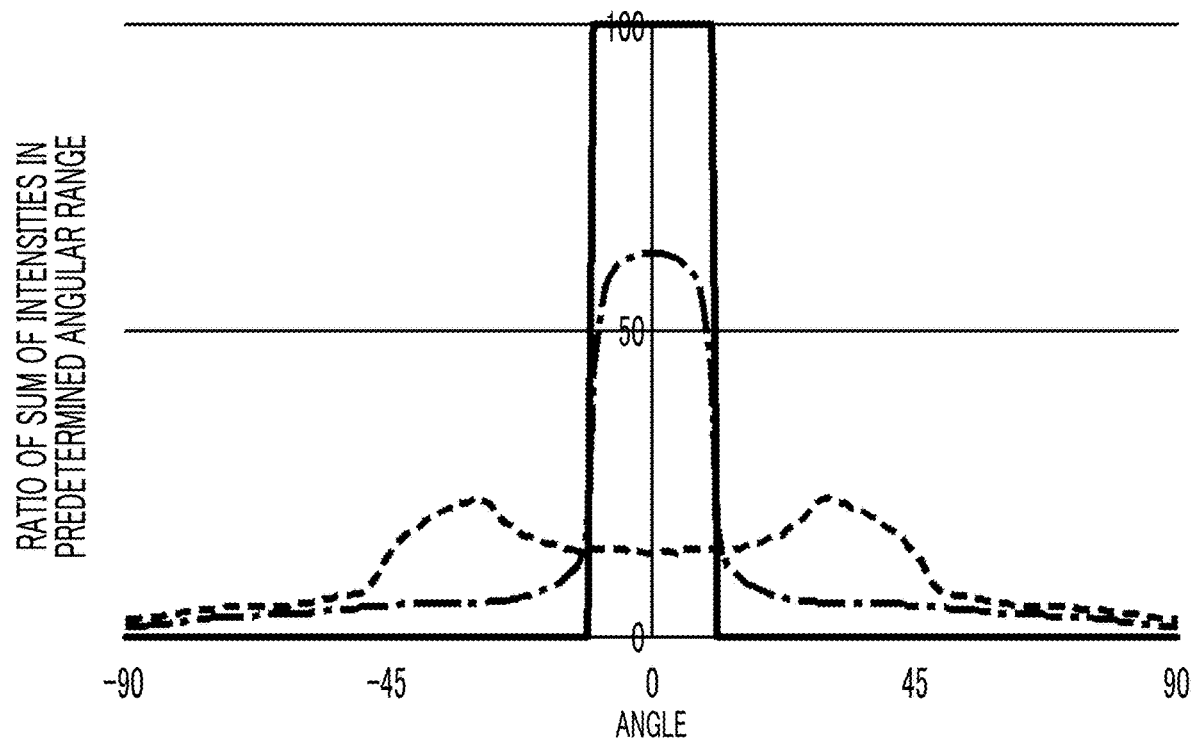
FIG. 58 is a graph showing the ratio of the sum of intensities of frequency components to the sum of intensities of all frequency components in a predetermined angular range in the 2-dimensional frequency distribution of the wiring patterns shown in FIGS. 55 to 57.

FIG. 58 is a graph showing a ratio of the sum of the intensities of frequency components (from which the zero frequency component is excluded) in the angular range of −10 degrees to +10 degrees centered on each direction from −90 degrees to +90 degrees (and in addition, a direction different from each direction by 180 degrees (opposite direction)) in a case where the horizontal direction is set as an angle of 0 degree to the sum of the intensities of all frequency components (from which the zero frequency component is excluded), in the 2-dimensional frequency distribution of the transmittances of the line wiring. In FIG. 58, the solid line indicates a graph of the ratio of intensities of the frequency components of the line wiring 23a shown in FIG. 52, the chain line indicates a graph of the ratio of intensities of the frequency components of the line wiring 23b shown in FIG. 53, and the dotted line indicates a graph of the ratio of intensities of frequency components of the line wiring 23c shown in FIG. 54. As can be seen from the ratio of the sum of intensities of frequency components in the angular range of −10 degrees or more and +10 degrees or less centered on the horizontal direction as a specific direction, that is, the direction of the angle of 0 degree (and in addition, the direction of the angle of 180 degrees), in the case of the line wiring 23a shown in FIG. 52, the ratio is naturally 100%, and the line wiring 23a can be regarded as a straight line wiring. In the case of the line wiring 23b shown in FIG. 53, the ratio is 55% or more, and the line wiring 23b can also be regarded as a straight line wiring. On the other hand, in the case of the line wiring 23c shown in FIG. 54, it can be seen that the ratio is less than 30% and the line wiring 23c cannot be regarded as a straight line wiring.

Incidentally, in the separate-direction non-equal pitch wiring pattern which is a characteristic of the embodiment of the present invention, it is a premise that the line wirings in all directions to be overlapped are straight line wirings. However, the conductive member of the embodiment of the present invention, and the conductive film The wiring pattern of the wiring portion may include the separate-direction non-equal pitch wiring pattern, which is a characteristic of the embodiment of the present invention. That is, the conductive member of the embodiment of the present invention and the wiring pattern of the wiring portion of the conductive film may include a separate-direction non-equal pitch wiring pattern which is a wiring pattern in which straight line wirings are overlapped in two or more directions and in which the average pitch of the straight line wiring in at least one direction is different from the average pitch of the straight line wiring in at least one different direction.

In this case, in addition to the separate-direction non-equal pitch wiring pattern, not a straight line wiring but a line wiring such as a line wiring being composed of a curved line or a polygonal line may be further overlapped on the line wiring being composed of a plurality of thin metal wires arranged in parallel in one direction. As described above, even in a case where the wiring pattern of the conductive member and the wiring portion of the conductive film includes a line wiring that is not a straight line wiring, it is possible to improve moiré visibility by using at least the separate-direction non-equal pitch wiring pattern that is composed of straight line wirings. However, as shown in FIGS. 52 to 54 and FIGS. 55 to 57, the straight line wiring rather than the line wiring being composed of the curved line or the polygonal line is able to concentrate the frequency components only in a specific direction. Therefore, in order to reduce moiré, it is preferable that the line wirings included in the wiring patterns of the wiring portions of the conductive member and the conductive film are all straight line wirings.

The dummy electrode portion such as the dummy electrode portion 26 of the conductive film 11 shown in FIG. 7 described above is provided so as to be electrically insulated (disconnected) from the first electrode portions 17a, between the adjacent first electrode portions 17a, in the first wiring portion 16a like the non-conductive pattern described in WO2013/094729A. In addition, the dummy electrode portion is provided so as to be electrically insulated (disconnected) from the second electrode portions 17b, between the adjacent second electrode portions 17b, in the second wiring portion 16b. However, the present invention is not limited to this.

Figure 61:
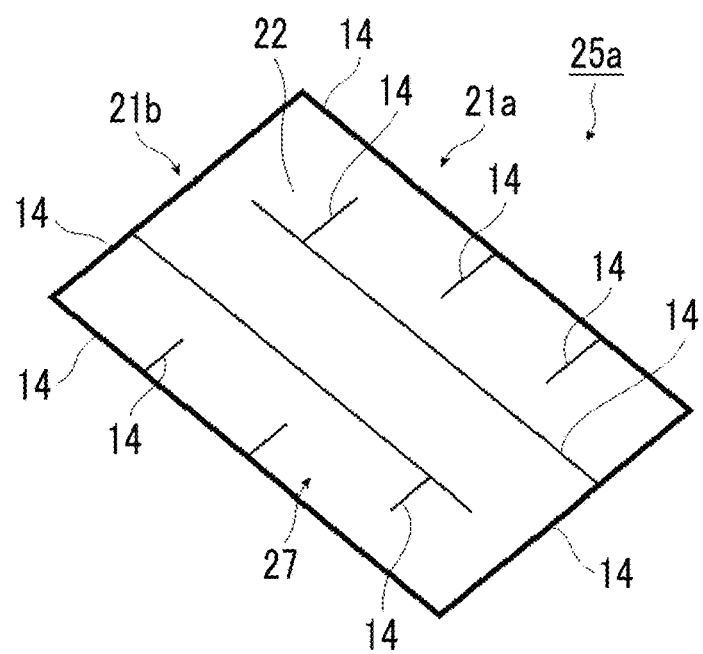
FIG. 61 is a plan view schematically showing an example of an in-electrode dummy pattern portion in one opening portion of the wiring pattern of the embodiment of the present invention.

In a case where the pitch of the at least one straight line wiring 21a of the first electrode portion 17a and/or the second electrode portion 17b is wide, as shown in FIG. 61, in one opening portion 22 of the mesh-shaped wiring pattern 25a, the in-electrode dummy pattern portion 27 may be formed by extending new thin metal wires 14 in parallel with the thin metal wires 14 of the one straight line wiring 21a such that the tip is not connected to any of the thin metal wires 14, that is, the wiring is disconnected (broken) or stopped in the middle, from one thin metal line 14 of the straight line wiring 21b in the other direction to be overlapped to the other thin metal line 14, or reversely from the other thin metal line 14 to the one thin metal line 14, between the thin metal wires 14 of one straight line wiring 21a. On the contrary, the in-electrode dummy pattern portion 27 may be formed by extending new thin metal wires 14 in parallel with the thin metal wires 14 of the one straight line wiring 21b such that the tip is not connected to any of the thin metal wires 14, that is, the wiring is disconnected (broken) or stopped in the middle, from one thin metal line 14 of the other straight line wiring 21a to the other thin metal line 14, or reversely from the other thin metal line 14 to the one thin metal line 14, between the thin metal wires 14 of one straight line wiring 21b. The in-electrode pattern portion 27 may be formed by further branching from the thin metal wires 14 forming the in-electrode dummy pattern portion 27 in parallel with the thin metal wires 14 of the straight line wirings 21 in the other direction. Needless to say, the distal ends of the branched thin metal wires 14 are disconnected (broken) or stopped in the middle, and are not connected to any thin metal wires 14. Needless to say, the example shown in FIG. 61 shows the in-electrode dummy pattern portion 27 formed in only one opening portion of the mesh-shaped wiring pattern, but similarly the in-electrode dummy pattern portion 27 may be formed in the other opening portions.

By forming the in-electrode dummy pattern portion 27 in such a manner, the following effects are obtained. In general, in a case where the pitches of the thin metal wires of the electrode portion are narrowed, the parasitic capacitance of the electrode increases. As a result, the accuracy of detecting the touch position decreases. On the other hand, in a case where the pitches of the thin metal wires are widened in order to improve the detection sensitivity, the thin metal wires tend to be conspicuous and visibility deteriorates. In addition, moiré due to interference between the pixel array pattern and the wiring pattern of the thin metal wires of the electrode portion is likely to occur. Therefore, the pitches of the thin metal wires in the electrode portion are widened and the parasitic capacitance of the electrode is reduced to improve the touch position detection accuracy. On the other hand, by forming the in-electrode dummy pattern portion, the pitches of the combination of the thin metal wires in the electrode portion and the thin metal wires in the in-electrode dummy pattern portion are narrowed. As a result, visibility of the thin metal wires can be lowered, and moiré can be made less likely to occur.

In the case of forming the in-electrode dummy pattern portion as described above, in the embodiment of the present invention, a combined wiring pattern includes a separate-direction non-equal pitch wiring pattern optimized in terms of visibility of moiré. The combined wiring pattern is formed by overlapping a wiring pattern, which is formed by the combination of the thin metal wires of the electrode portion and the thin metal wires of the in-electrode dummy pattern portion, and in a case where there are a plurality of wiring layers, wiring patterns in the wiring layers. As a result, the combined wiring pattern improves the visibility of the moiré due to the interference with the display. For example, in the case of the conductive film 11 according to the second embodiment of the present invention shown in FIG. 7, a combined wiring pattern includes a separate-direction non-equal pitch wiring pattern optimized in terms of visibility of moiré. The combined wiring pattern is formed by overlapping a wiring pattern, which is formed by the combination of the thin metal wires of the first electrode portion 17a in one wiring layer 28a of the two wiring layers 28a and 28b and the thin metal wires of the in-electrode dummy pattern portion, and a wiring pattern which is formed by the combination of the wiring pattern of the dummy electrode portion 26 and the combination of the thin metal line of the second electrode portion 17b and the thin metal wires of the in-electrode dummy pattern portion in the other wiring layer 28b. As a result, the combined wiring pattern improves the visibility of the moiré due to the interference with the display.

As another form of the dummy electrode portion, there is a form of the sub non-conductive pattern described in WO2013/094729A.

The conductive film of the embodiment of the present invention is a conductive film provided on a display unit of a display device. The conductive film has a transparent substrate and a wiring portion formed on at least one surface of the transparent substrate and being composed of a plurality of thin metal wires. The wiring portion has a wiring pattern in which straight line wirings being composed of a plurality of thin metal wires arranged in parallel in one direction are overlapped in two or more directions. The wiring pattern may be overlapped on the pixel array pattern of the display unit, and may be a separate-direction non-equal pitch wiring pattern in which the average pitch of the straight line wiring in at least one direction is different from the average pitch of the straight line wiring in at least one different direction.

According to the embodiment of the present invention, there is provided a method of producing a wiring pattern of a conductive film which is provided on a display unit of a display device and has a transparent substrate and a wiring portion that is formed on at least one surface of the transparent substrate and being composed of a plurality of thin metal wires, where the wiring portion has a wiring pattern in which straight line wirings each being composed of a plurality of thin metal wires arranged in parallel in one direction are overlapped in two or more directions. The wiring pattern is overlapped on the pixel array pattern of the display unit, and is a separate-direction non-equal pitch wiring pattern in which an average pitch of the straight line wiring in at least one direction is different from an average pitch of the straight line wiring in at least one different direction. A transmittance of the wiring pattern and a luminance or a transmittance of the pixel array pattern are obtained. A 2-dimensional Fourier frequency distribution of the transmittance of the wiring pattern and a 2-dimensional Fourier frequency distribution of the luminance or the transmittance of the pixel array pattern are derived. Respective frequency components of moiré is calculated from frequency components of the 2-dimensional Fourier frequency distribution of the transmittances of the wiring patterns and frequency components of the 2-dimensional Fourier frequency distribution of the luminance or the transmittance of the pixel array pattern. In addition, human's visual response characteristics are applied to the calculated respective frequency components of the moiré so as to obtain a moiré evaluation value, which is a sum of intensities of the respective frequency components. The separate-direction non-equal pitch wiring pattern may be produced in a state where the moiré evaluation value in the separate-direction non-equal pitch wiring pattern obtained in such a manner is less than a moiré evaluation value in an omnidirectional-equal pitch wiring pattern in which a direction of each straight line wiring and a wiring density per unit area are the same as those of the separate-direction non-equal pitch wiring pattern, or an omnidirectional-equal pitch wiring pattern in which a direction of each straight line wiring is different from that of the separate-direction non-equal pitch wiring pattern but a number of the straight line wirings and a wiring density per unit area are the same as those of the separate-direction non-equal pitch wiring pattern.

As described above, the conductive member and the conductive film according to the embodiment of the present invention, the display device comprising the conductive film, the touch panel, the method of producing the wiring pattern of the conductive member, and the method of producing the wiring patterns of the conductive film have been described in various embodiments and examples. However, it is apparent that the present invention is not limited to the embodiments and the examples and may be improved and modified in various forms without departing from the scope of the embodiment of the present invention.

EXPLANATION OF REFERENCES 10, 11, 11A: conductive film
12, 12a, 12b: transparent base
14: thin line made of metal (thin metal line)
16, 16a, 16b: wiring portion
17, 17a, 17b: electrode portion
18, 18a, 18b: adhesive layer
20, 20a, 20b: protective layer
21, 21a, 21b, 21c, 21d1, 21d2, 21e, 21f, 21g, 21h, 21i, 21j: straight line wiring
22: opening portion
23a, 23b, 23c: line wiring
24: wiring pattern
24a: first (upper side) wiring pattern
24b: second (lower side) wiring pattern
25, 25a, 25b, 25c, 25d, 25e, 25f, 25g: wiring pattern
26, 26a: dummy electrode portion
27: in-electrode dummy pattern portion
28, 28a, 28b: wiring layer
30, 30a: display unit
32, 32r, 32g, 32b: pixel
34: black matrix (BM)
36: region
38: pixel array pattern
40: display device
42: input side
44: touch panel
46: housing
48: cover member
50: cable
52: flexible substrate
54: detection control unit
56: adhesive layer
58: contact body

What is claimed is:
1. A conductive member comprising a wiring portion which is composed of a plurality of thin metal wires,
wherein the wiring portion has a wiring pattern, the wiring pattern comprises first straight line wirings being composed of a plurality of first thin metal wires arranged in parallel and extending in a first direction and second straight line wirings being composed of a plurality of second thin metal wires arranged in parallel and extending in a second direction, the first direction is different from the second direction, and the first straight line wirings cross over the second straight line wirings,
wherein the wiring pattern is a separate-direction non-equal pitch wiring pattern in which an average pitch of the first straight line wirings is different from an average pitch of the second straight line wirings, and an angle between each of the first straight line wirings and a horizontal line is different from an angle between each of the second straight line wirings and the horizontal line,
wherein the horizontal line extends along a horizontal direction,
wherein the conductive member is to be provided on a display unit of a display device,
wherein the wiring pattern is overlapped on a pixel array pattern of the display unit, and the pixel array pattern is arranged along the horizontal direction,
wherein a moiré evaluation value in the separate-direction non-equal pitch wiring pattern is less than a moiré evaluation value in a first omnidirectional-equal pitch wiring pattern in which a direction of each straight line wiring and a wiring density per unit area are the same as those of the separate-direction non-equal pitch wiring pattern, or less than a moiré evaluation value in a second omnidirectional-equal pitch wiring pattern in which a direction of each straight line wiring is different from that of the separate-direction non-equal pitch wiring pattern but a number of the straight line wirings and a wiring density per unit area are the same as those of the separate-direction non-equal pitch wiring pattern, and
wherein the moiré evaluation value is a sum of intensities of frequency components of moiré obtained by applying human's visual response characteristics to frequency components of the moiré calculated from frequency components of 2-dimensional Fourier frequency distributions of transmittances of the wiring patterns and frequency components of a 2-dimensional Fourier frequency distribution of a luminance or a transmittance of the pixel array pattern.

2. The conductive member according to claim 1, wherein the visual response characteristics are given by a visual transfer function VTF represented by Expression (1):

$$k \leq \log(0.238/0.138)/0.1,$$

$$VTF=1,$$

$$k > \log(0.238/0.138)/0.1,$$

$$VTF=5.05e^{-0.138k}(1-e^{0.1k}),$$

and $$k=\pi du/180, \qquad (1)$$

where log is a natural logarithm, k is a spatial frequency defined by solid angle (cycle/deg), u is a spatial frequency defined by length (cycle/mm), and d is an observation distance (mm) within a range of 100 mm to 1000 mm.

3. The conductive member according to claim 1, wherein an observation distance in the visual response characteristics is a certain distance in a range from 300 mm to 800 mm.

4. The conductive member according to claim 1, wherein the moiré evaluation value is derived by a non-linear sum of the intensities of the frequency components of the moiré.

5. The conductive member according to claim 1, wherein the moiré evaluation value also includes frequency components of the moiré calculated from a frequency of 0 of the pixel array pattern and the frequency components of the wiring pattern.

6. The conductive member according to claim 1, wherein the pixel array pattern is a black matrix pattern.

7. A touch panel using the conductive member according to claim 1.

8. The conductive member according to claim 1, wherein assuming that the moiré evaluation value is I, the moiré evaluation value I is derived from an intensity of each frequency component of the moiré by Expression (2):

$$I=(\Sigma(R[i])^x)^{1/x} \qquad (2),$$

where R[i] is an intensity of an i-th frequency component of moiré, and the order x is a certain value in a range of 1 to 4.

9. The conductive member according to claim 8, wherein the order x is 2.

10. A display device comprising:
a display unit having a predetermined pixel array pattern; and
the conductive member according to claim 1, which is provided on the display unit.

11. The display device according to claim 10, wherein the display unit is an organic EL display (OELD), and the pixel array patterns for at least two colors of red (R), green (G), and blue (B) are different.

12. A conductive member comprising a wiring portion which is composed of a plurality of thin metal wires,
wherein the wiring portion has a wiring pattern, the wiring pattern comprises first straight line wirings being composed of a plurality of first thin metal wires arranged in parallel and extending in a first direction and second straight line wirings being composed of a plurality of second thin metal wires arranged in parallel and extending in a second direction, the first direction is different from the second direction, and the first straight line wirings cross over the second straight line wirings,
wherein the wiring pattern is a separate-direction non-equal pitch wiring pattern in which an average pitch of the first straight line wirings is different from an average pitch of the second straight line wirings, and an angle between each of the first straight line wirings and a horizontal line is different from an angle between each of the second straight line wirings and the horizontal line,
wherein the horizontal line extends along a horizontal direction,
wherein the conductive member is to be provided on a display unit of a display device,
wherein the wiring pattern is overlapped on a pixel array pattern of the display unit, and the pixel array pattern is arranged along the horizontal direction,
wherein in the first straight line wirings in the separate-direction non-equal pitch wiring pattern, repetitive pitches of a predetermined number of the first thin metal wires are equal pitches, and respective pitches of the predetermined number of the first thin metal wires are non-equal pitches.

13. The conductive member according to claim 12, wherein an average pitch of the first straight line wirings is narrower than an average pitch of the second straight line wirings.

14. The conductive member according to claim 12, wherein the predetermined number is equal to or less than 16.

15. The conductive member according to claim 12, wherein at least one of an average pitch of the first straight line wirings and an average pitch of the second straight line wirings is in a range of 30 μm to 300 μm.

16. The conductive member according to claim 12, wherein the wiring pattern is consists of the first straight line wirings and the second straight line wirings.

17. The conductive member according to claim 16, wherein the wiring pattern consisting of the first straight line wirings and the second straight line wirings is bilaterally asymmetric.

18. The conductive member according to claim 16, wherein an angle formed by the first straight line wirings and the second straight line wirings is in a range of 40 degrees to 140 degrees.

19. A conductive member comprising a wiring portion which is composed of a plurality of thin metal wires,
wherein the wiring portion has a wiring pattern, the wiring pattern comprises first straight line wirings being composed of a plurality of first thin metal wires arranged in parallel and extending in a first direction and second straight line wirings being composed of a plurality of second thin metal wires arranged in parallel and extending in a second direction, the first direction is different from the second direction, and the first straight line wirings cross over the second straight line wirings,
wherein the wiring pattern is a separate-direction non-equal pitch wiring pattern in which an average pitch of the first straight line wirings is different from an average pitch of the second straight line wirings, and an angle between each of the first straight line wirings and a horizontal line is different from an angle between each of the second straight line wirings and the horizontal line,
wherein the horizontal line extends along a horizontal direction,
wherein the conductive member is to be provided on a display unit of a display device,
wherein the wiring pattern is overlapped on a pixel array pattern of the display unit, and the pixel array pattern is arranged along the horizontal direction, and wherein the conductive member further has at least one of the following configurations (1) to (4):

(1) an intensity of a frequency component of the moiré that contributes most to the moiré in the separate-direction non-equal pitch wiring pattern is less than an intensity of a frequency component of the moiré that contributes most to the moiré in a first omnidirectional-equal pitch wiring pattern in which a direction of each straight line wiring and a wiring density per unit area are the same as those of the separate-direction non-equal pitch wiring pattern, or a second omnidirectional-equal pitch wiring pattern in which a direction of each straight line wiring is different from that of the separate-direction non-equal pitch wiring pattern but a number of the straight line wirings and a wiring density per unit area are the same as those of the separate-direction non-equal pitch wiring pattern;

(2) a frequency of a frequency component of the moiré that contributes most to the moiré in the separate-direction non-equal pitch wiring pattern is greater than a frequency of a frequency component of the moiré that contributes most to the moiré in a first omnidirectional-equal pitch wiring pattern in which a direction of each straight line wiring and a wiring density per unit area are the same as those of the separate-direction non-equal pitch wiring pattern, or a second omnidirectional-equal pitch wiring pattern in which a direction of each straight line wiring is different from that of the separate-direction non-equal pitch wiring pattern but a number of the straight line wirings and a wiring density per unit area are the same as those of the separate-direction non-equal pitch wiring pattern;

(3) a moiré evaluation value in the separate-direction non-equal pitch wiring pattern is less than a moiré evaluation value in a first omnidirectional-equal pitch wiring pattern in which a direction of each straight line wiring and a wiring density per unit area are the same as those of the separate-direction non-equal pitch wiring pattern, or a second omnidirectional-equal pitch wiring pattern in which a direction of each straight line wiring is different from that of the separate-direction non-equal pitch wiring pattern but a number of the straight line wirings and a wiring density per unit area are the same as those of the separate-direction non-equal pitch wiring pattern, and wherein the moiré evaluation value is a sum of intensities of frequency components of frequencies equal to or less than the frequency of a frequency component of moiré that contributes most to the moiré in the omnidirectional-equal pitch wiring pattern, among frequency components of moiré obtained by applying human's visual response characteristics to frequency components of the moiré calculated from frequency components of 2-dimensional Fourier frequency distributions of transmittances of the wiring patterns and frequency components of a 2-dimensional Fourier frequency distribution of a luminance or a transmittance of the pixel array pattern; and (4) at a frequency of the frequency component of moiré that contributes most to the moiré in a first omnidirectional-equal pitch wiring pattern in which a direction of each straight line wiring and a wiring density per unit area are the same as those of the separate-direction non-equal pitch wiring pattern, or a second omnidirectional-equal pitch wiring pattern in which a direction of each straight line wiring is different from that of the separate-direction non-equal pitch wiring pattern but a number of the straight line wirings and a wiring density per unit area are the same as those of the separate-direction non-equal pitch wiring pattern, an intensity of the frequency component of the moiré in the separate-direction non-equal pitch wiring pattern is less than an intensity of the frequency component of the moiré in the omnidirectional-equal pitch wiring pattern.

20. A method of producing a wiring pattern of a conductive member which is provided on a display unit of a display device and has a wiring portion that is composed of a plurality of thin metal wires, where the wiring portion has a wiring pattern, the wiring pattern comprises first straight line wirings being composed of a plurality of first thin metal wires arranged in parallel and extending in a first direction and second straight line wirings being composed of a plurality of second thin metal wires arranged in parallel and extending in a second direction, the first direction is different from the second direction, and the first straight line wirings cross over the second straight line wirings, in which the wiring pattern is overlapped on the pixel array pattern of the display unit, and is a separate-direction non-equal pitch wiring pattern in which an average pitch of the first straight line wirings is different from an average pitch of the second straight line wirings, and an angle between each of the first straight line wirings and a horizontal line is different from an angle between each of the second straight line wirings and the horizontal line, the horizontal line extends along a horizontal direction, the pixel array pattern is arranged along the horizontal direction, the method comprising:

acquiring a transmittance of the wiring pattern and a luminance or a transmittance of the pixel array pattern;

deriving a 2-dimensional Fourier frequency distribution of the transmittance of the wiring pattern and a 2-dimensional Fourier frequency distribution of the luminance or the transmittance of the pixel array pattern are derived;

calculating respective frequency components of moiré from frequency components of the 2-dimensional Fourier frequency distribution of the transmittances of the wiring patterns and frequency components of the 2-dimensional Fourier frequency distribution of the luminance or the transmittance of the pixel array pattern;

applying human's visual response characteristics to the calculated respective frequency components of the moiré so as to obtain a moiré evaluation value, which is a sum of intensities of the respective frequency components; and producing the separate-direction non-equal pitch wiring pattern in a state where the moiré evaluation value in the separate-direction non-equal pitch wiring pattern obtained in such a manner is less than a moiré evaluation value in a first omnidirectional-equal pitch wiring pattern in which a direction of each straight line wiring and a wiring density per unit area are the same as those of the separate-direction non-equal pitch wiring pattern, or a second omnidirectional-equal pitch wiring pattern in which a direction of each straight line wiring is different from that of the separate-direction non-equal pitch wiring pattern but a number of the straight line wirings and a wiring density per unit area are the same as those of the separate-direction non-equal pitch wiring pattern.

* * * * *